(12) United States Patent
Dorf et al.

(10) Patent No.: US 12,237,148 B2
(45) Date of Patent: *Feb. 25, 2025

(54) PLASMA PROCESSING ASSEMBLY USING PULSED-VOLTAGE AND RADIO-FREQUENCY POWER

(71) Applicant: Applied Materials, Inc., Santa Clara, CA (US)

(72) Inventors: Leonid Dorf, San Jose, CA (US); Rajinder Dhindsa, Pleasanton, CA (US); James Rogers, Los Gatos, CA (US); Daniel Sang Byun, Campbell, CA (US); Evgeny Kamenetskiy, Santa Clara, CA (US); Yue Guo, Redwood City, CA (US); Kartik Ramaswamy, San Jose, CA (US); Valentin N. Todorow, Palo Alto, CA (US); Olivier Luere, Sunnyvale, CA (US); Linying Cui, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/375,886

(22) Filed: Oct. 2, 2023

(65) Prior Publication Data
US 2024/0030002 A1 Jan. 25, 2024

Related U.S. Application Data

(63) Continuation of application No. 17/959,074, filed on Oct. 3, 2022, now Pat. No. 11,776,789, which is a (Continued)

(51) Int. Cl.
*H01J 37/32* (2006.01)
*H01L 21/3065* (2006.01)
(Continued)

(52) U.S. Cl.
CPC .. *H01J 37/32128* (2013.01); *H01J 37/32146* (2013.01); *H01J 37/32174* (2013.01);
(Continued)

(58) Field of Classification Search
CPC ........... H01J 37/32128; H01J 37/32146; H01J 37/32183; H01J 37/32577; H01J 37/32568
See application file for complete search history.

(56) References Cited

U.S. PATENT DOCUMENTS 4,070,589 A 1/1978 Martinkovic
4,340,462 A 7/1982 Koch
(Continued)

FOREIGN PATENT DOCUMENTS

CN 101990353 A 3/2011
CN 102084024 A 6/2011
(Continued)

OTHER PUBLICATIONS

Japanese Office Action issued to Patent Application No. 2023-503421 on Mar. 12, 2024.
(Continued)

*Primary Examiner* — Tung X Le
(74) *Attorney, Agent, or Firm* — Patterson + Sheridan, LLP; B. Todd Patterson

(57) ABSTRACT

Embodiments of the disclosure provided herein include an apparatus and method for the plasma processing of a substrate in a processing chamber. More specifically, embodiments of this disclosure describe a biasing scheme that is configured to provide a pulsed-voltage (PV) waveform delivered from one or more pulsed-voltage (PV) generators to the one or more electrodes within the processing chamber. The plasma process(es) disclosed herein can be used to control the shape of an ion energy distribution function
(Continued)

(IEDF) and the interaction of the plasma with a surface of a substrate during plasma processing.

21 Claims, 21 Drawing Sheets

Related U.S. Application Data continuation of application No. 17/315,256, filed on May 7, 2021, now Pat. No. 11,462,388.

(60) Provisional application No. 63/150,529, filed on Feb. 17, 2021, provisional application No. 63/059,533, filed on Jul. 31, 2020.

(51) Int. Cl.
*H01L 21/311* (2006.01)
*H01L 21/683* (2006.01)

(52) U.S. Cl.
CPC .. *H01J 37/32183* (2013.01); *H01J 37/32568* (2013.01); *H01J 37/32577* (2013.01); *H01J 37/32715* (2013.01); *H01L 21/3065* (2013.01); *H01L 21/31116* (2013.01); *H01L 21/6831* (2013.01); *H01J 2237/2007* (2013.01); *H01J 2237/3321* (2013.01); *H01J 2237/3341* (2013.01)

(56) References Cited

U.S. PATENT DOCUMENTS

| | | | |
|---|---|---|---|
| 4,464,223 A | 8/1984 | Gorin |
| 4,504,895 A | 3/1985 | Steigerwald |
| 4,585,516 A | 4/1986 | Corn et al. |
| 4,683,529 A | 7/1987 | Bucher, II |
| 4,931,135 A | 6/1990 | Horiuchi et al. |
| 4,992,919 A | 2/1991 | Lee et al. |
| 5,099,697 A | 3/1992 | Agar |
| 5,140,510 A | 8/1992 | Myers |
| 5,242,561 A | 9/1993 | Sato |
| 5,449,410 A | 9/1995 | Chang et al. |
| 5,451,846 A | 9/1995 | Peterson et al. |
| 5,464,499 A | 11/1995 | Moslehi et al. |
| 5,554,959 A | 9/1996 | Tang |
| 5,565,036 A | 10/1996 | Westendorp et al. |
| 5,595,627 A | 1/1997 | Inazawa et al. |
| 5,597,438 A | 1/1997 | Grewal et al. |
| 5,610,452 A | 3/1997 | Shimer et al. |
| 5,698,062 A | 12/1997 | Sakamoto et al. |
| 5,716,534 A | 2/1998 | Tsuchiya et al. |
| 5,770,023 A | 6/1998 | Sellers |
| 5,796,598 A | 8/1998 | Nowak et al. |
| 5,810,982 A | 9/1998 | Sellers |
| 5,830,330 A | 11/1998 | Lantsman |
| 5,882,424 A | 3/1999 | Taylor et al. |
| 5,928,963 A | 7/1999 | Koshiishi |
| 5,933,314 A | 8/1999 | Lambson et al. |
| 5,935,373 A | 8/1999 | Koshimizu |
| 5,948,704 A | 9/1999 | Benjamin et al. |
| 5,997,687 A | 12/1999 | Koshimizu |
| 6,043,607 A | 3/2000 | Roderick |
| 6,051,114 A | 4/2000 | Yao et al. |
| 6,055,150 A | 4/2000 | Clinton et al. |
| 6,074,518 A | 6/2000 | Imafuku et al. |
| 6,089,181 A | 7/2000 | Suemasa et al. |
| 6,099,697 A | 8/2000 | Hausmann |
| 6,110,287 A | 8/2000 | Arai et al. |
| 6,117,279 A | 9/2000 | Smolanoff et al. |
| 6,125,025 A | 9/2000 | Howald et al. |
| 6,133,557 A | 10/2000 | Kawanabe et al. |
| 6,136,387 A | 10/2000 | Koizumi |
| 6,187,685 B1 | 2/2001 | Hopkins et al. |
| 6,197,151 B1 | 3/2001 | Kaji et al. |
| 6,198,616 B1 | 3/2001 | Dahimene et al. |
| 6,201,208 B1 | 3/2001 | Wendt et al. |
| 6,214,162 B1 | 4/2001 | Koshimizu |
| 6,232,236 B1 | 5/2001 | Shan et al. |
| 6,252,354 B1 | 6/2001 | Collins et al. |
| 6,253,704 B1 | 7/2001 | Savas |
| 6,277,506 B1 | 8/2001 | Okamoto |
| 6,309,978 B1 | 10/2001 | Donohoe et al. |
| 6,313,583 B1 | 11/2001 | Arita et al. |
| 6,355,992 B1 | 3/2002 | Via |
| 6,358,573 B1 | 3/2002 | Raoux et al. |
| 6,367,413 B1 | 4/2002 | Sill et al. |
| 6,392,187 B1 | 5/2002 | Johnson |
| 6,395,641 B2 | 5/2002 | Savas |
| 6,413,358 B2 | 7/2002 | Donohoe |
| 6,423,192 B1 | 7/2002 | Wada et al. |
| 6,433,297 B1 | 8/2002 | Kojima et al. |
| 6,435,131 B1 | 8/2002 | Koizumi |
| 6,451,389 B1 | 9/2002 | Amann et al. |
| 6,456,010 B2 | 9/2002 | Yamakoshi et al. |
| 6,483,731 B1 | 11/2002 | Isurin et al. |
| 6,535,785 B2 | 3/2003 | Johnson et al. |
| 6,621,674 B1 | 9/2003 | Zahringer et al. |
| 6,664,739 B1 | 12/2003 | Kishinevsky et al. |
| 6,733,624 B2 | 5/2004 | Koshiishi et al. |
| 6,740,842 B2 | 5/2004 | Johnson et al. |
| 6,741,446 B2 | 5/2004 | Ennis |
| 6,777,037 B2 | 8/2004 | Sumiya et al. |
| 6,808,607 B2 | 10/2004 | Christie |
| 6,818,103 B1 | 11/2004 | Scholl et al. |
| 6,818,257 B2 | 11/2004 | Amann et al. |
| 6,830,595 B2 | 12/2004 | Reynolds, III |
| 6,830,650 B2 | 12/2004 | Roche et al. |
| 6,849,154 B2 | 2/2005 | Nagahata et al. |
| 6,861,373 B2 | 3/2005 | Aoki et al. |
| 6,863,020 B2 | 3/2005 | Mitrovic et al. |
| 6,896,775 B2 | 5/2005 | Chistyakov |
| 6,902,646 B2 | 6/2005 | Mahoney et al. |
| 6,917,204 B2 | 7/2005 | Mitrovic et al. |
| 6,947,300 B2 | 9/2005 | Pai et al. |
| 6,962,664 B2 | 11/2005 | Mitrovic |
| 6,970,042 B2 | 11/2005 | Glueck |
| 6,972,524 B1 | 12/2005 | Marakhtanov et al. |
| 7,016,620 B2 | 3/2006 | Maess et al. |
| 7,046,088 B2 | 5/2006 | Ziegler |
| 7,059,267 B2 | 6/2006 | Hedberg et al. |
| 7,104,217 B2 | 9/2006 | Himori et al. |
| 7,115,185 B1 | 10/2006 | Gonzalez et al. |
| 7,126,808 B2 | 10/2006 | Koo et al. |
| 7,147,759 B2 | 12/2006 | Chistyakov |
| 7,151,242 B2 | 12/2006 | Schuler |
| 7,166,233 B2 | 1/2007 | Johnson et al. |
| 7,183,177 B2 | 2/2007 | Al-Bayati et al. |
| 7,206,189 B2 | 4/2007 | Reynolds, III |
| 7,218,503 B2 | 5/2007 | Howald |
| 7,218,872 B2 | 5/2007 | Shimomura |
| 7,226,868 B2 | 6/2007 | Mosden et al. |
| 7,265,963 B2 | 9/2007 | Hirose |
| 7,274,266 B2 | 9/2007 | Kirchmeier |
| 7,305,311 B2 | 12/2007 | van Zyl |
| 7,312,974 B2 | 12/2007 | Kuchimachi |
| 7,408,329 B2 | 8/2008 | Wiedemuth et al. |
| 7,415,940 B2 | 8/2008 | Koshimizu et al. |
| 7,440,301 B2 | 10/2008 | Kirchmeier et al. |
| 7,452,443 B2 | 11/2008 | Gluck et al. |
| 7,479,712 B2 | 1/2009 | Richert |
| 7,509,105 B2 | 3/2009 | Ziegler |
| 7,512,387 B2 | 3/2009 | Glueck |
| 7,535,688 B2 | 5/2009 | Yokouchi et al. |
| 7,586,099 B2 | 9/2009 | Eyhorn et al. |
| 7,586,210 B2 | 9/2009 | Wiedemuth et al. |
| 7,588,667 B2 | 9/2009 | Cerio, Jr. |
| 7,601,246 B2 | 10/2009 | Kim et al. |
| 7,609,740 B2 | 10/2009 | Glueck |
| 7,618,686 B2 | 11/2009 | Colpo et al. |
| 7,633,319 B2 | 12/2009 | Arai |
| 7,645,341 B2 | 1/2010 | Kennedy et al. |
| 7,651,586 B2 | 1/2010 | Moriya et al. |
| 7,652,901 B2 | 1/2010 | Kirchmeier et al. |

(56) References Cited

U.S. PATENT DOCUMENTS

| | | |
|---|---|---|
| 7,692,936 B2 | 4/2010 | Richter |
| 7,700,474 B2 | 4/2010 | Cerio, Jr. |
| 7,705,676 B2 | 4/2010 | Kirchmeier et al. |
| 7,706,907 B2 | 4/2010 | Hiroki |
| 7,718,538 B2 | 5/2010 | Kim et al. |
| 7,740,704 B2 | 6/2010 | Strang |
| 7,758,764 B2 | 7/2010 | Dhindsa et al. |
| 7,761,247 B2 | 7/2010 | van Zyl |
| 7,782,100 B2 | 8/2010 | Steuber et al. |
| 7,791,912 B2 | 9/2010 | Walde |
| 7,795,817 B2 | 9/2010 | Nitschke |
| 7,808,184 B2 | 10/2010 | Chistyakov |
| 7,821,767 B2 | 10/2010 | Fujii |
| 7,825,719 B2 | 11/2010 | Roberg et al. |
| 7,858,533 B2 | 12/2010 | Liu et al. |
| 7,888,240 B2 | 2/2011 | Hamamjy et al. |
| 7,898,238 B2 | 3/2011 | Wiedemuth et al. |
| 7,929,261 B2 | 4/2011 | Wiedemuth |
| RE42,362 E | 5/2011 | Schuler |
| 7,977,256 B2 | 7/2011 | Liu et al. |
| 7,988,816 B2 | 8/2011 | Koshiishi et al. |
| 7,995,313 B2 | 8/2011 | Nitschke |
| 8,044,595 B2 | 10/2011 | Nitschke |
| 8,052,798 B2 | 11/2011 | Moriya et al. |
| 8,055,203 B2 | 11/2011 | Choueiry et al. |
| 8,083,961 B2 | 12/2011 | Chen et al. |
| 8,110,992 B2 | 2/2012 | Nitschke |
| 8,128,831 B2 | 3/2012 | Sato et al. |
| 8,129,653 B2 | 3/2012 | Kirchmeier et al. |
| 8,133,347 B2 | 3/2012 | Gluck et al. |
| 8,133,359 B2 | 3/2012 | Nauman et al. |
| 8,140,292 B2 | 3/2012 | Wendt |
| 8,217,299 B2 | 7/2012 | Ilic et al. |
| 8,221,582 B2 | 7/2012 | Patrick et al. |
| 8,236,109 B2 | 8/2012 | Moriya et al. |
| 8,284,580 B2 | 10/2012 | Wilson |
| 8,313,612 B2 | 11/2012 | McMillin et al. |
| 8,313,664 B2 | 11/2012 | Chen et al. |
| 8,333,114 B2 | 12/2012 | Hayashi |
| 8,361,906 B2 | 1/2013 | Lee et al. |
| 8,382,999 B2 | 2/2013 | Agarwal et al. |
| 8,383,001 B2 | 2/2013 | Mochiki et al. |
| 8,384,403 B2 | 2/2013 | Zollner et al. |
| 8,391,025 B2 | 3/2013 | Walde et al. |
| 8,399,366 B1 | 3/2013 | Takaba |
| 8,419,959 B2 | 4/2013 | Bettencourt et al. |
| 8,422,193 B2 | 4/2013 | Tao et al. |
| 8,441,772 B2 | 5/2013 | Yoshikawa et al. |
| 8,456,220 B2 | 6/2013 | Thome et al. |
| 8,460,567 B2 | 6/2013 | Chen |
| 8,466,622 B2 | 6/2013 | Knaus |
| 8,542,076 B2 | 9/2013 | Maier |
| 8,551,289 B2 | 10/2013 | Nishimura et al. |
| 8,568,606 B2 | 10/2013 | Ohse et al. |
| 8,603,293 B2 | 12/2013 | Koshiishi et al. |
| 8,632,537 B2 | 1/2014 | McNall, III et al. |
| 8,641,916 B2 | 2/2014 | Yatsuda et al. |
| 8,685,267 B2 | 4/2014 | Yatsuda et al. |
| 8,704,607 B2 | 4/2014 | Yuzurihara et al. |
| 8,716,114 B2 | 5/2014 | Ohmi et al. |
| 8,716,984 B2 | 5/2014 | Mueller et al. |
| 8,735,291 B2 | 5/2014 | Ranjan et al. |
| 8,796,933 B2 | 8/2014 | Hermanns |
| 8,809,199 B2 | 8/2014 | Nishizuka |
| 8,821,684 B2 | 9/2014 | Ui et al. |
| 8,828,883 B2 | 9/2014 | Rueger |
| 8,845,810 B2 | 9/2014 | Hwang |
| 8,852,347 B2 | 10/2014 | Lee et al. |
| 8,884,523 B2 | 11/2014 | Winterhalter et al. |
| 8,884,525 B2 | 11/2014 | Hoffman et al. |
| 8,889,534 B1 | 11/2014 | Ventzek et al. |
| 8,895,942 B2 | 11/2014 | Liu et al. |
| 8,907,259 B2 | 12/2014 | Kasai et al. |
| 8,916,056 B2 | 12/2014 | Koo et al. |
| 8,926,850 B2 | 1/2015 | Singh et al. |
| 8,963,377 B2 | 2/2015 | Ziemba et al. |
| 8,979,842 B2 | 3/2015 | McNall, III et al. |
| 8,993,943 B2 | 3/2015 | Pohl et al. |
| 9,011,636 B2 | 4/2015 | Ashida |
| 9,039,871 B2 | 5/2015 | Nauman et al. |
| 9,042,121 B2 | 5/2015 | Walde et al. |
| 9,053,908 B2 | 6/2015 | Sriraman et al. |
| 9,059,178 B2 | 6/2015 | Matsumoto et al. |
| 9,087,798 B2 | 7/2015 | Ohtake et al. |
| 9,101,038 B2 | 8/2015 | Singh et al. |
| 9,105,447 B2 | 8/2015 | Brouk et al. |
| 9,105,452 B2 | 8/2015 | Jeon et al. |
| 9,123,762 B2 | 9/2015 | Lin et al. |
| 9,129,776 B2 | 9/2015 | Finley et al. |
| 9,139,910 B2 | 9/2015 | Lee et al. |
| 9,147,555 B2 | 9/2015 | Richter |
| 9,150,960 B2 | 10/2015 | Nauman et al. |
| 9,159,575 B2 | 10/2015 | Ranjan et al. |
| 9,208,992 B2 | 12/2015 | Brouk et al. |
| 9,209,032 B2 | 12/2015 | Zhao et al. |
| 9,209,034 B2 | 12/2015 | Kitamura et al. |
| 9,210,790 B2 | 12/2015 | Hoffman et al. |
| 9,224,579 B2 | 12/2015 | Finley et al. |
| 9,226,380 B2 | 12/2015 | Finley |
| 9,228,878 B2 | 1/2016 | Haw et al. |
| 9,254,168 B2 | 2/2016 | Palanker |
| 9,263,241 B2 | 2/2016 | Larson et al. |
| 9,287,086 B2 | 3/2016 | Brouk et al. |
| 9,287,092 B2 | 3/2016 | Brouk et al. |
| 9,287,098 B2 | 3/2016 | Finley |
| 9,306,533 B1 | 4/2016 | Mavretic |
| 9,309,594 B2 | 4/2016 | Hoffman et al. |
| 9,313,872 B2 | 4/2016 | Yamazawa et al. |
| 9,355,822 B2 | 5/2016 | Yamada et al. |
| 9,362,089 B2 | 6/2016 | Brouk et al. |
| 9,373,521 B2 | 6/2016 | Mochiki et al. |
| 9,384,992 B2 | 7/2016 | Narishige et al. |
| 9,396,960 B2 | 7/2016 | Ogawa et al. |
| 9,404,176 B2 | 8/2016 | Parkhe et al. |
| 9,412,613 B2 | 8/2016 | Manna et al. |
| 9,435,029 B2 | 9/2016 | Brouk et al. |
| 9,483,066 B2 | 11/2016 | Finley |
| 9,490,107 B2 | 11/2016 | Kim et al. |
| 9,495,563 B2 | 11/2016 | Ziemba et al. |
| 9,496,150 B2 | 11/2016 | Mochiki et al. |
| 9,503,006 B2 | 11/2016 | Pohl et al. |
| 9,520,269 B2 | 12/2016 | Finley et al. |
| 9,530,667 B2 | 12/2016 | Rastogi et al. |
| 9,536,713 B2 | 1/2017 | Van Zyl et al. |
| 9,544,987 B2 | 1/2017 | Mueller et al. |
| 9,558,917 B2 | 1/2017 | Finley et al. |
| 9,564,287 B2 | 2/2017 | Ohse et al. |
| 9,570,313 B2 | 2/2017 | Ranjan et al. |
| 9,576,810 B2 | 2/2017 | Deshmukh et al. |
| 9,576,816 B2 | 2/2017 | Rastogi et al. |
| 9,577,516 B1 | 2/2017 | Van Zyl |
| 9,583,357 B1 | 2/2017 | Long et al. |
| 9,593,421 B2 | 3/2017 | Baek et al. |
| 9,601,283 B2 | 3/2017 | Ziemba et al. |
| 9,601,319 B1 | 3/2017 | Bravo et al. |
| 9,607,843 B2 | 3/2017 | Rastogi et al. |
| 9,620,340 B2 | 4/2017 | Finley |
| 9,620,376 B2 | 4/2017 | Kamp et al. |
| 9,620,987 B2 | 4/2017 | Alexander et al. |
| 9,637,814 B2 | 5/2017 | Bugyi et al. |
| 9,644,221 B2 | 5/2017 | Kanamori et al. |
| 9,651,957 B1 | 5/2017 | Finley |
| 9,655,221 B2 | 5/2017 | Ziemba et al. |
| 9,663,858 B2 | 5/2017 | Nagami et al. |
| 9,666,446 B2 | 5/2017 | Tominaga et al. |
| 9,666,447 B2 | 5/2017 | Rastogi et al. |
| 9,673,027 B2 | 6/2017 | Yamamoto et al. |
| 9,673,059 B2 | 6/2017 | Raley et al. |
| 9,685,297 B2 | 6/2017 | Carter et al. |
| 9,706,630 B2 | 7/2017 | Miller et al. |
| 9,711,331 B2 | 7/2017 | Mueller et al. |
| 9,711,335 B2 | 7/2017 | Christie |
| 9,728,429 B2 | 8/2017 | Ricci et al. |
| 9,734,992 B2 | 8/2017 | Yamada et al. |

(56) References Cited

U.S. PATENT DOCUMENTS

| | | |
|---|---|---|
| 9,741,544 B2 | 8/2017 | Van Zyl |
| 9,754,768 B2 | 9/2017 | Yamada et al. |
| 9,761,419 B2 | 9/2017 | Nagami |
| 9,761,459 B2 | 9/2017 | Long et al. |
| 9,767,988 B2 | 9/2017 | Brouk et al. |
| 9,786,503 B2 | 10/2017 | Raley et al. |
| 9,799,494 B2 | 10/2017 | Chen et al. |
| 9,805,916 B2 | 10/2017 | Konno et al. |
| 9,805,965 B2 | 10/2017 | Sadjadi et al. |
| 9,812,305 B2 | 11/2017 | Pelleymounter |
| 9,831,064 B2 | 11/2017 | Konno et al. |
| 9,837,285 B2 | 12/2017 | Tomura et al. |
| 9,840,770 B2 | 12/2017 | Klimczak et al. |
| 9,852,889 B1 | 12/2017 | Kellogg et al. |
| 9,852,890 B2 | 12/2017 | Mueller et al. |
| 9,865,471 B2 | 1/2018 | Shimoda et al. |
| 9,865,893 B2 | 1/2018 | Esswein et al. |
| 9,870,898 B2 | 1/2018 | Urakawa et al. |
| 9,872,373 B1 | 1/2018 | Shimizu et al. |
| 9,881,820 B2 | 1/2018 | Wong et al. |
| 9,922,802 B2 | 3/2018 | Hirano et al. |
| 9,922,806 B2 | 3/2018 | Tomura et al. |
| 9,929,004 B2 | 3/2018 | Ziemba et al. |
| 9,941,097 B2 | 4/2018 | Yamazawa et al. |
| 9,941,098 B2 | 4/2018 | Nagami |
| 9,960,763 B2 | 5/2018 | Miller et al. |
| 9,972,503 B2 | 5/2018 | Tomura et al. |
| 9,997,374 B2 | 6/2018 | Takeda et al. |
| 10,020,800 B2 | 7/2018 | Prager et al. |
| 10,026,593 B2 | 7/2018 | Alt et al. |
| 10,027,314 B2 | 7/2018 | Prager et al. |
| 10,041,174 B2 | 8/2018 | Matsumoto et al. |
| 10,042,407 B2 | 8/2018 | Grede et al. |
| 10,063,062 B2 | 8/2018 | Voronin et al. |
| 10,074,518 B2 | 9/2018 | Van Zyl |
| 10,085,796 B2 | 10/2018 | Podany |
| 10,090,191 B2 | 10/2018 | Tomura et al. |
| 10,102,321 B2 | 10/2018 | Povolny et al. |
| 10,109,461 B2 | 10/2018 | Yamada et al. |
| 10,115,567 B2 | 10/2018 | Hirano et al. |
| 10,115,568 B2 | 10/2018 | Kellogg et al. |
| 10,134,569 B1 | 11/2018 | Albarede et al. |
| 10,176,970 B2 | 1/2019 | Nitschke |
| 10,176,971 B2 | 1/2019 | Nagami |
| 10,181,392 B2 | 1/2019 | Leypold et al. |
| 10,199,246 B2 | 2/2019 | Koizumi et al. |
| 10,217,618 B2 | 2/2019 | Larson et al. |
| 10,217,933 B2 | 2/2019 | Nishimura et al. |
| 10,224,822 B2 | 3/2019 | Miller et al. |
| 10,229,819 B2 | 3/2019 | Hirano et al. |
| 10,249,498 B2 | 4/2019 | Ventzek et al. |
| 10,268,846 B2 | 4/2019 | Miller et al. |
| 10,269,540 B1 | 4/2019 | Carter et al. |
| 10,276,420 B2 | 4/2019 | Ito et al. |
| 10,282,567 B2 | 5/2019 | Miller et al. |
| 10,283,321 B2 | 5/2019 | Yang et al. |
| 10,290,506 B2 | 5/2019 | Ranjan et al. |
| 10,297,431 B2 | 5/2019 | Zelechowski et al. |
| 10,304,661 B2 | 5/2019 | Ziemba et al. |
| 10,304,668 B2 | 5/2019 | Coppa et al. |
| 10,312,048 B2 | 6/2019 | Dorf et al. |
| 10,312,056 B2 | 6/2019 | Collins et al. |
| 10,320,373 B2 | 6/2019 | Prager et al. |
| 10,332,730 B2 | 6/2019 | Christie |
| 10,340,123 B2 | 7/2019 | Ohtake |
| 10,348,186 B2 | 7/2019 | Schuler et al. |
| 10,354,839 B2 | 7/2019 | Alt et al. |
| 10,373,755 B2 | 8/2019 | Prager et al. |
| 10,373,804 B2 | 8/2019 | Koh et al. |
| 10,373,811 B2 | 8/2019 | Christie et al. |
| 10,381,237 B2 | 8/2019 | Takeda et al. |
| 10,382,022 B2 | 8/2019 | Prager et al. |
| 10,387,166 B2 | 8/2019 | Preston et al. |
| 10,388,544 B2 | 8/2019 | Ui et al. |
| 10,389,345 B2 | 8/2019 | Ziemba et al. |
| 10,410,877 B2 | 9/2019 | Takashima et al. |
| 10,431,437 B2 | 10/2019 | Gapinski et al. |
| 10,438,797 B2 | 10/2019 | Cottle et al. |
| 10,446,453 B2 | 10/2019 | Coppa et al. |
| 10,447,174 B1 | 10/2019 | Porter, Jr. et al. |
| 10,448,494 B1 | 10/2019 | Dorf et al. |
| 10,448,495 B1 | 10/2019 | Dorf et al. |
| 10,453,656 B2 | 10/2019 | Carducci et al. |
| 10,460,910 B2 | 10/2019 | Ziemba et al. |
| 10,460,911 B2 | 10/2019 | Ziemba et al. |
| 10,460,916 B2 | 10/2019 | Boyd, Jr. et al. |
| 10,483,089 B2 | 11/2019 | Ziemba et al. |
| 10,483,100 B2 | 11/2019 | Ishizaka et al. |
| 10,510,575 B2 | 12/2019 | Kraus et al. |
| 10,522,343 B2 | 12/2019 | Tapily et al. |
| 10,535,502 B2 | 1/2020 | Carducci et al. |
| 10,546,728 B2 | 1/2020 | Carducci et al. |
| 10,553,407 B2 | 2/2020 | Nagami et al. |
| 10,555,412 B2 | 2/2020 | Dorf et al. |
| 10,580,620 B2 | 3/2020 | Carducci et al. |
| 10,593,519 B2 | 3/2020 | Yamada et al. |
| 10,607,813 B2 | 3/2020 | Fairbairn et al. |
| 10,607,814 B2 | 3/2020 | Ziemba et al. |
| 10,658,189 B2 | 5/2020 | Hatazaki et al. |
| 10,659,019 B2 | 5/2020 | Slobodov et al. |
| 10,665,434 B2 | 5/2020 | Matsumoto et al. |
| 10,666,198 B2 | 5/2020 | Prager et al. |
| 10,672,589 B2 | 6/2020 | Koshimizu et al. |
| 10,672,596 B2 | 6/2020 | Brcka |
| 10,672,616 B2 | 6/2020 | Kubota |
| 10,685,807 B2 | 6/2020 | Dorf et al. |
| 10,707,053 B2 | 7/2020 | Urakawa et al. |
| 10,707,054 B1 | 7/2020 | Kubota |
| 10,707,055 B2 | 7/2020 | Shaw et al. |
| 10,707,086 B2 | 7/2020 | Yang et al. |
| 10,707,090 B2 | 7/2020 | Takayama et al. |
| 10,707,864 B2 | 7/2020 | Miller et al. |
| 10,714,372 B2 | 7/2020 | Chua et al. |
| 10,720,305 B2 | 7/2020 | Van Zyl |
| 10,734,906 B2 | 8/2020 | Miller et al. |
| 10,748,746 B2 | 8/2020 | Kaneko et al. |
| 10,755,894 B2 | 8/2020 | Hirano et al. |
| 10,763,150 B2 | 9/2020 | Lindley et al. |
| 10,773,282 B2 | 9/2020 | Coppa et al. |
| 10,774,423 B2 | 9/2020 | Janakiraman et al. |
| 10,777,388 B2 | 9/2020 | Ziemba et al. |
| 10,790,816 B2 | 9/2020 | Ziemba et al. |
| 10,791,617 B2 | 9/2020 | Dorf et al. |
| 10,796,887 B2 | 10/2020 | Prager et al. |
| 10,804,886 B2 | 10/2020 | Miller et al. |
| 10,811,227 B2 | 10/2020 | Van Zyl et al. |
| 10,811,228 B2 | 10/2020 | Van Zyl et al. |
| 10,811,229 B2 | 10/2020 | Van Zyl et al. |
| 10,811,230 B2 | 10/2020 | Ziemba et al. |
| 10,811,296 B2 | 10/2020 | Cho et al. |
| 10,847,346 B2 | 11/2020 | Ziemba et al. |
| 10,892,140 B2 | 1/2021 | Ziemba et al. |
| 10,892,141 B2 | 1/2021 | Ziemba et al. |
| 10,896,807 B2 | 1/2021 | Fairbairn et al. |
| 10,896,809 B2 | 1/2021 | Ziemba et al. |
| 10,903,047 B2 | 1/2021 | Ziemba et al. |
| 10,904,996 B2 | 1/2021 | Koh et al. |
| 10,916,408 B2 | 2/2021 | Dorf et al. |
| 10,923,320 B2 | 2/2021 | Koh et al. |
| 10,923,321 B2 | 2/2021 | Dorf et al. |
| 10,923,367 B2 | 2/2021 | Lubomirsky et al. |
| 10,923,379 B2 | 2/2021 | Liu et al. |
| 10,971,342 B2 | 4/2021 | Engelstaedter et al. |
| 10,978,274 B2 | 4/2021 | Kubota |
| 10,978,955 B2 | 4/2021 | Ziemba et al. |
| 10,985,740 B2 | 4/2021 | Prager et al. |
| 10,991,553 B2 | 4/2021 | Ziemba et al. |
| 10,991,554 B2 | 4/2021 | Zhao et al. |
| 10,998,169 B2 | 5/2021 | Ventzek et al. |
| 11,004,660 B2 | 5/2021 | Prager et al. |
| 11,011,349 B2 | 5/2021 | Brouk et al. |
| 11,075,058 B2 | 7/2021 | Ziemba et al. |
| 11,095,280 B2 | 8/2021 | Ziemba et al. |
| 11,101,108 B2 | 8/2021 | Slobodov et al. |

(56) References Cited

U.S. PATENT DOCUMENTS

| | | |
|---|---|---|
| 11,108,384 B2 | 8/2021 | Prager et al. |
| 11,476,090 B1 | 10/2022 | Ramaswamy et al. |
| 2001/0003298 A1 | 6/2001 | Shamouilian et al. |
| 2001/0009139 A1 | 7/2001 | Shan et al. |
| 2001/0033755 A1 | 10/2001 | Ino et al. |
| 2002/0069971 A1 | 6/2002 | Kaji et al. |
| 2002/0078891 A1 | 6/2002 | Chu et al. |
| 2003/0026060 A1 | 2/2003 | Hiramatsu et al. |
| 2003/0029859 A1 | 2/2003 | Knoot et al. |
| 2003/0049558 A1 | 3/2003 | Aoki et al. |
| 2003/0052085 A1 | 3/2003 | Parsons |
| 2003/0079983 A1 | 5/2003 | Long et al. |
| 2003/0091355 A1 | 5/2003 | Jeschonek et al. |
| 2003/0137791 A1 | 7/2003 | Arnet et al. |
| 2003/0151372 A1 | 8/2003 | Tsuchiya et al. |
| 2003/0165044 A1 | 9/2003 | Yamamoto |
| 2003/0201069 A1 | 10/2003 | Johnson |
| 2004/0021094 A1 | 2/2004 | Johnson et al. |
| 2004/0040665 A1 | 3/2004 | Mizuno et al. |
| 2004/0040931 A1 | 3/2004 | Koshiishi et al. |
| 2004/0066601 A1 | 4/2004 | Larsen |
| 2004/0112536 A1 | 6/2004 | Quon |
| 2004/0223284 A1 | 11/2004 | Iwami et al. |
| 2005/0022933 A1 | 2/2005 | Howard |
| 2005/0024809 A1 | 2/2005 | Kuchimachi |
| 2005/0039852 A1 | 2/2005 | Roche et al. |
| 2005/0092596 A1 | 5/2005 | Kouznetsov |
| 2005/0098118 A1 | 5/2005 | Amann et al. |
| 2005/0151544 A1 | 7/2005 | Mahoney et al. |
| 2005/0152159 A1 | 7/2005 | Isurin et al. |
| 2005/0286916 A1 | 12/2005 | Nakazato et al. |
| 2006/0075969 A1 | 4/2006 | Fischer |
| 2006/0130767 A1 | 6/2006 | Herchen |
| 2006/0139843 A1 | 6/2006 | Kim |
| 2006/0158823 A1 | 7/2006 | Mizuno et al. |
| 2006/0171848 A1 | 8/2006 | Roche et al. |
| 2006/0219178 A1 | 10/2006 | Asakura |
| 2006/0278521 A1 | 12/2006 | Stowell |
| 2007/0113787 A1 | 5/2007 | Higashiura et al. |
| 2007/0114981 A1 | 5/2007 | Vasquez et al. |
| 2007/0196977 A1 | 8/2007 | Wang et al. |
| 2007/0284344 A1 | 12/2007 | Todorov et al. |
| 2007/0285869 A1 | 12/2007 | Howald |
| 2007/0297118 A1 | 12/2007 | Fujii |
| 2008/0012548 A1 | 1/2008 | Gerhardt et al. |
| 2008/0037196 A1 | 2/2008 | Yonekura et al. |
| 2008/0048498 A1 | 2/2008 | Wiedemuth et al. |
| 2008/0106842 A1 | 5/2008 | Ito et al. |
| 2008/0135401 A1 | 6/2008 | Kadlec et al. |
| 2008/0160212 A1 | 7/2008 | Koo et al. |
| 2008/0185537 A1 | 8/2008 | Walther et al. |
| 2008/0210545 A1 | 9/2008 | Kouznetsov |
| 2008/0236493 A1 | 10/2008 | Sakao |
| 2008/0252225 A1 | 10/2008 | Kurachi et al. |
| 2008/0272706 A1 | 11/2008 | Kwon et al. |
| 2008/0289576 A1 | 11/2008 | Lee et al. |
| 2009/0016549 A1 | 1/2009 | French et al. |
| 2009/0059462 A1 | 3/2009 | Mizuno et al. |
| 2009/0078678 A1 | 3/2009 | Kojima et al. |
| 2009/0133839 A1 | 5/2009 | Yamazawa et al. |
| 2009/0236214 A1 | 9/2009 | Janakiraman et al. |
| 2009/0295295 A1 | 12/2009 | Shannon et al. |
| 2010/0018648 A1 | 1/2010 | Collins et al. |
| 2010/0025230 A1 | 2/2010 | Ehiasarian et al. |
| 2010/0029038 A1 | 2/2010 | Murakawa |
| 2010/0072172 A1 | 3/2010 | Ui et al. |
| 2010/0101935 A1 | 4/2010 | Chistyakov et al. |
| 2010/0118464 A1 | 5/2010 | Matsuyama |
| 2010/0154994 A1 | 6/2010 | Fischer et al. |
| 2010/0193491 A1 | 8/2010 | Cho et al. |
| 2010/0271744 A1 | 10/2010 | Ni et al. |
| 2010/0276273 A1 | 11/2010 | Heckman et al. |
| 2010/0321047 A1 | 12/2010 | Zollner et al. |
| 2010/0326957 A1 | 12/2010 | Maeda et al. |
| 2011/0096461 A1 | 4/2011 | Yoshikawa et al. |
| 2011/0100807 A1 | 5/2011 | Matsubara et al. |
| 2011/0143537 A1 | 6/2011 | Lee et al. |
| 2011/0157760 A1 | 6/2011 | Willwerth et al. |
| 2011/0177669 A1 | 7/2011 | Lee et al. |
| 2011/0177694 A1 | 7/2011 | Chen et al. |
| 2011/0259851 A1 | 10/2011 | Brouk et al. |
| 2011/0281438 A1 | 11/2011 | Lee et al. |
| 2011/0298376 A1 | 12/2011 | Kanegae et al. |
| 2012/0000421 A1 | 1/2012 | Miller et al. |
| 2012/0052599 A1 | 3/2012 | Brouk et al. |
| 2012/0081350 A1 | 4/2012 | Sano et al. |
| 2012/0088371 A1 | 4/2012 | Ranjan et al. |
| 2012/0097908 A1 | 4/2012 | Willwerth et al. |
| 2012/0171390 A1 | 7/2012 | Nauman et al. |
| 2012/0319584 A1 | 12/2012 | Brouk et al. |
| 2013/0026381 A1 | 1/2013 | Huang et al. |
| 2013/0059448 A1 | 3/2013 | Marakhtanov et al. |
| 2013/0087447 A1 | 4/2013 | Bodke et al. |
| 2013/0175575 A1 | 7/2013 | Ziemba et al. |
| 2013/0213935 A1 | 8/2013 | Liao et al. |
| 2013/0214828 A1 | 8/2013 | Valcore, Jr. et al. |
| 2013/0340938 A1 | 12/2013 | Tappan et al. |
| 2013/0344702 A1 | 12/2013 | Nishizuka |
| 2014/0057447 A1 | 2/2014 | Yang et al. |
| 2014/0061156 A1 | 3/2014 | Brouk et al. |
| 2014/0062495 A1 | 3/2014 | Carter et al. |
| 2014/0077611 A1 | 3/2014 | Young et al. |
| 2014/0109886 A1 | 4/2014 | Singleton et al. |
| 2014/0117861 A1 | 5/2014 | Finley et al. |
| 2014/0125315 A1 | 5/2014 | Kirchmeier et al. |
| 2014/0154819 A1 | 6/2014 | Gaff et al. |
| 2014/0177123 A1 | 6/2014 | Thach et al. |
| 2014/0238844 A1 | 8/2014 | Chistyakov |
| 2014/0262755 A1 | 9/2014 | Deshmukh et al. |
| 2014/0263182 A1 | 9/2014 | Chen et al. |
| 2014/0273487 A1 | 9/2014 | Deshmukh et al. |
| 2014/0305905 A1 | 10/2014 | Yamada et al. |
| 2014/0356984 A1 | 12/2014 | Ventzek et al. |
| 2014/0361690 A1 | 12/2014 | Yamada et al. |
| 2015/0002018 A1 | 1/2015 | Lill et al. |
| 2015/0043123 A1 | 2/2015 | Cox |
| 2015/0076112 A1 | 3/2015 | Sriraman et al. |
| 2015/0084509 A1 | 3/2015 | Yuzurihara et al. |
| 2015/0111394 A1 | 4/2015 | Hsu et al. |
| 2015/0116889 A1 | 4/2015 | Yamasaki et al. |
| 2015/0130354 A1 | 5/2015 | Leray et al. |
| 2015/0130525 A1 | 5/2015 | Miller et al. |
| 2015/0170952 A1 | 6/2015 | Subramani et al. |
| 2015/0181683 A1 | 6/2015 | Singh et al. |
| 2015/0235809 A1 | 8/2015 | Ito et al. |
| 2015/0256086 A1 | 9/2015 | Miller et al. |
| 2015/0303914 A1 | 10/2015 | Ziemba et al. |
| 2015/0315698 A1 | 11/2015 | Chistyakov |
| 2015/0318846 A1 | 11/2015 | Prager et al. |
| 2015/0325413 A1 | 11/2015 | Kim et al. |
| 2015/0366004 A1 | 12/2015 | Nangoy et al. |
| 2016/0004475 A1 | 1/2016 | Beniyama et al. |
| 2016/0020072 A1 | 1/2016 | Brouk et al. |
| 2016/0027678 A1 | 1/2016 | Parkhe et al. |
| 2016/0056017 A1 | 2/2016 | Kim et al. |
| 2016/0064189 A1 | 3/2016 | Tandou et al. |
| 2016/0196958 A1 | 7/2016 | Leray et al. |
| 2016/0241234 A1* | 8/2016 | Mavretic .................. H03H 7/38 |
| 2016/0284514 A1 | 9/2016 | Hirano et al. |
| 2016/0314946 A1 | 10/2016 | Pelleymounter |
| 2016/0322242 A1 | 11/2016 | Nguyen et al. |
| 2016/0327029 A1 | 11/2016 | Ziemba et al. |
| 2016/0351375 A1 | 12/2016 | Valcore, Jr. et al. |
| 2016/0358755 A1 | 12/2016 | Long et al. |
| 2017/0011887 A1 | 1/2017 | Deshmukh et al. |
| 2017/0018411 A1 | 1/2017 | Sriraman et al. |
| 2017/0022604 A1 | 1/2017 | Christie et al. |
| 2017/0029937 A1 | 2/2017 | Chistyakov et al. |
| 2017/0069462 A1 | 3/2017 | Kanarik et al. |
| 2017/0076962 A1 | 3/2017 | Engelhardt |
| 2017/0098527 A1 | 4/2017 | Kawasaki et al. |
| 2017/0098549 A1 | 4/2017 | Agarwal |
| 2017/0110335 A1 | 4/2017 | Yang et al. |
| 2017/0110358 A1 | 4/2017 | Sadjadi et al. |

(56) References Cited

U.S. PATENT DOCUMENTS

| | | |
|---|---|---|
| 2017/0113355 A1 | 4/2017 | Genetti et al. |
| 2017/0115657 A1 | 4/2017 | Trussell et al. |
| 2017/0117172 A1 | 4/2017 | Genetti et al. |
| 2017/0154726 A1 | 6/2017 | Prager et al. |
| 2017/0162417 A1 | 6/2017 | Ye et al. |
| 2017/0163254 A1 | 6/2017 | Ziemba et al. |
| 2017/0169996 A1 | 6/2017 | Ui et al. |
| 2017/0170449 A1 | 6/2017 | Alexander et al. |
| 2017/0178917 A1 | 6/2017 | Kamp et al. |
| 2017/0221682 A1 | 8/2017 | Nishimura et al. |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0243731 A1 | 8/2017 | Ziemba et al. |
| 2017/0250056 A1 | 8/2017 | Boswell et al. |
| 2017/0263478 A1 | 9/2017 | McChesney et al. |
| 2017/0278665 A1 | 9/2017 | Carter et al. |
| 2017/0287791 A1 | 10/2017 | Coppa et al. |
| 2017/0311431 A1 | 10/2017 | Park |
| 2017/0316935 A1 | 11/2017 | Tan et al. |
| 2017/0330734 A1 | 11/2017 | Lee et al. |
| 2017/0330786 A1 | 11/2017 | Genetti et al. |
| 2017/0334074 A1 | 11/2017 | Genetti et al. |
| 2017/0345621 A1* | 11/2017 | Cheng ............... H01J 37/32183 |
| 2017/0358431 A1 | 12/2017 | Dorf et al. |
| 2017/0366173 A1 | 12/2017 | Miller et al. |
| 2017/0372912 A1 | 12/2017 | Long et al. |
| 2018/0019100 A1 | 1/2018 | Brouk et al. |
| 2018/0076032 A1 | 3/2018 | Wang et al. |
| 2018/0102769 A1 | 4/2018 | Prager et al. |
| 2018/0139834 A1 | 5/2018 | Nagashima et al. |
| 2018/0166249 A1 | 6/2018 | Dorf et al. |
| 2018/0189524 A1 | 7/2018 | Miller et al. |
| 2018/0190501 A1 | 7/2018 | Ueda |
| 2018/0204708 A1 | 7/2018 | Tan et al. |
| 2018/0205369 A1 | 7/2018 | Prager et al. |
| 2018/0218905 A1 | 8/2018 | Park et al. |
| 2018/0226225 A1 | 8/2018 | Koh et al. |
| 2018/0226896 A1 | 8/2018 | Miller et al. |
| 2018/0253570 A1 | 9/2018 | Miller et al. |
| 2018/0286636 A1 | 10/2018 | Ziemba et al. |
| 2018/0294566 A1 | 10/2018 | Wang et al. |
| 2018/0309423 A1 | 10/2018 | Okunishi et al. |
| 2018/0331655 A1 | 11/2018 | Prager et al. |
| 2018/0350649 A1 | 12/2018 | Gomm |
| 2018/0366305 A1 | 12/2018 | Nagami et al. |
| 2018/0374672 A1 | 12/2018 | Hayashi et al. |
| 2019/0027344 A1 | 1/2019 | Okunishi et al. |
| 2019/0080884 A1 | 3/2019 | Ziemba et al. |
| 2019/0090338 A1 | 3/2019 | Koh et al. |
| 2019/0096633 A1 | 3/2019 | Pankratz et al. |
| 2019/0157041 A1 | 5/2019 | Zyl et al. |
| 2019/0157042 A1 | 5/2019 | Van Zyl et al. |
| 2019/0157044 A1 | 5/2019 | Ziemba et al. |
| 2019/0172685 A1 | 6/2019 | Van Zyl et al. |
| 2019/0172688 A1 | 6/2019 | Ueda |
| 2019/0180982 A1 | 6/2019 | Brouk et al. |
| 2019/0198333 A1 | 6/2019 | Tokashiki |
| 2019/0259562 A1 | 8/2019 | Dorf et al. |
| 2019/0267218 A1 | 8/2019 | Wang et al. |
| 2019/0277804 A1 | 9/2019 | Prager et al. |
| 2019/0295769 A1 | 9/2019 | Prager et al. |
| 2019/0295819 A1 | 9/2019 | Okunishi et al. |
| 2019/0318918 A1 | 10/2019 | Saitoh et al. |
| 2019/0333741 A1 | 10/2019 | Nagami et al. |
| 2019/0341232 A1 | 11/2019 | Thokachichu et al. |
| 2019/0348258 A1 | 11/2019 | Koh et al. |
| 2019/0348263 A1 | 11/2019 | Okunishi |
| 2019/0363388 A1 | 11/2019 | Esswein et al. |
| 2019/0385822 A1 | 12/2019 | Marakhtanov et al. |
| 2019/0393791 A1 | 12/2019 | Ziemba et al. |
| 2020/0016109 A1 | 1/2020 | Feng et al. |
| 2020/0020510 A1 | 1/2020 | Shoeb et al. |
| 2020/0024330 A1 | 1/2020 | Chan-Hui et al. |
| 2020/0035457 A1 | 1/2020 | Ziemba et al. |
| 2020/0035458 A1 | 1/2020 | Ziemba et al. |
| 2020/0035459 A1 | 1/2020 | Ziemba et al. |
| 2020/0036367 A1 | 1/2020 | Slobodov et al. |
| 2020/0037468 A1 | 1/2020 | Ziemba et al. |
| 2020/0051785 A1 | 2/2020 | Miller et al. |
| 2020/0051786 A1 | 2/2020 | Ziemba et al. |
| 2020/0058475 A1 | 2/2020 | Engelstaedter et al. |
| 2020/0066497 A1 | 2/2020 | Engelstaedter et al. |
| 2020/0066498 A1 | 2/2020 | Engelstaedter et al. |
| 2020/0075293 A1 | 3/2020 | Ventzek et al. |
| 2020/0090905 A1 | 3/2020 | Brouk et al. |
| 2020/0106137 A1 | 4/2020 | Murphy et al. |
| 2020/0126760 A1 | 4/2020 | Ziemba et al. |
| 2020/0126837 A1 | 4/2020 | Kuno et al. |
| 2020/0144030 A1 | 5/2020 | Prager et al. |
| 2020/0161091 A1 | 5/2020 | Ziemba et al. |
| 2020/0161098 A1 | 5/2020 | Cui et al. |
| 2020/0161155 A1 | 5/2020 | Rogers et al. |
| 2020/0162061 A1 | 5/2020 | Prager et al. |
| 2020/0168436 A1 | 5/2020 | Ziemba et al. |
| 2020/0168437 A1 | 5/2020 | Ziemba et al. |
| 2020/0176221 A1 | 6/2020 | Prager et al. |
| 2020/0227230 A1 | 7/2020 | Ziemba et al. |
| 2020/0227289 A1 | 7/2020 | Song et al. |
| 2020/0234922 A1 | 7/2020 | Dorf et al. |
| 2020/0234923 A1 | 7/2020 | Dorf et al. |
| 2020/0243303 A1 | 7/2020 | Mishra et al. |
| 2020/0251371 A1 | 8/2020 | Kuno et al. |
| 2020/0266022 A1 | 8/2020 | Dorf et al. |
| 2020/0266035 A1 | 8/2020 | Nagaiwa |
| 2020/0294770 A1 | 9/2020 | Kubota |
| 2020/0328739 A1 | 10/2020 | Miller et al. |
| 2020/0352017 A1 | 11/2020 | Dorf et al. |
| 2020/0357607 A1 | 11/2020 | Ziemba et al. |
| 2020/0373114 A1 | 11/2020 | Prager et al. |
| 2020/0389126 A1 | 12/2020 | Prager et al. |
| 2020/0407840 A1 | 12/2020 | Hayashi et al. |
| 2020/0411286 A1 | 12/2020 | Koshimizu et al. |
| 2021/0005428 A1 | 1/2021 | Shaw et al. |
| 2021/0013006 A1 | 1/2021 | Nguyen et al. |
| 2021/0013011 A1 | 1/2021 | Prager et al. |
| 2021/0013874 A1 | 1/2021 | Miller et al. |
| 2021/0027990 A1 | 1/2021 | Ziemba et al. |
| 2021/0029815 A1 | 1/2021 | Bowman et al. |
| 2021/0043472 A1 | 2/2021 | Koshimizu et al. |
| 2021/0051792 A1 | 2/2021 | Dokan et al. |
| 2021/0066042 A1 | 3/2021 | Ziemba et al. |
| 2021/0082669 A1 | 3/2021 | Koshiishi et al. |
| 2021/0091759 A1 | 3/2021 | Prager et al. |
| 2021/0125812 A1 | 4/2021 | Ziemba et al. |
| 2021/0130955 A1 | 5/2021 | Nagaike et al. |
| 2021/0140044 A1 | 5/2021 | Nagaike et al. |
| 2021/0151295 A1* | 5/2021 | Ziemba ............... H01J 37/321 |
| 2021/0152163 A1 | 5/2021 | Miller et al. |
| 2021/0210313 A1 | 7/2021 | Ziemba et al. |
| 2021/0210315 A1 | 7/2021 | Ziemba et al. |
| 2021/0249227 A1 | 8/2021 | Bowman et al. |
| 2021/0272775 A1 | 9/2021 | Koshimizu |
| 2021/0288582 A1 | 9/2021 | Ziemba et al. |
| 2021/0398785 A1 | 12/2021 | Lin et al. |
| 2022/0392750 A1 | 12/2022 | Yang et al. |
| 2022/0399183 A1 | 12/2022 | Cui et al. |
| 2022/0399186 A1 | 12/2022 | Cui et al. |
| 2022/0399189 A1 | 12/2022 | Guo et al. |
| 2022/0406567 A1 | 12/2022 | Yang et al. |
| 2022/0415614 A1 | 12/2022 | Yang et al. |
| 2023/0071168 A1 | 3/2023 | Ramaswamy et al. |
| 2023/0087307 A1 | 3/2023 | Guo et al. |
| 2023/0170192 A1 | 6/2023 | Guo et al. |
| 2023/0170194 A1 | 6/2023 | Guo et al. |

FOREIGN PATENT DOCUMENTS

| | | |
|---|---|---|
| CN | 101707186 B | 2/2012 |
| CN | 105408993 A | 3/2016 |
| CN | 106206234 A | 12/2016 |
| CN | 104752134 B | 2/2017 |
| EP | 665306 A1 | 8/1995 |
| EP | 983394 A1 | 3/2000 |

(56) References Cited

FOREIGN PATENT DOCUMENTS

| | | |
|---|---|---|
| EP | 1119033 A1 | 7/2001 |
| EP | 1203441 A1 | 5/2002 |
| EP | 1214459 A1 | 6/2002 |
| EP | 1418670 A1 | 5/2004 |
| EP | 1691481 A1 | 8/2006 |
| EP | 1701376 A1 | 9/2006 |
| EP | 1708239 A1 | 10/2006 |
| EP | 1780777 A1 | 5/2007 |
| EP | 1852959 A1 | 11/2007 |
| EP | 2016610 A1 | 1/2009 |
| EP | 2096679 A1 | 9/2009 |
| EP | 2221614 A1 | 8/2010 |
| EP | 2541584 A1 | 1/2013 |
| EP | 2580368 A1 | 4/2013 |
| EP | 2612544 A1 | 7/2013 |
| EP | 2838112 A1 | 2/2015 |
| EP | 2991103 A1 | 3/2016 |
| EP | 3086359 A1 | 10/2016 |
| EP | 3396700 A1 | 10/2018 |
| EP | 3616234 A1 | 3/2020 |
| JP | H08236602 A | 9/1996 |
| JP | 2748213 B2 | 5/1998 |
| JP | H11025894 A | 1/1999 |
| JP | 2002-313899 A | 10/2002 |
| JP | 2002299322 A | 10/2002 |
| JP | 2008244063 A | 10/2008 |
| JP | 4418424 B2 | 2/2010 |
| JP | 2011035266 A | 2/2011 |
| JP | 5018244 B2 | 9/2012 |
| JP | 2014082449 A | 5/2014 |
| JP | 2014112644 A | 6/2014 |
| JP | 2016-225439 A | 12/2016 |
| JP | 6741461 B2 | 8/2020 |
| KR | 100757347 B1 | 9/2007 |
| KR | 10-2007-0098556 A | 10/2007 |
| KR | 10-2009-0010608 A | 1/2009 |
| KR | 20160042429 A | 4/2016 |
| KR | 20200036947 A | 4/2020 |
| TW | 498706 B | 8/2002 |
| TW | 201717247 A | 5/2017 |
| WO | 1998053116 A1 | 11/1998 |
| WO | 2000017920 A1 | 3/2000 |
| WO | 2000030147 A1 | 5/2000 |
| WO | 2000063459 A1 | 10/2000 |
| WO | 2001005020 A1 | 1/2001 |
| WO | 2001012873 A1 | 2/2001 |
| WO | 2001013402 A1 | 2/2001 |
| WO | 2002052628 A1 | 7/2002 |
| WO | 2002054835 A2 | 7/2002 |
| WO | 2002059954 A1 | 8/2002 |
| WO | 2003037497 A2 | 5/2003 |
| WO | 2003052882 A2 | 6/2003 |
| WO | 2003054911 A2 | 7/2003 |
| WO | 2003077414 A2 | 9/2003 |
| WO | 2004084394 A1 | 9/2004 |
| WO | 2005124844 A1 | 12/2005 |
| WO | 2007118042 A2 | 10/2007 |
| WO | 2008016747 A2 | 2/2008 |
| WO | 2008050619 A1 | 5/2008 |
| WO | 2008061775 A1 | 5/2008 |
| WO | 2008061784 A1 | 5/2008 |
| WO | 2008062663 A1 | 5/2008 |
| WO | 2009012804 A1 | 1/2009 |
| WO | 2009069670 A1 | 6/2009 |
| WO | 2009111473 A2 | 9/2009 |
| WO | 2011073093 A1 | 6/2011 |
| WO | 2011087984 A2 | 7/2011 |
| WO | 2011156055 A1 | 12/2011 |
| WO | 2012030500 A1 | 3/2012 |
| WO | 2012109159 A1 | 8/2012 |
| WO | 2012122064 A1 | 9/2012 |
| WO | 2013000918 A1 | 1/2013 |
| WO | 2013016619 A1 | 1/2013 |
| WO | 2013084459 A1 | 6/2013 |
| WO | 2013088677 A1 | 6/2013 |
| WO | 2013099133 A1 | 7/2013 |
| WO | 2013114882 A1 | 8/2013 |
| WO | 2013118660 A1 | 8/2013 |
| WO | 2013125523 A1 | 8/2013 |
| WO | 2013187218 A1 | 12/2013 |
| WO | 2014035889 A1 | 3/2014 |
| WO | 2014035894 A1 | 3/2014 |
| WO | 2014035897 A1 | 3/2014 |
| WO | 2014036000 A1 | 3/2014 |
| WO | 2014124857 A2 | 8/2014 |
| WO | 2014197145 A1 | 12/2014 |
| WO | 2015060185 A1 | 4/2015 |
| WO | 2014124857 A3 | 5/2015 |
| WO | 2015134398 A1 | 9/2015 |
| WO | 2015198854 A1 | 12/2015 |
| WO | 2016002547 A1 | 1/2016 |
| WO | 2016059207 A1 | 4/2016 |
| WO | 2016060058 A1 | 4/2016 |
| WO | 2016060063 A1 | 4/2016 |
| WO | 2015073921 A8 | 5/2016 |
| WO | 2016104098 A1 | 6/2016 |
| WO | 2016128384 A1 | 8/2016 |
| WO | 2016131061 A1 | 8/2016 |
| WO | 2016170989 A1 | 10/2016 |
| WO | 2017172536 A1 | 10/2017 |
| WO | 2017208807 A1 | 12/2017 |
| WO | 2018048925 A1 | 3/2018 |
| WO | 2018111751 A1 | 6/2018 |
| WO | 2018170010 A1 | 9/2018 |
| WO | 2018197702 A1 | 11/2018 |
| WO | 2019036587 A1 | 2/2019 |
| WO | 2019040949 A1 | 2/2019 |
| WO | 2019099102 A1 | 5/2019 |
| WO | 2019099870 A1 | 5/2019 |
| WO | 2019185423 A1 | 10/2019 |
| WO | 2019225184 A1 | 11/2019 |
| WO | 2019239872 A1 | 12/2019 |
| WO | 2019244697 A1 | 12/2019 |
| WO | 2019244698 A1 | 12/2019 |
| WO | 2019244734 A1 | 12/2019 |
| WO | 2019245729 A1 | 12/2019 |
| WO | 2020004048 A1 | 1/2020 |
| WO | 2020017328 A1 | 1/2020 |
| WO | 2020022318 A1 | 1/2020 |
| WO | 2020022319 A1 | 1/2020 |
| WO | 2020026802 A1 | 2/2020 |
| WO | 2020036806 A1 | 2/2020 |
| WO | 2020037331 A1 | 2/2020 |
| WO | 2020046561 A1 | 3/2020 |
| WO | 2020051064 A1 | 3/2020 |
| WO | 2020112921 A1 | 6/2020 |
| WO | 2020121819 A1 | 6/2020 |
| WO | 2020145051 A1 | 7/2020 |
| WO | 2021003319 A1 | 1/2021 |
| WO | 2021062223 A1 | 4/2021 |
| WO | 2021097459 A1 | 5/2021 |
| WO | 2021134000 A1 | 7/2021 |

OTHER PUBLICATIONS

Wang, S.B., et al.—"Control of ion energy distribution at substrates during plasma processing," Journal of Applied Physics, vol. 88, No. 2, Jul. 15, 2000, pp. 643-646.
Eagle Harbor Technologies presentation by Dr. Kenneth E. Miller—"The EHT Integrated Power Module (IPM): An IGBT-Based, High Current, Ultra-Fast, Modular, Programmable Power Supply Unit," Jun. 2013, 21 pages.
Eagle Harbor Technologies webpage—"In Situ Testing of EHT Integrators on a Tokamak," 2015, 1 page.
Eagle Harbor Technologies webpage—High Gain and Frequency Ultra-Stable Integrators for Long Pulse and/or High Current Applications, 2018, 1 page.
Eagle Harbor Technologies webpage—"EHT Integrator Demonstration at DIII-D," 2015, 1 page.
Eagle Harbor Technologies webpage—"High Gain and Frequency Ultra-Stable Integrators for ICC and Long Pulse ITER Applications," 2012, 1 page.

(56) References Cited

OTHER PUBLICATIONS

Eagle Harbor Technologies webpage—"Long-Pulse Integrator Testing with DIII-D Magnetic Diagnostics," 2016, 1 page.
Sunstone Circuits—"Eagle Harbor Tech Case Study," date unknown, 4 pages.
Prager, J.R., et al.—"A High Voltage Nanosecond Pulser with Variable Pulse Width and Pulse Repetition Frequency Control for Nonequilibrium Plasma Applications," IEEE 41st International Conference on Plasma Sciences (ICOPS) held with 2014 IEEE International Conference on High-Power Particle Beams (BEAMS), pp. 1-6, 2014.
Kamada, Keiichi, et al., Editors—"New Developments of Plasma Science with Pulsed Power Technology," Research Report, NIFS-PROC-82, presented at National Institute for Fusion Science, Toki, Gifu, Japan, Mar. 5-6, 2009, 109 pages.
Semiconductor Components Industries, LLC (SCILLC)—"Switch-Mode Power Supply" Reference Manual, SMPSRM/D, Rev. 4, Apr. 2014, ON Semiconductor, 73 pages.
PCT International Search Report and Written Opinion dated Nov. 9, 2018, for International Application No. PCT/US2018/043032.
Taiwan Office Action for Application No. 107125613 dated Dec. 24, 2020, 16 pages.
PCT International Search Report and Written Opinion dated Nov. 7, 2018, for International Application No. PCT/US2018/042965.
International Search Report and Written Opinion for PCT/US2019/052067 dated Jan. 21, 2020.
Electrical 4 U webpage—"Clamping Circuit," Aug. 29, 2018, 9 pages.
Kyung Chae Yang et al., A study on the etching characteristics of magnetic tunneling junction materials using DC pulse-biased inductively coupled plasmas, Japanese Journal of Applied Physics, vol. 54, 01AE01, Oct. 29, 2014, 6 pages.
PCT Notification of Transmittal of the International Search Report and the Written Opinion of the International Searching Authority for International Application No. PCT/US2019/048392; dated Dec. 16, 2019; 13 pages.
PCT International Search Report and Written Opinion dated Nov. 7, 2018, for International Application No. PCT/US2018/042961.
PCT International Search Report and Written Opinion dated Nov. 7, 2018, for International Application No. PCT/US2018/042956.
U.S. Appl. No. 62/433,204; entitled Creating Arbitrarily-Shaped Ion Energy Distribution Function (IEDF) Using Shaped-Pulse (EV) Bias; by Leonid Dorf, et al.; filed Dec. 16, 2016; 22 total pages.
U.S. Appl. No. 15/424,405; entitled System for Tunable Workpiece Biasing in a Plasma Reactor; by Travis Koh, et al.; filed Feb. 3, 2017; 29 total pages.
U.S. Appl. No. 15/618,082; entitled Systems and Methods for Controlling a Voltage Waveform at a Substrate During Plasma Processing; by Leonid Dorf, et al.; filed Jun. 8, 2017; 35 total pages.
PCT Notification of Transmittal of the International Search Report and the Written Opinion of the International Searching Authority for International Application No. PCT/US2018/046171; dated Nov. 28, 2018; 10 total pages.
PCT Notification of Transmittal of the International Search Report and the Written Opinion of the International Searching Authority for International Application No. PCT/US2018/046182; dated Nov. 30, 2018; 10 total pages.

Eagle Harbor Technologies presentation by Dr. Kenneth E. Miller—"The EHT Long Pulse Integrator Program," ITPA Diagnostic Meeting, General Atomics, Jun. 4-7, 2013, 18 pages.
Lin, Jianliang, et al.,—"Diamond like carbon films deposited by HiPIMS using oscillatory voltage pulses," Surface & Coatings Technology 258, 2014, published by Elsevier B.V., pp. 1212-1222.
PCT/US2020/014453 Interanational Search Report and Written Opinion dated May 14, 2020 consists of 8 pages.
S.B. Wang et al. "Ion Bombardment Energy and SiO 2/Si Fluorocarbon Plasma Etch Selectivity", Journal of Vacuum Science & Technology A 19, 2425 (2001).
Korean Office Action for 10-2020-7007495 dated Jun. 14, 2021.
Zhen-hua Bi et al., A brief review of dual-frequency capacitively coupled discharges, Current Applied Physics, vol. 11, Issue 5, Supplement, 2011, pp. S2-S8.
Chang, Bingdong, "Oblique angled plasma etching for 3D silicon structures with wiggling geometries" 31(8), [085301]. https://doi.org/10.1088/1361-6528/ab53fb. DTU Library. 2019.
Michael A. Lieberman, "A short course of the principles of plasma discharges and materials processing", Department of Electrical Engineering and Computer Sciences University of California, Berkeley, CA 94720.
Dr. Steve Sirard, "Introduction to Plasma Etching", Lam Research Corporation. 64 pages.
Zhuoxing Luo, B.S., M.S, "RF Plasma Etching With A DC Bias" A Dissertation in Physics. Dec. 1994.
Michael A. Lieberman, "Principles of Plasma Discharges and Material Processing", A Wiley Interscience Publication. 1994.
Yiting Zhang et al. "Investigation of feature orientation and consequences of ion tilting during plasma etching with a three-dimensional feature profile simulator", Nov. 22, 2016.
Richard Barnett et al. A New Plasma Source for Next Generation MEMS Deep Si Etching: Minimal Tilt, Improved Profile Uniformity and Higher Etch Rates, SPP Process Technology Systems. 2010.
The International Search Report and the Written Opinion for International Application No. PCT/US2021/040380; dated Oct. 27, 2021; 10 pages.
International Search Report and Written Opinion dated Feb. 4, 2022 for Application No. PCT/US2021/054806.
International Search Report and Written Opinion dated Feb. 4, 2022 for Application No. PCT/US2021/054814.
U.S. Appl. No. 17/346,103, filed Jun. 11, 2021.
U.S. Appl. No. 17/349,763, filed Jun. 16, 2021.
U.S. Appl. No. 63/242,410, filed Sep. 9, 2021.
U.S. Appl. No. 17/410,803, filed Aug. 24, 2021.
U.S. Appl. No. 17/537,107, filed Nov. 29, 2021.
U.S. Appl. No. 17/352,165, filed Jun. 18, 2021.
U.S. Appl. No. 17/352,176, filed Jun. 18, 2021.
U.S. Appl. No. 17/337,146, filed Jun. 2, 2021.
U.S. Appl. No. 17/361,178, filed Jun. 28, 2021.
U.S. Appl. No. 63/210,956, filed Jun. 15, 2021.
U.S. Appl. No. 17/475,223, filed Sep. 14, 2021.
U.S. Appl. No. 17/537,314, filed Nov. 29, 2021.
Chinese Office Action for 201880053380.1 dated Dec. 2, 2021.
Taiwan Office Action for 108132682 dated Mar. 24, 2022.

\* cited by examiner

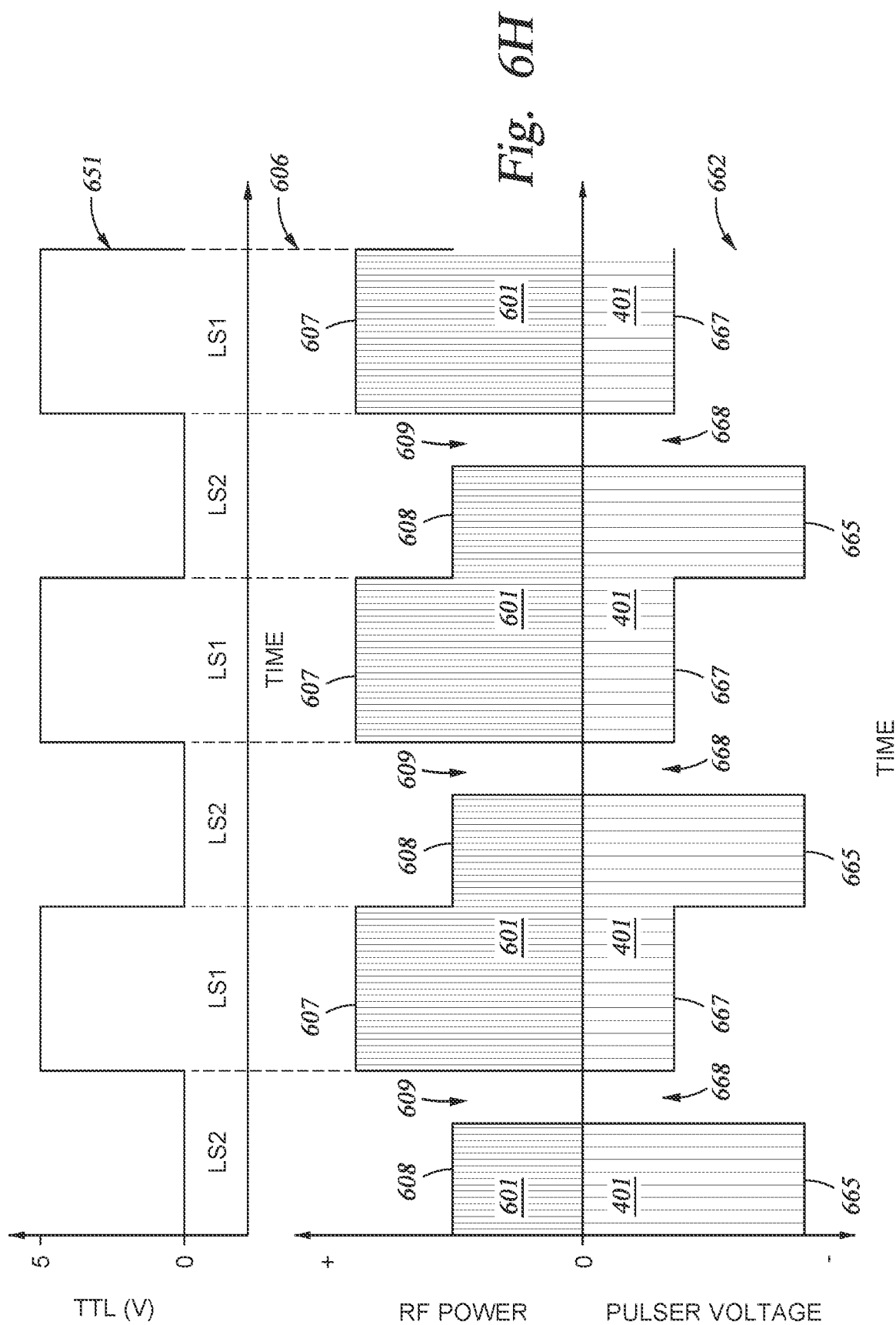

PLASMA PROCESSING ASSEMBLY USING PULSED-VOLTAGE AND RADIO-FREQUENCY POWER

CROSS REFERENCE TO RELATED APPLICATIONS

This application is a continuation of U.S. Non-Provisional patent application Ser. No. 17/959,074, filed Oct. 3, 2022, which is a continuation of U.S. Non-Provisional patent application Ser. No. 17/315,256, filed May 7, 2021, which claims the benefit of U.S. Provisional Patent Application Ser. No. 63/059,533, filed Jul. 31, 2020, and U.S. Provisional Patent Application Ser. No. 63/150,529, filed Feb. 17, 2021, each of which are herein incorporated by reference in its entirety.

BACKGROUND

Field

Embodiments described herein generally relate to semiconductor device manufacturing hardware and processes, and more specifically to an apparatus and methods of controlling the delivery of power to a plasma formed in plasma processing chamber used in semiconductor manufacturing.

Description of the Related Art

Reliably producing high aspect ratio features is one of the key technology challenges for the next generation of very large scale integration (VLSI) and ultra large scale integration (ULSI) of semiconductor devices. One method of forming high aspect ratio features uses a plasma assisted etching process, such as a reactive ion etch (RIE) plasma process, to form high aspect ratio openings in a material layer, such as a dielectric layer, of a substrate. In a typical RIE plasma process, a plasma is formed in an RIE processing chamber and ions from the plasma are accelerated towards a surface of a substrate to form openings in a material layer disposed beneath a mask layer formed on the surface of the substrate.

A typical Reactive Ion Etch (RIE) plasma processing chamber includes a radio frequency (RF) bias generator, which supplies an RF voltage to a "power electrode" (e.g., a biasing electrode), such as a metal plate positioned adjacent to an "electrostatic chuck" (ESC) assembly, more commonly referred to as the "cathode". The power electrode can be capacitively coupled to the plasma of a processing system through a thick layer of dielectric material (e.g., ceramic material), which is a part of the ESC assembly. In a capacitively coupled gas discharge, the plasma is created by using a radio frequency (RF) generator that is coupled to an RF electrode through an RF matching network ("RF match") that tunes the apparent load to 50Ω to minimize the reflected power and maximize the power delivery efficiency. The application of RF voltage to the power electrode causes an electron-repelling plasma sheath (also referred to as the "cathode sheath") to form over a processing surface of a substrate that is positioned on a substrate supporting surface of the ESC assembly during processing. The non-linear, diode-like nature of the plasma sheath results in rectification of the applied RF field, such that a direct-current (DC) voltage drop, or "self-bias", appears between the substrate and the plasma, making the substrate potential negative with respect to the plasma potential. This voltage drop determines the average energy of the plasma ions accelerated towards the substrate, and thus etch anisotropy. More specifically, ion directionality, the feature profile, and etch selectivity to the mask and the stop-layer are controlled by the Ion Energy Distribution Function (IEDF). In plasmas with RF bias, the IEDF typically has two non-discrete peaks, one at a low energy and one at a high energy, and an ion population that has a range of energies that extend between the two peaks. The presence of the ion population in-between the two peaks of the IEDF is reflective of the fact that the voltage drop between the substrate and the plasma oscillates at the RF bias frequency. When a lower frequency RF bias generator is used to achieve higher self-bias voltages, the difference in energy between these two peaks can be significant; and because the etch profile due to the ions at low energy peak is more isotropic, this could potentially lead to bowing of the etched feature walls. Compared to the high-energy ions, the low-energy ions are less effective at reaching the corners at the bottom of the etched feature (e.g., due to the charging effect), but cause less sputtering of the mask material. This is important in high aspect ratio etch applications, such as hard-mask opening or dielectric mold etch. As feature sizes continue to diminish and the aspect ratio increases, while feature profile control requirements become more stringent, it becomes more desirable to have a well-controlled IEDF at the substrate surface during processing.

Other conventional plasma processes and processing chamber designs have also found that delivering multiple different RF frequencies to one or more of the electrodes in a plasma processing chamber can be used to control various plasma properties, such as plasma density, ion energy, and/or plasma chemistry. However, it has been found that the delivery of multiple conventional sinusoidal waveforms from two or more RF sources, which are each configured to provide different RF frequencies, is unable to adequately or desirably control the sheath properties and can lead to undesirable arcing problems. Moreover, due to direct or capacitive coupling between the RF sources during processing, each RF source may induce an RF current that is provided to the output of the other connected RF source(s) (e.g., often referred to as the "cross-talk"), resulting in the power being diverted away from the intended load (plasma), as well as a possibly causing damage to each of the RF sources.

Accordingly, there is a need in the art for novel, robust and reliable plasma processing and biasing methods that enable maintaining a nearly constant sheath voltage, and thus create a desirable and repeatable IEDF at the surface of the substrate to enable a precise control over the shape of IEDF and, in some cases, the etch profile of the features formed in the surface of the substrate.

SUMMARY

Embodiments of the disclosure provided herein include an apparatus and method for the plasma processing of a substrate in a processing chamber. More specifically, embodiments of this disclosure describe a biasing scheme that is configured to provide a pulsed-voltage (PV) waveform delivered from one or more pulsed-voltage (PV) generators to the one or more electrodes within the processing chamber. The plasma process(es) disclosed herein can be used to control the shape of an ion energy distribution function (IEDF) and the interaction of the plasma with a surface of a substrate during plasma processing.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 6D-6H each illustrate examples of a radio frequency (RF) waveform and a pulsed voltage (PV) waveform that can provided to one or more electrodes, according to one or more embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure provided herein include an apparatus and method for the plasma processing of a substrate in a processing chamber. More specifically, embodiments of this disclosure describe a biasing scheme that is configured to provide a radio frequency (RF) generated RF waveform from an RF generator to one or more electrodes within a processing chamber and a pulsed-voltage (PV) waveform delivered from one or more pulsed-voltage (PV) generators to the one or more electrodes within the processing chamber. In general, the generated RF waveform is configured to establish and maintain a plasma within the processing chamber, and the delivered PV waveform(s) are configured to establish a nearly constant sheath voltage across the surface of a substrate and thus create a desirable ion energy distribution function (IEDF) at the surface of the substrate during one or more plasma processing steps performed within the processing chamber. The plasma process(es) disclosed herein can be used to control the shape of IEDF and thus the interaction of the plasma with a surface of a substrate during processing. In some configurations, the plasma process(es) disclosed herein are used to control the profile of features formed in the surface of the substrate during processing. In some embodiments, the pulsed voltage waveform is established by a PV generator that is electrically coupled to a biasing electrode disposed within a substrate support assembly disposed within a plasma processing chamber.

Figure 1A:
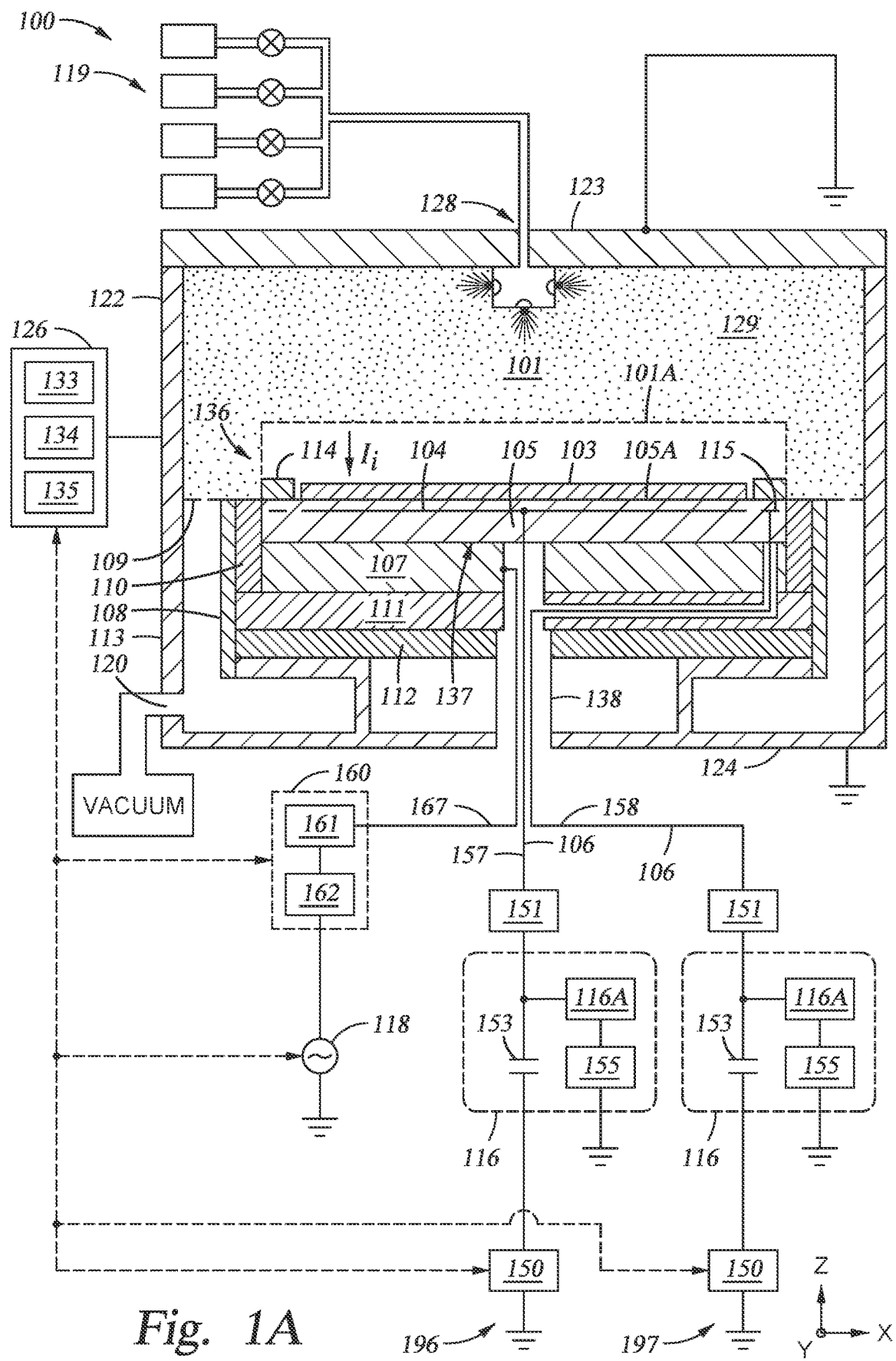
FIG. 1A is a schematic cross-sectional view of a processing chamber configured to practice methods described herein, according to one embodiment.
Figure 1B:
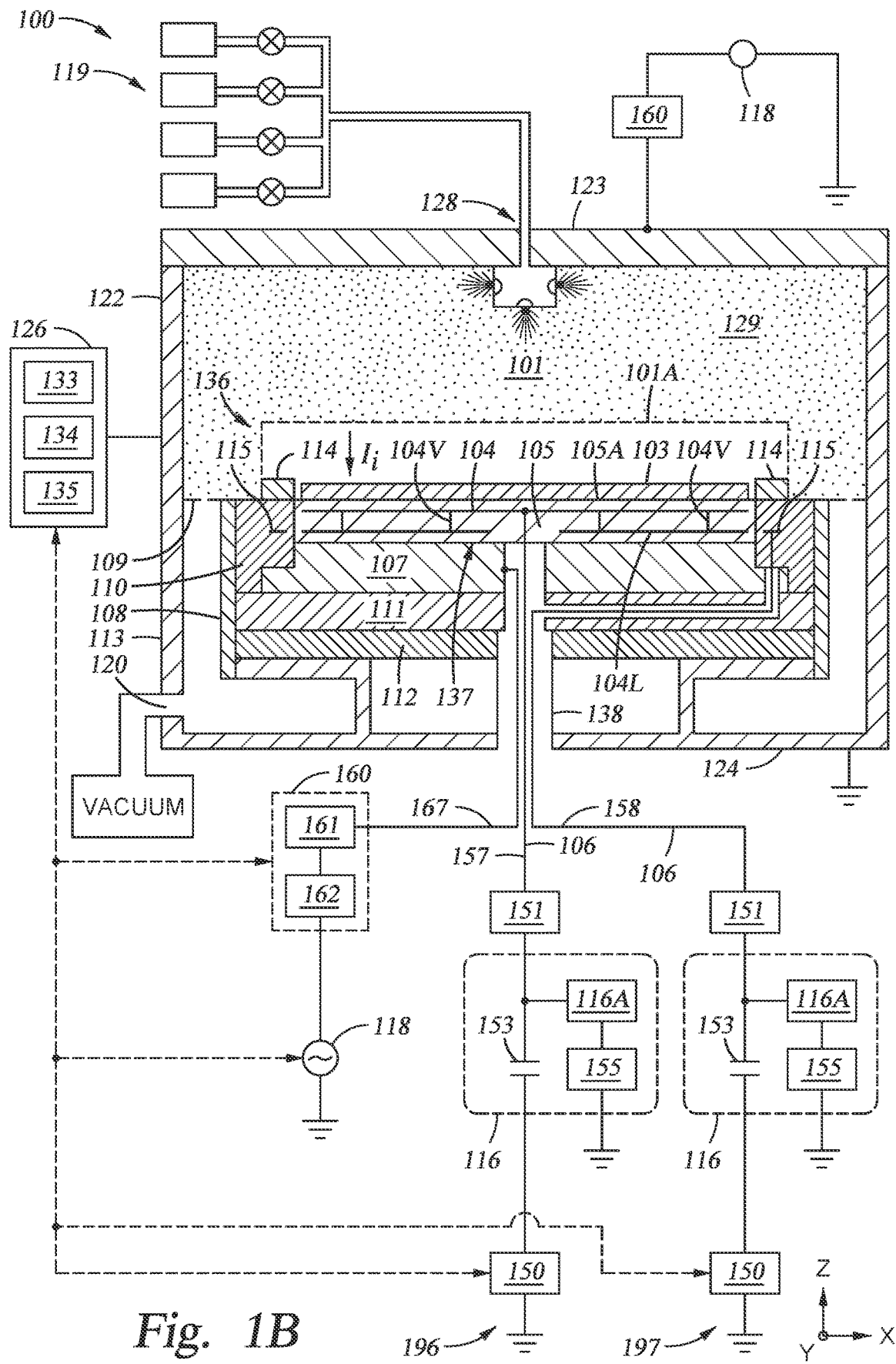
FIG. 1B is a schematic cross-sectional view of a processing chamber configured to practice methods described herein, according to one embodiment.
Figure 1C:
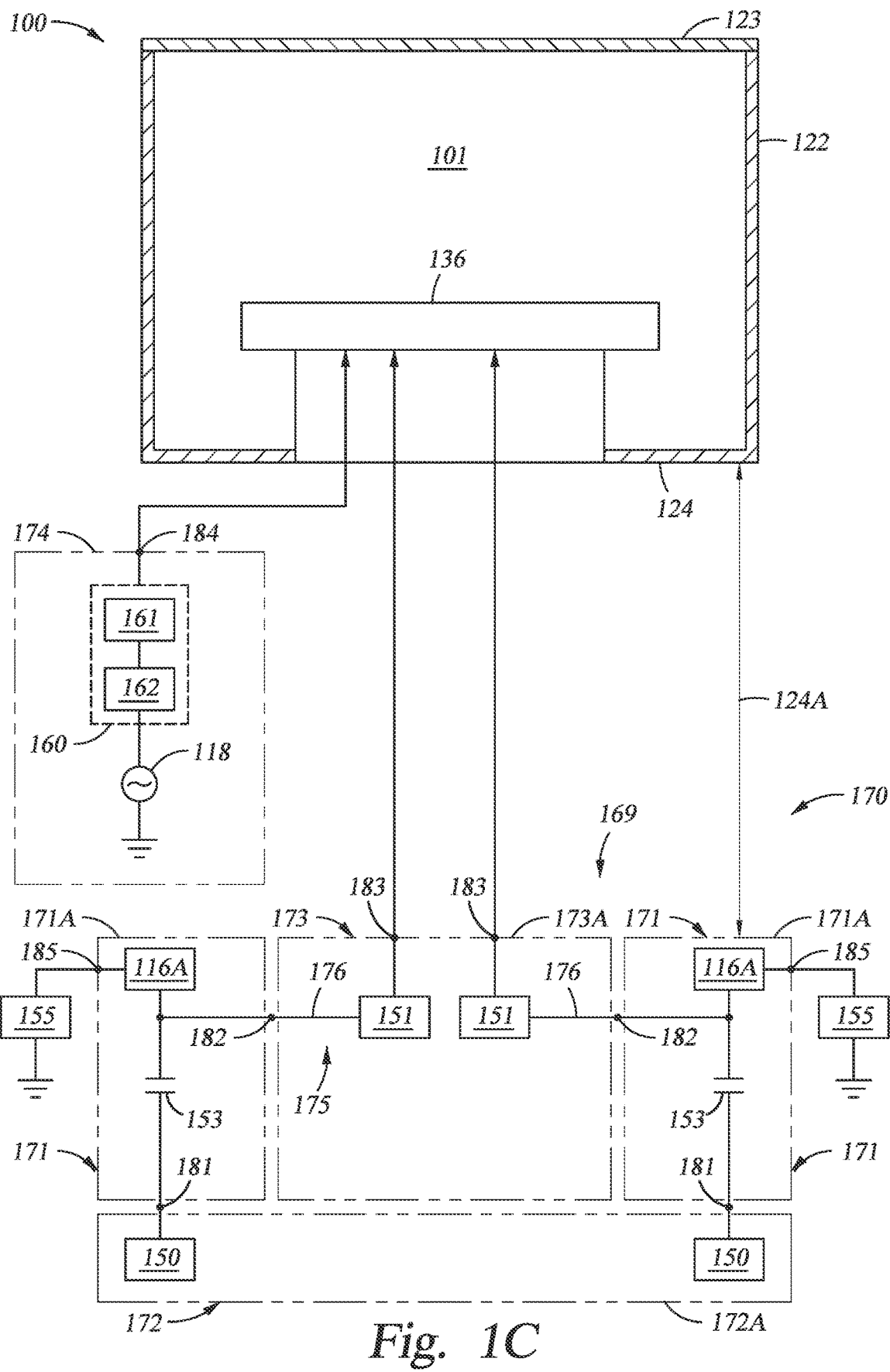
FIG. 1C is a schematic cross-sectional view of a packaging assembly that is coupled to a processing chamber, according to one embodiment.

During some semiconductor plasma processes, ions are purposely accelerated towards the substrate by the voltage drop in an electron-repelling sheath that forms over the substrate placed on top of a substrate-support assembly 136 (FIGS. 1A-1C). While not intending to be limiting as to the scope of the disclosure provided herein, the substrate support assembly 136 is often referred to herein as the "cathode assembly" or "cathode". In some embodiments, the substrate support assembly 136 includes a substrate support 105 and a support base 107. The substrate support 105 can include an electrostatic chuck (ESC) assembly that is configured to chuck (e.g., retain) a substrate on a substrate receiving surface 105A.

In some embodiments of the disclosure provided herein, a processing chamber is configured to provide a capacitively coupled gas discharge, such that a plasma is created by use of an RF generator assembly that includes an RF generator that is coupled to an RF electrode through an RF matching network ("RF match"). The RF matching network is configured to tune the apparent load to 50Ω to minimize the reflected power and maximize the power delivery efficiency.

In some embodiments, the RF electrode includes a metal plate that is positioned parallel to the plasma-facing surface of the substrate.

Additionally, during the plasma processing methods disclosed herein, an ion-accelerating cathode sheath is generally formed during plasma processing by use of a pulsed-voltage (PV) generator that is configured to establish a pulsed-voltage waveform at one or more biasing electrodes 104 (FIGS. 1A-1B) disposed within the substrate support assembly 136. In some embodiments, the one or more biasing electrodes 104 include a chucking electrode that is separated from the substrate by a thin layer of a dielectric material formed within the substrate support assembly 136 (e.g., electrostatic chuck (ESC) assembly) and optionally an edge control electrode that is disposed within or below an edge ring 114 that surrounds a substrate 103 when the substrate 103 is disposed on the substrate supporting surface 105A of the substrate support assembly 136. As will be discussed further below, this pulsed-voltage waveform (PVWF) can be configured to cause a nearly constant sheath voltage (e.g., a difference between the plasma potential and the substrate potential) to be formed for a sizable portion of the PV waveform's pulse period, which corresponds to a single (narrow) peak containing ion energy distribution function (IEDF) of the ions reaching the substrate during this part of the pulse period, which is also referred to herein as the "ion-current phase".

However, as noted above, due to direct or capacitive coupling between the RF generator assembly and the PV generator assembly during processing, the interaction between the generated outputs from the RF generator and PV generator(s) will result in the power being diverted away from the intended (plasma) load, as well as possibly causing damage to each of the RF source and the PV source(s) without the use of a filtering scheme and/or processing method disclosed herein. Thus, the apparatus and methods disclosed herein are configured to provide at least a method of combining RF and PV power to one or more electrodes (e.g., cathode(s)) of a plasma processing chamber by coupling each generator to its respective electrode through one or more waveform-dependent filter assemblies, such that the one or more waveform-dependent filter assemblies do not significantly impede the power delivery provided from their respective RF and PV generators to the plasma.

Plasma Processing Chamber Example

Figure 3A:
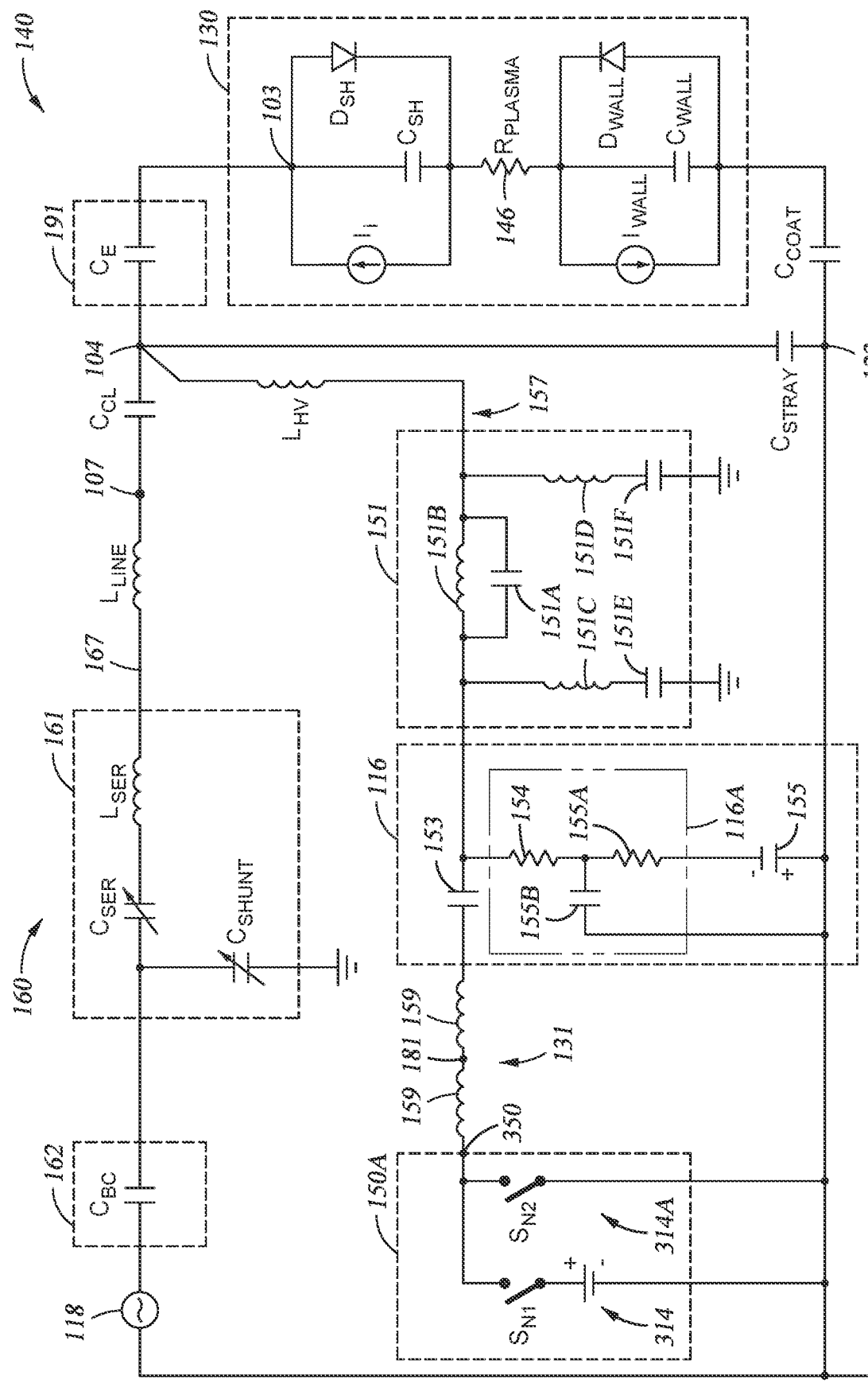
FIG. 3A is a functionally equivalent circuit diagram of a negative pulse biasing scheme that can be performed in the process chamber illustrated in FIG. 1A or 1B, according to one embodiment.
Figure 3B:
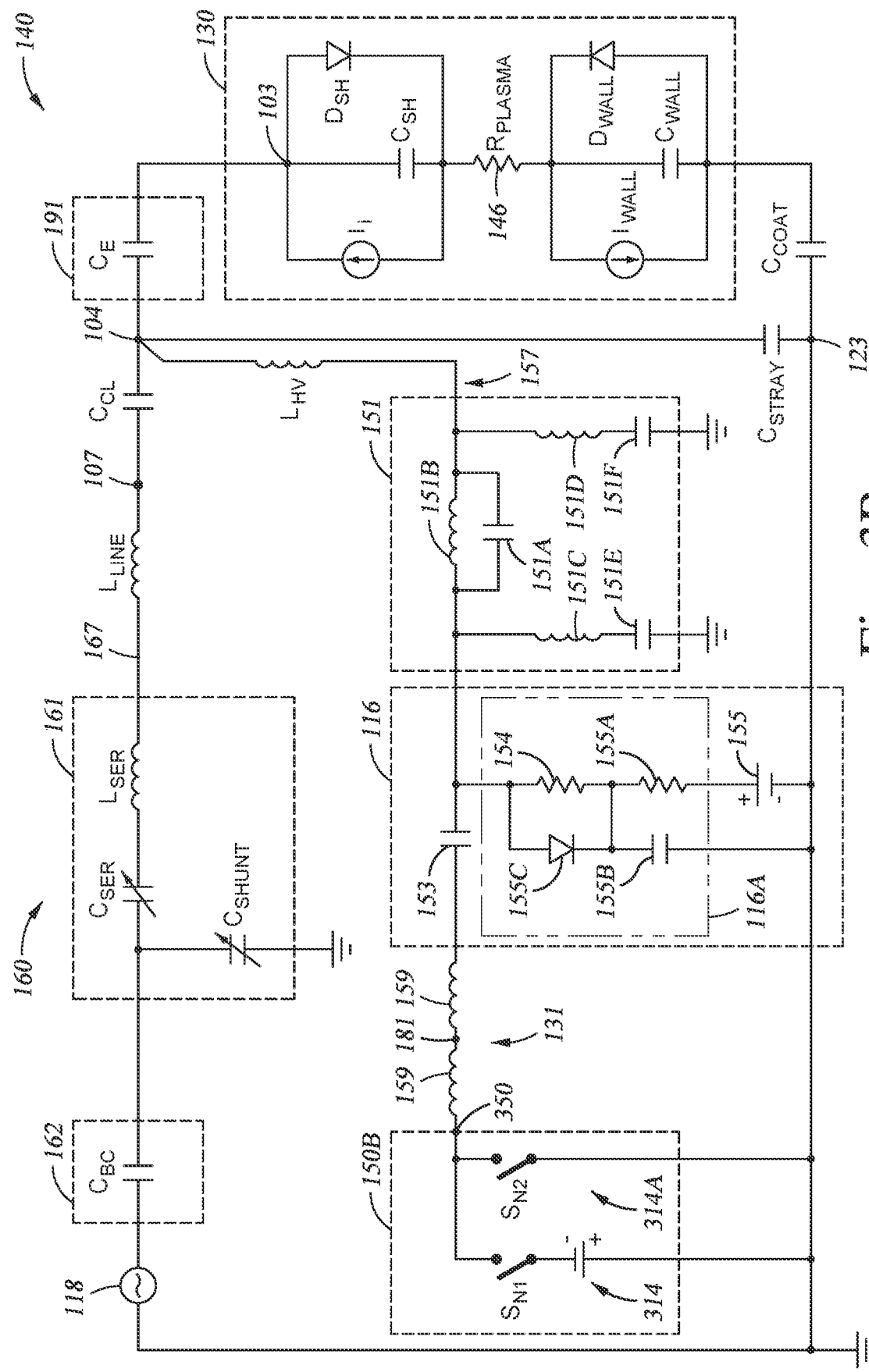
FIG. 3B is a functionally equivalent circuit diagram of a positive pulse biasing scheme that can be performed in the process chamber illustrated in FIG. 1A or 1B, according to one embodiment.

FIG. 1A is a schematic cross-sectional view of a processing chamber 100, in which a complex load 130 (FIGS. 3A-3B) is formed during plasma processing. FIGS. 3A-3B are each examples of a simplified electrical circuit 140 of a pulsed voltage and RF biasing scheme that can be performed using the components found in processing chamber 100. The processing chamber 100 is configured to practice one or more of the biasing schemes proposed herein, according to one or more embodiments. In one embodiment, the processing chamber is a plasma processing chamber, such as a reactive ion etch (RIE) plasma chamber. In some other embodiments, the processing chamber is a plasma-enhanced deposition chamber, for example a plasma-enhanced chemical vapor deposition (PECVD) chamber, a plasma enhanced physical vapor deposition (PEPVD) chamber, or a plasma-enhanced atomic layer deposition (PEALD) chamber. In some other embodiments, the processing chamber is a plasma treatment chamber, or a plasma based ion implant chamber, for example a plasma doping (PLAD) chamber. In some embodiments, the plasma source is a capacitively coupled plasma (CCP) source, which includes an electrode (e.g., chamber lid 123) disposed in the processing volume facing the substrate support assembly 136. As illustrated in FIG. 1A, an opposing electrode, such as the chamber lid 123, which is positioned opposite to the substrate support assembly 136, is electrically coupled to ground. However, in other alternate embodiments, the opposing electrode is electrically coupled to an RF generator, as illustrated in FIG. 1B. In yet other embodiments, the processing chamber may alternately, or additionally, include an inductively coupled plasma (ICP) source electrically coupled to a radio frequency (RF) power supply.

The processing chamber 100 also includes a chamber body 113 that includes the chamber lid 123, one or more sidewalls 122, and a chamber base 124, which define a processing volume 129. The one or more sidewalls 122 and chamber base 124 generally include materials that are sized and shaped to form the structural support for the elements of the processing chamber 100, and are configured to withstand the pressures and added energy applied to them while a plasma 101 is generated within a vacuum environment maintained in the processing volume 129 of the processing chamber 100 during processing. In one example, the one or more sidewalls 122 and chamber base 124 are formed from a metal, such as aluminum, an aluminum alloy, or a stainless steel. A gas inlet 128 disposed through the chamber lid 123 is used to provide one or more processing gases to the processing volume 129 from a processing gas source 119 that is in fluid communication therewith. A substrate 103 is loaded into, and removed from, the processing volume 129 through an opening (not shown) in one of the one or more sidewalls 122, which is sealed with a slit valve (not shown) during plasma processing of the substrate 103. Herein, the substrate 103 is transferred to and from a substrate receiving surface 105A of an ESC substrate support 105 using a lift pin system (not shown).

In some embodiments, an RF generator assembly 160 is configured to deliver RF power to the support base 107 disposed proximate to the ESC substrate support 105, and within the substrate support assembly 136. The RF power delivered to the support base 107 is configured to ignite and maintain a processing plasma 101 formed by use of processing gases disposed within the processing volume 129. In some embodiments, the support base 107 is an RF electrode that is electrically coupled to an RF generator 118 via an RF matching circuit 161 and a first filter assembly 162, which are both disposed within the RF generator assembly 160. In some embodiments, the plasma generator assembly 160 and RF generator 118 are used to ignite and maintain a processing plasma 101 using the processing gases disposed in the processing volume 129 and fields generated by the RF power provided to the support base 107 by the RF generator 118. The processing volume 129 is fluidly coupled to one or more dedicated vacuum pumps, through a vacuum outlet 120, which maintain the processing volume 129 at sub-atmospheric pressure conditions and evacuate processing and/or other gases, therefrom. A substrate support assembly 136, disposed in the processing volume 129, is disposed on a support shaft 138 that is grounded and extends through the chamber base 124. However, in some embodiments, the RF generator assembly 160 is configured to deliver RF power to the biasing electrode 104 disposed in the substrate support 105 versus the support base 107.

The substrate support assembly 136, as briefly discussed above, generally includes a substrate support 105 (e.g., ESC substrate support) and support base 107. In some embodiments, the substrate support assembly 136 can additionally include an insulator plate 111 and a ground plate 112, as is discussed further below. The substrate support 105 is thermally coupled to and disposed on the support base 107. In some embodiments, the support base 107 is configured to regulate the temperature of the substrate support 105, and the substrate 103 disposed on the substrate support 105, during substrate processing. In some embodiments, the support base 107 includes one or more cooling channels (not shown) disposed therein that are fluidly coupled to, and in fluid communication with, a coolant source (not shown), such as a refrigerant source or water source having a relatively high electrical resistance. In some embodiments, the substrate support 105 includes a heater (not shown), such as a resistive heating element embedded in the dielectric material thereof. Herein, the support base 107 is formed of a corrosion resistant thermally conductive material, such as a corrosion resistant metal, for example aluminum, an aluminum alloy, or a stainless steel and is coupled to the substrate support with an adhesive or by mechanical means.

The support base 107 is electrically isolated from the chamber base 124 by the insulator plate 111, and the ground plate 112 is interposed between the insulator plate 111 and the chamber base 124. In some embodiments, the processing chamber 100 further includes a quartz pipe 110, or collar, that at least partially circumscribes portions of the substrate support assembly 136 to prevent corrosion of the ESC substrate support 105 and, or, the support base 107 from contact with corrosive processing gases or plasma, cleaning gases or plasma, or byproducts thereof. Typically, the quartz pipe 110, the insulator plate 111, and the ground plate 112 are circumscribed by a liner 108. Herein, a plasma screen 109 approximately coplanar with the substrate receiving surface of the ESC substrate support 105 prevents plasma from forming in a volume between the liner 108 and the one or more sidewalls 122.

The substrate support 105 is typically formed of a dielectric material, such as a bulk sintered ceramic material, such as a corrosion resistant metal oxide or metal nitride material, for example aluminum oxide ($Al_2O_3$), aluminum nitride (AlN), titanium oxide (TiO), titanium nitride (TiN), yttrium oxide ($Y_2O_3$), mixtures thereof, or combinations thereof. In embodiments herein, the substrate support 105 further includes a biasing electrode 104 embedded in the dielectric material thereof. In one configuration, the biasing electrode 104 is a chucking pole used to secure (chuck) the substrate 103 to a substrate receiving surface 105A of the substrate support 105, also referred to herein as an ESC substrate support, and to bias the substrate 103 with respect to the processing plasma 101 using one or more of the pulsed-voltage biasing schemes described herein. Typically, the biasing electrode 104 is formed of one or more electrically conductive parts, such as one or more metal meshes, foils, plates, or combinations thereof. In some embodiments, the biasing electrode 104 is electrically coupled to a chucking module 116, which provides a chucking voltage thereto, such as static DC voltage between about −5000 V and about 5000 V, using an electrical conductor, such as the coaxial transmission line 106 (e.g., a coaxial cable). As will be discussed further below, the chucking module 116 includes bias compensation circuit elements 116A (FIGS. 3A-3B), a DC power supply 155, and a blocking capacitor 153. A chucking module blocking capacitor, which is also referred to herein as the blocking capacitor 153, is disposed between the output of a pulsed-voltage waveform generator (PVWG) 150 and the biasing electrode 104.

Figure 3C:
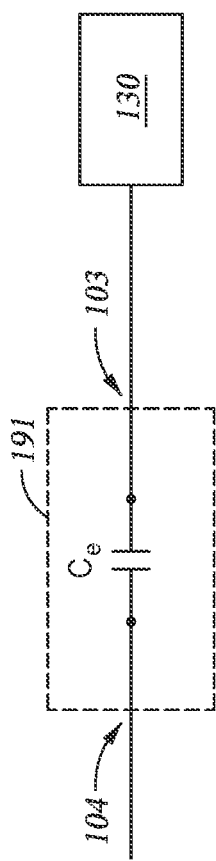
FIG. 3C is a functionally equivalent circuit diagram of a coulombic electrostatic chuck (ESC) that can be used in the process chamber illustrated in FIG. 1A or 1B, according to one embodiment.
Figure 3D:
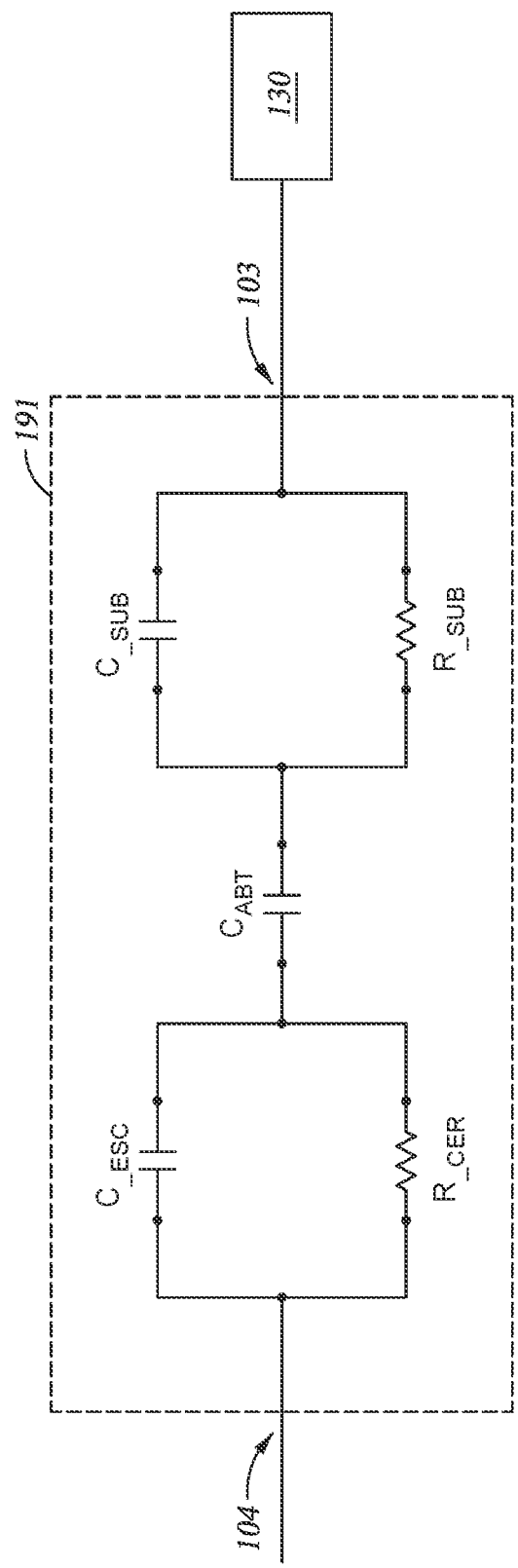
FIG. 3D is a functionally equivalent circuit diagram of a Johnsen-Rahbek ESC that can be used in the process chamber illustrated in FIG. 1A or 1B, according to one embodiment.

The biasing electrode 104 is spaced apart from the substrate receiving surface 105A of the substrate support 105, and thus from the substrate 103, by a layer of dielectric material of the substrate support 105. Depending on the type of electrostatic chucking method utilized within the substrate support 105 to retain a substrate 103 during processing, such as a coulombic ESC or a Johnsen-Rahbek ESC, the effective circuit elements used to model the electrical coupling of the biasing electrode 104 to the plasma 101 will vary. FIGS. 3C and 3D illustrate the effective circuit elements 191 created when a coulombic ESC or a Johnsen-Rahbek ESC, respectively, are utilized during plasma processing. In general, a parallel plate like structure is formed by the biasing electrode 104 and the layer of the dielectric material that can typically have an effective capacitance $C_E$ of between about 5 nF and about 50 nF. Typically, the layer of dielectric material (e.g., aluminum nitride (AlN), aluminum oxide ($Al_2O_3$), etc.) has a thickness between about 0.1 mm and about 1 mm, such as between about 0.1 mm and about 0.5 mm, for example about 0.3 mm. Herein, the biasing electrode 104 is electrically coupled to the output of the pulsed-voltage waveform generator (PVWG) 150 using the external conductor, such as the transmission line 106, which is disposed within the support shaft 138. In some embodiments, the dielectric material and layer thickness can be selected so that the chuck capacitance $C_{ESC}$ of the layer of dielectric material is between about 5 nF and about nF, such as between about 7 and about 10 nF, for example.

In a more complex model of the Johnsen-Rahbek ESC illustrated in FIG. 3D, the circuit model includes the combination of the ESC dielectric material chuck capacitance $C_{ESC}$, ESC dielectric material resistance $R_{CER}$, gap capacitance $C_{abt}$, substrate capacitance $C_{sub}$, and substrate resistance $R_{sub}$ as shown. The gap capacitances $C_{abt}$ will generally account for gas containing spaces above and below a substrate that is positioned on the substrate support 105. It is expected that the gap capacitance $C_{abt}$ has a capacitance in the same range as the chuck capacitance $C_{ESC}$.

In some applications, since the substrate 103 is typically made out of a thin layer of a semiconductor material and/or dielectric material, the substrate 103 can be considered to be electrically a part of the ESC dielectric layer disposed between the biasing electrode 104 and the substrate receiving surface 105A. Thus, in some applications, the chuck capacitance $C_{ESC}$ is approximated by the combined series capacitance of the ESC and the substrate (i.e., substrate capacitance $C_{sub}$). However, in the coulombic chuck case, since the substrate capacitance $C_{sub}$ is typically very large (>10 nF), or the substrate may be conductive (infinite capacitance), the series capacitance is determined primarily by the capacitance $C_{ESC}$. In this case, the effective capacitance $C_E$, as illustrated in FIG. 3C, is effectively equal to the chuck capacitance $C_{ESC}$. In the case of a "Johnsen-Rahbek ESC", the ESC dielectric layer is "leaky", in that it is not a perfect insulator and has some conductivity, since, for example, the dielectric material may be a doped aluminum nitride (AlN) having a permittivity (c) of about 9. However, the effective capacitance of a Johnsen-Rahbek ESC should be similar to a coulombic chuck. In one example, the volume resistivity of the dielectric layer within a Johnsen-Rahbek ESC is less than about $10^{12}$ ohms-cm (Ω-cm), or less than about $10^{10}$ Ω-cm, or even in a range between $10^8$ Ω-cm and $10^{12}$ Ω-cm.

The substrate support assembly 136 further includes an edge control electrode 115 that is positioned below the edge ring 114 and surrounds the biasing electrode 104 so that when biased, due to its position relative to the substrate 103, it can affect or alter a portion of the generated plasma 101 that is at or outside of the edge of the substrate 103. The edge control electrode 115 can be biased by use of a pulsed-voltage waveform generator (PVWG) 150 that is different from the pulsed-voltage waveform generator (PVWG) 150 that is used to bias the biasing electrode 104. In one configuration, a first PV waveform generator 150 of a first PV source assembly 196 is configured to bias the biasing electrode 104, and a second PV waveform generator 150 of a second PV source assembly 197 is configured to bias the edge control electrode 115. In one embodiment, the edge control electrode 115 is positioned within a region of the substrate support 105, as shown in FIG. 1A. In general, for processing chambers 100 that are configured to process circular substrates, the edge control electrode 115 is annular in shape, is made from a conductive material and configured to surround at least a portion of the biasing electrode 104, as shown in FIG. 1A-1B. In some embodiments, as illustrated in FIG. 1A, the edge control electrode 115 includes a conductive mesh, foil or plate that is disposed a similar distance (i.e., Z-direction) from the surface 105A of the substrate support 105 as the biasing electrode 104. In some other embodiments, the edge control electrode 115 includes a conductive mesh, foil or plate that is positioned on or within a region of the dielectric pipe 110 (e.g., AlN, or $Al_2O_3$), which surrounds at least a portion of the biasing electrode 104 and/or the substrate support 105, as shown in FIG. 1B. Alternately, in some other embodiments, the edge control electrode 115 is positioned within or is coupled to the edge ring 114, which is disposed adjacent to the substrate support 105. In this configuration, the edge ring 114 is formed from a semiconductor or dielectric material (e.g., AlN, $Al_2O_3$, etc.).

Referring to FIG. 1B, in some embodiments, the substrate support 105 further includes a secondary electrode 104L (e.g., metal mesh, foil or plate) that is electrically coupled to the biasing electrode 104 by use of a plurality of conductive vias 114V. One or more of the vias 114V have a first end that is in electrical contact with the biasing electrode 104 and a second end that is in electrical contact with the secondary electrode 104L. The secondary electrode 104L, which is disposed below the biasing electrode 104, is aligned, positioned and sized to improve the control of the plasma sheath and/or plasma uniformity over the surface of the substrate 103 during processing. In some configurations, as shown in FIG. 1B, the edge control electrode 115 is positioned adjacent to the secondary electrode 104L so that when used in combination, the biasing electrode 104, secondary electrode 114L and edge control electrode 115 will desirably alter the generated plasma 101 that is at or outside of the edge of the substrate 103.

Referring to FIGS. 1A and 1B, the support base 107 is spaced apart from the biasing electrode 104 by a portion of dielectric material. The portion of dielectric material in some configurations is the dielectric material used to form the substrate support 105, and extends from the backside of the substrate support 105 to the biasing electrode 104. The portion of dielectric material of the substrate support 105 has a support base capacitance $C_a$ that is in series with the ESC capacitance $C_E$, as schematically illustrated in FIGS. 3A and 3B. In some embodiments, the thickness of the portion of the dielectric material disposed between the support base 107 and the biasing electrode 104 is greater than the thickness of the dielectric material disposed between the biasing electrode 104 and the substrate 103, wherein the dielectric materials are the same material and/or form part of the substrate support 105. In one example, the portion of a dielectric material of the substrate support 105 (e.g., $Al_2O_3$ or AlN) disposed between support base 107 and the biasing electrode 104 is greater than 1 mm thick, such as between about 1.5 mm and about 20 mm thick.

Generally, a low pressure formed in the processing volume 129 of the processing chamber 100 results in poor thermal conduction between surfaces of hardware components disposed therein, such as between the dielectric material of the substrate support 105 and the substrate 103 disposed on the substrate receiving surface thereof, which reduces the substrate support's effectiveness in heating or cooling the substrate 103. Therefore, in some processes, a thermally conductive inert heat transfer gas, typically helium, is introduced into a volume (not shown) disposed between a non-device side surface of the substrate 103 and the substrate receiving surface 105A of the substrate support 105 to improve the heat transfer therebetween. The heat transfer gas, provided by a heat transfer gas source (not shown), flows to the backside volume through a gas communication path (not shown) disposed through the support base 107 and further disposed through the substrate support 105.

The processing chamber 100 further includes a controller 126, which is also referred to herein as a processing chamber controller. The controller 126 herein includes a central processing unit (CPU) 133, a memory 134, and support circuits 135. The controller 126 is used to control the process sequence used to process the substrate 103 including the substrate biasing methods described herein. The CPU 133 is a general-purpose computer processor configured for use in an industrial setting for controlling processing chamber and sub-processors related thereto. The memory 134 described herein, which is generally non-volatile memory, may include random access memory, read only memory, floppy or hard disk drive, or other suitable forms of digital storage, local or remote. The support circuits 135 are conventionally coupled to the CPU 133 and comprise cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the controller 126 determines which tasks are performable by the components in the processing chamber 100. Preferably, the program, which is readable by CPU 133 in the controller 126, includes code, which when executed by the processor (CPU 133), perform tasks relating to the monitoring and execution of the electrode biasing scheme described herein. The program will include instructions that are used to control the various hardware and electrical components within the processing chamber 100 to perform the various process tasks and various process sequences used to implement the electrode biasing scheme described herein.

During processing, the PV generators 314 within the PV waveform generators 150 of the first PV source assembly 196 and the second PV source assembly 197 establishes a pulsed voltage waveform on a load (e.g., the complex load 130) disposed with the processing chamber 100. While not intending to be limiting as to the disclosure provided herein, and to simplify the discussion, the components within the second PV source assembly 197, which are used to bias the edge control electrode 115, are not schematically shown in FIGS. 3A-3B. The overall control of the delivery of the PV waveform from each of the PV waveform generators 150 is controlled by use of signals provided from the controller 126. In one embodiment, as illustrated in FIG. 3A, the PV waveform generator 150A is configured to maintain a predetermined, substantially constant positive voltage across its output (i.e., to ground) during regularly recurring time intervals of a predetermined length, by repeatedly closing and opening its internal switch $S_1$ at a predetermined rate. Alternately, in one embodiment, as illustrated in FIG. 3B, a PV waveform generator 150B maintains a predetermined, substantially constant negative voltage across its output (i.e., to ground) during regularly recurring time intervals of a predetermined length, by repeatedly closing and opening its internal switch $S_1$ at a predetermined rate. In FIGS. 3A-3B, the PV waveform generator 150A, 150B is reduced to a minimal combination of the components that are important for understanding of its role in establishing a desired pulsed voltage waveform at the biasing electrode 104. Each PV waveform generator 150 will include a PV generator 314 (e.g., DC power supply) and one or more electrical components, such as high repetition rate switches, capacitors (not shown), inductors (not shown), fly back diodes (not shown), power transistors (not shown) and/or resistors (not shown), that are configured to provide a PV waveform to an output 350, as schematically illustrated in FIGS. 3A-3B. An actual PV waveform generator 150, which can be configured as a nanosecond pulse generator, may include any number of internal components and may be based on a more complex electrical circuit than what is illustrated in FIGS. 3A-3B. The schematic diagrams of FIGS. 3A-3B each provide only a functionally equivalent representation of the components of the PV waveform generator 150 and its electrical circuitry, in as much as is required to explain the fundamental principle of its operation, its interaction with the plasma in the processing volume, and its role in establishing a pulsed voltage waveform, such as the input pulsed voltage waveform 401, 431, 441 (FIGS. 4A-4C) at the biasing electrode 104. As can be inferred from a schematic diagram shown in FIGS. 3A-3B, when the switch $S_1$ moves from the open (Off) to the closed (On) position, it connects the output of the PV waveform generator 150 to its PV generator 314 that produces a substantially constant output voltage. The PV waveform generator 150 may be primarily used as a charge injector (current source), and not as a constant voltage source; therefore it is not necessary to impose stringent requirements on the stability of the output voltage, in that it can vary in time even when the switch remains in the closed (On) position. Further, in some configurations, the PV generator 314 is fundamentally a sourcing, but not a sinking supply, in that it only passes a current in one direction (e.g., the output can charge, but not discharge a capacitor). Additionally, when the switch $S_1$ remains in the open (Off) position, the voltage (Vo), across the output of the PV waveform generator 150 is not controlled by the PV generator 314 and is instead determined by the interaction of its internal components with other circuit elements.

A current-return output stage 314A has one end connected to ground, and another end connected to a connection point (i.e., one side of a generator output coupling assembly (not shown)) at the output of the PV waveform generator 150. The current-return output stage 314A can include the following elements: a resistor, a resistor and an inductor connected in series, a switch $S_2$, and/or a more complex combination of electrical elements, including parallel capacitors, which permits a positive current flow towards the ground.

Transmission line 131, which forms part of the PV transmission line 157 (FIGS. 1A-1B), electrically connects the output 350 of the PV waveform generator 150 to the second filter assembly 151. While the discussion below primarily discusses the PV transmission line 157 of the first PV source assembly 196, which is used to couple a PV waveform generator 150 to the biasing electrode 104, the PV transmission line 158 of the second PV source assembly 197, which couples a PV waveform generator 150 to the edge control electrode 115, will include the same or similar components. Therefore, in general, the output 350 of the PV waveform generator 150 is the end, where the output of the PV pulse generator 314 is connected through the internal electrical conductor to the output 350 and to the current-return output stage 314A. The transmission line 131 connects a generator output coupling assembly 181 (FIG. 1C), which is positioned at the output 350 of the PV waveform generator 150, to the second filter assembly 151. The electrical conductor(s) within the various parts of the PV transmission line 157, 158 may include: (a) a coaxial transmission line (e.g., coaxial line 106), which may include a flexible coaxial cable that is connected in series with a rigid coaxial transmission line, (b) an insulated high-voltage corona-resistant hookup wire, (c) a bare wire, (d) a metal rod, (e) an electrical connector, or (f) any combination of electrical elements in (a)-(e). The external conductor portion (e.g., first electrical conductor) of the PV transmission line 157, such as the portion of PV transmission line 157 within the support shaft 138 and the biasing electrode 104, will have some combined stray capacitance $C_{stray}$ (FIGS. 3A-3B) to ground. While not shown in the figures, the external conductor portion (e.g., second electrical conductor) of the PV transmission line 158 and the edge control electrode 115 will also have some combined stray capacitance $C_{stray}$ to ground. The internal electrical conductor of the PV waveform generator 150 may include the same basic elements as the external electrical conductor. In most practical applications, the transmission line 131 will include a line inductance 159 which can include a portion that is created by the internal components of the PV waveform generator 150 (i.e., left side of the generator output coupling assembly 181 (FIGS. 3A-3B)) and/or a portion that is created by the external line/cables (i.e., right side of the generator output coupling assembly 181) that connect the PV waveform generator 150 to the second filter assembly 151.

Referring back to FIG. 1A, the processing chamber 100 includes a chamber lid 123 that is grounded. In this configuration, which is generally different from conventional plasma processing chamber designs, the RF power is instead delivered through the substrate support. Thus, by coupling the RF generator 118 to the support base 107, the entire body of the ESC, which is functionally part of the cathode assembly, enables the top electrode to be grounded and allows the current-return area to be maximized. For plasma processes that utilize RF power delivery and PV waveform delivery, maximizing the grounded surface area within the plasma processing chamber, and hence the current-return area, minimizes the plasma potential jump during the ESC-recharging/sheath-collapse phase of the PV waveform cycle generated by the output of the PV waveform generator 150, which are discussed further below. Thus, the apparatus and methods provided herein will minimize the power losses to chamber walls and improves the plasma processing efficiency. The RF power and PV pulsed waveform delivery methods described herein also provides certain process benefits as they impact and allow for an improved control of the plasma properties and radical production. However, as noted above, there is a strong capacitive coupling between the support base 107 and the biasing electrode 104 through the ESC ceramic layer as well as between the RF transmission line 167 and PV transmission line 157, so when both types of power are delivered through the substrate support assembly 136 (i.e., cathode assembly), each generator will induce the current through the other, resulting in the power being diverted away from the intended (plasma) load as well as a possible damage to both generators.

In another alternate chamber lid 123 configuration, which can be used with one or more of the other embodiments disclosed herein, the chamber lid 123 (i.e., opposing electrode) is electrically isolated from the one or more sidewalls 122 and is electrically coupled to an RF generator 118 through a plasma generator assembly 160, as shown in FIG. 1B. In this configuration, the chamber lid 123 can be driven by a RF generator 118 to ignite and maintain a processing plasma 101 within the processing volume 129. In one example, a RF generator 118 is configured to provide an RF signal at an RF frequency greater than about 300 kHz to the chamber lid 123, such as between about 300 kHz and 60 MHz, or even a frequency in range from about 2 MHz to about 40 MHz.

Biasing Subsystem Assembly

FIG. 1C is a schematic diagram of the processing chamber 100 that includes a biasing subsystem assembly 170 that is configured to enclose and separately isolate various electrical components used to control, generate and deliver the radio frequency waveform(s) and the pulsed-voltage waveform(s) to the one or more electrodes within the processing chamber 100, such as the substrate support assembly 136. Due to at least to the configuration of and positioning of the biasing subsystem assembly 170 within a process chamber 100 a more repeatable and efficient delivery of the generated RF and PV waveforms can be achieved during processing. It is believed that the use of the biasing subsystem assembly 170 within each of a plurality of similarly configured process chambers can also help reduce process result variability found in a substrate-processing facility containing many processing chambers and other substrate-processing facilities around the world that contain many processing chambers.

The biasing subsystem assembly 170 will generally include a pulsed-voltage generating unit enclosure 172 and a junction box enclosure 169. The biasing subsystem assembly 170 will generally include active power and voltage sources, as well as electrical circuits that include passive components. The active sources may include one or more pulsed voltage waveform generators, one or more RF generators and/or one or more DC power sources. The passive components within the electrical circuits may include resistors, capacitors, inductors and diodes. When in use, the biasing subsystem assembly 170 can be used to combine different kinds of power sources so that their output can be applied to the same load (e.g., complex load 130). The load may include the plasma 101 formed in the processing chamber 100, the cathode sheath, cathode and its power delivery system (e.g., transmission line(s)) as well as stray inductive and capacitive elements.

In some embodiments, the junction box enclosure 169 includes one or more bias compensation module compartments 171 and a radio frequency (RF) filter compartment 173. In some embodiments, the biasing subsystem assembly 170 also includes an RF delivery enclosure 174. Each of the compartments 171, 172, and 173 and the RF delivery enclosure 174 include one or more walls 171A, 172A, 173A and 174A, respectively, that are each configured to at least partially enclose, separate and isolate their internal electrical components from the electrical components found in adjacently positioned enclosures and an environment outside of the process chamber 100. Typically, only a single wall is used to isolate adjacent compartments from each other.

Figure 1D:
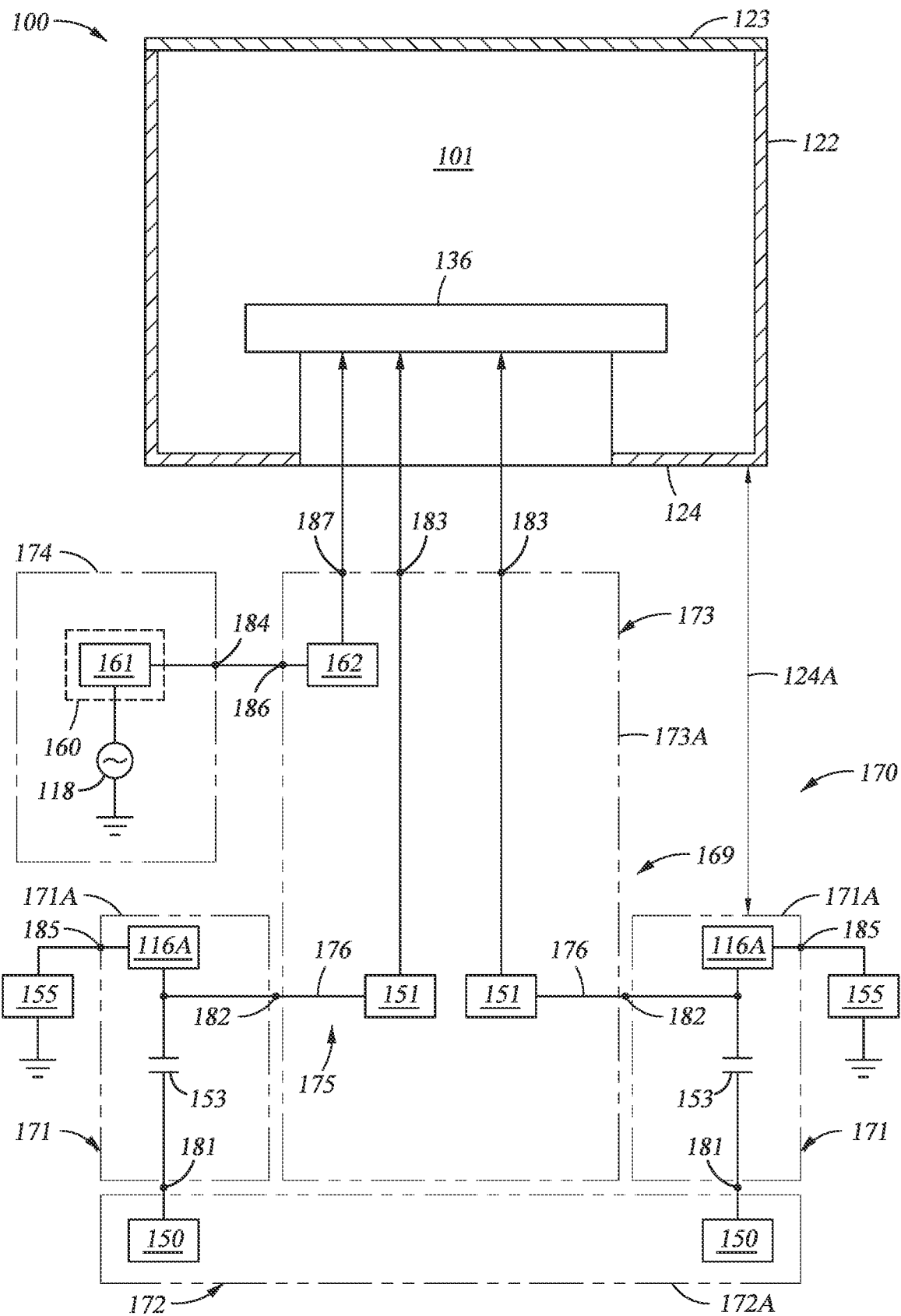
FIG. 1D is a schematic cross-sectional view of an alternate version of a packaging assembly that is coupled to a processing chamber, according to one embodiment.

While FIGS. 1C and 1D schematically illustrates, in some regions, two walls that positioned in a directly adjacent relationship, this is not intended to be limiting as to scope of the disclosure provided herein, since a single wall maybe used in place of two separate abutting walls. The biasing subsystem assembly 170 is positioned on or is coupled to one or more of the walls of the process chamber 100, such as the base 124, so as to rigidly mount, repeatably define the distance between components, and avoid strain on any connections provided between the biasing subsystem assembly 170 and the other components (e.g., connections to the substrate support assembly 136) within the process chamber 100. In some embodiments, a surface of the biasing subsystem assembly 170 (e.g., exposed surface of walls 173A) is positioned adjacent to one or more of the walls of the process chamber 100 (e.g., base 124). In some embodiments, an exposed surface (e.g., surface of wall 173A) of the biasing subsystem assembly 170 is positioned a distance 124A (FIG. 1C) of less than 24 inches, such as less than 12 inches, or even less than 6 inches from the base 124. In one example, the exposed surface of walls 173A are directly coupled to a lower surface of the base 124. It is believed that by optimizing the routing and minimizing the connection lengths of the current carrying elements that interconnect the electrical components within the compartments 171, 172, and 173 and/or RF delivery enclosure 174 of the biasing subsystem assembly 170, such as the connections between the bias compensation compartment components and the components in the radio frequency filter compartment 173, the formed stray inductance and stray capacitance in each of these areas of the system can be minimized. In practice, the biasing subsystem assembly 170 can be used to significantly reduce oscillations in the generated and established waveforms, and thus improve the integrity and repeatability of the high-voltage signals provided to the electrodes within the process chamber 100, such as the electrodes within the substrate support assembly 136.

The pulsed-voltage generating unit enclosure 172 includes at least one PV waveform generator 150 that is isolated from the electrical components found in the bias compensation module compartment 171, the radio frequency filter compartment 173 and the RF delivery enclosure 174 by at least the wall(s) 172A. The wall(s) 172A can include a grounded sheet metal box (e.g., aluminum or SST box) that is configured to support and isolate the one or more PV waveform generators 150 from any electromagnetic interference generated by the components within the RF delivery enclosure 174 and/or external to the process chamber 100. At an interface between the pulsed-voltage generating unit enclosure 172 and the bias compensation module compartment 171, a generator output coupling assembly 181 is used to connect the output 350 of a PV waveform generator 150 to a first portion of the transmission line 131 and the electrical components (e.g., blocking capacitor 153) disposed within the bias compensation module compartment 171. The term "coupling assembly", as used herein, generally describes one or more electrical components, such as one or more electrical connectors, discrete electrical elements (e.g., capacitor, inductor, and resistor) and/or conductive elements that are configured to connect the current carrying elements that electrically couple two or more electrical components together.

The one or more bias compensation module compartments 171 includes the bias compensation circuit elements 116A (FIGS. 3A-3B) and a blocking capacitor 153 that are isolated from the electrical components found in the pulsed-voltage generating unit enclosure 172, the radio frequency filter compartment 173 and the RF delivery enclosure 174 by at least the wall(s) 171A. In one embodiment, the bias compensation circuit elements 116A are coupled to an externally positioned DC power supply 155 by use of bias compensation module compartment DC source coupling assembly 185 that is formed at a wall 171A. Alternately, in one embodiment (not shown), the bias compensation circuit elements 116A and DC power supply 155 are both disposed within a bias compensation module compartment 171 and enclosed by a wall 171A. The wall(s) 171A can include a grounded sheet metal box that is configured to isolate the components within the bias compensation module compartment 171 from any electromagnetic interference generated by the components within the pulsed-voltage generating unit enclosure 172, the RF delivery enclosure 174 and/or external to the process chamber 100. At an interface between the bias compensation module compartment 171 and the radio frequency filter compartment 173, a bias compensation module compartment output coupling assembly 182 is used to connect the bias compensation circuit elements 116A, DC power supply 155 and blocking capacitor 153 to a second portion of the transmission line 131 and the electrical components (e.g., second filter assembly 151) disposed within the radio frequency filter compartment 173.

The radio frequency filter compartment 173 includes one or more second filter assemblies 151 and chamber interconnecting components that are isolated from the electrical components found in the pulsed-voltage generating unit enclosure 172, the one or more bias compensation module enclosures 171, and the RF delivery enclosure 174 by at least the wall(s) 173A. The wall(s) 173A can include a grounded sheet metal box that is configured to isolate the components within the radio frequency filter compartment 173 from any electromagnetic interference generated by the components within the pulsed-voltage generating unit enclosure 172, the RF delivery enclosure 174 and/or external to the process chamber 100. At an interface between the radio frequency filter compartment 173 and the base 124 of the process chamber 100, a cathode coupling assembly 183 is used to connect the output connection(s) of the radio frequency filter compartment 173 to a portion of the PV transmission lines 157, 158 that electrically connect the biasing subsystem assembly 170 to one of the electrodes within the process chamber 100, such as the electrodes within the substrate support assembly 136.

The RF delivery enclosure 174 includes the RF matching circuit 161, the first filter assembly 162, optionally the RF generator 118, and other chamber interconnecting components that are isolated from the electrical components found in the pulsed-voltage generating unit enclosure 172 and the one or more bias compensation module enclosures 171 by at least the wall(s) 174A. The wall(s) 174A can include a grounded sheet metal box that is configured to isolate the components within the RF delivery enclosure 174 from any electromagnetic interference generated by the components within the pulsed-voltage generating unit enclosure 172 and/or external to the process chamber 100. At an interface between the RF delivery enclosure 174 and the base 124 of the process chamber 100, a cathode coupling assembly 184 is used to connect the output connection(s) of RF delivery enclosure 174 to a portion of the RF transmission line 167 that electrically connect the RF delivery enclosure 174 of the biasing subsystem assembly 170 to one of the electrodes within the process chamber 100, such as the electrodes within the substrate support assembly 136. The external conductor portion (e.g., third electrical conductor) of the RF transmission line 167, such as the portion of the RF transmission line 167 within the support shaft 138 and the support base 107 will have some combined stray capacitance $C_{stray}$ to ground.

FIG. 1D is a schematic diagram of the processing chamber 100 that includes an alternate version of the biasing subsystem assembly 170 illustrated in FIG. 1C. As shown in FIG. 1D, the first filter assembly 162 has been removed from RF delivery enclosure 174 and repositioned within the radio frequency filter compartment 173. In this configuration, the RF generator 118 is configured to deliver an RF waveform through the RF matching circuit 161, cathode coupling assembly 184, a first RF coupling assembly 186, the first filter assembly 162, a second RF coupling assembly 187, the RF transmission line 167 and then to an electrode with the substrate support assembly 136. In this configuration, the radio frequency filter compartment 173 includes one or more second filter assemblies 151, the first filter assembly 162, and other chamber interconnecting components.

Plasma Processing Biasing Schemes and Processes

Figure 2:
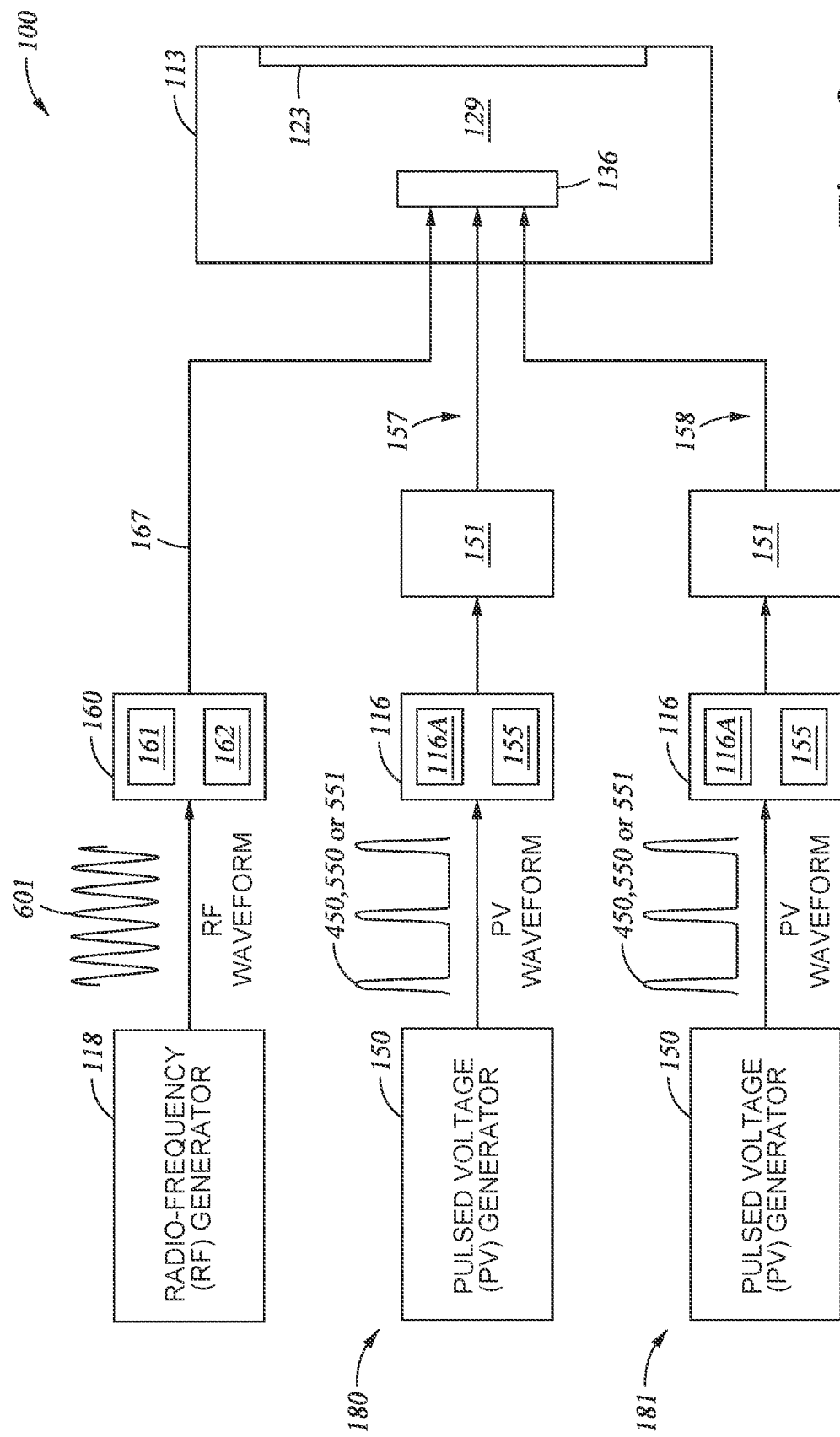
FIG. 2 is a simplified schematic diagram of a biasing scheme that can be used with the process chamber illustrated in FIG. 1A or 1B, according to one embodiment.

FIG. 2 is a simplified schematic diagram of a biasing scheme that can be used with the process chamber illustrated in FIG. 1A or 1B. As shown in FIG. 2, the RF generator 118 and PV waveform generators 150 are configured to deliver an RF waveform and pulsed-voltage waveforms, respectively, to one or more electrodes disposed within the chamber body 113 of the processing chamber 100. In one embodiment, the RF generator 118 and PV waveform generators 150 are configured to simultaneously deliver an RF waveform and pulsed-voltage waveform(s) to one or more electrodes disposed within the substrate support assembly 136. In one non-limiting example, as discussed above, the RF generator 118 and a PV waveform generator 150 are configured to deliver an RF waveform and pulsed-voltage waveform to the support base 107 and biasing electrode 104, respectively, which are both disposed in the substrate support assembly 136. In another example, the RF generator 118, a first PV waveform generator 150 and a second PV waveform generator 150 are configured to deliver an RF waveform, a first pulsed-voltage waveform and a second pulsed-voltage waveform to the support base 107, the biasing electrode 104 and the edge control electrode 115, respectively, which are all disposed in the substrate support assembly 136.

As illustrated in FIG. 2, the RF generator 118 is configured to provide a sinusoidal RF waveform to the one or more electrodes disposed in the chamber body 113 by delivering the RF signal, which includes the sinusoidal RF waveform 601 (FIGS. 6A-6G), through the plasma generator assembly 160, which includes the RF matching circuit 161 and the first filter assembly 162. Additionally, each of the PV waveform generators 150 are configured to provide a PV waveform, which typically includes a series of voltage pulses (e.g., nanosecond voltage pulses), to the one or more electrodes disposed in the chamber body 113 by establishing a PV waveform 401 (FIGS. 4A, 5A), 441 (FIG. 5B), or 431 (FIG. 5C) at the biasing electrode 104 through the second filter assembly 151. The components within the chucking module 116 can be optionally positioned between each PV waveform generator 150 and the second filter assembly 151.

Figure 4A:
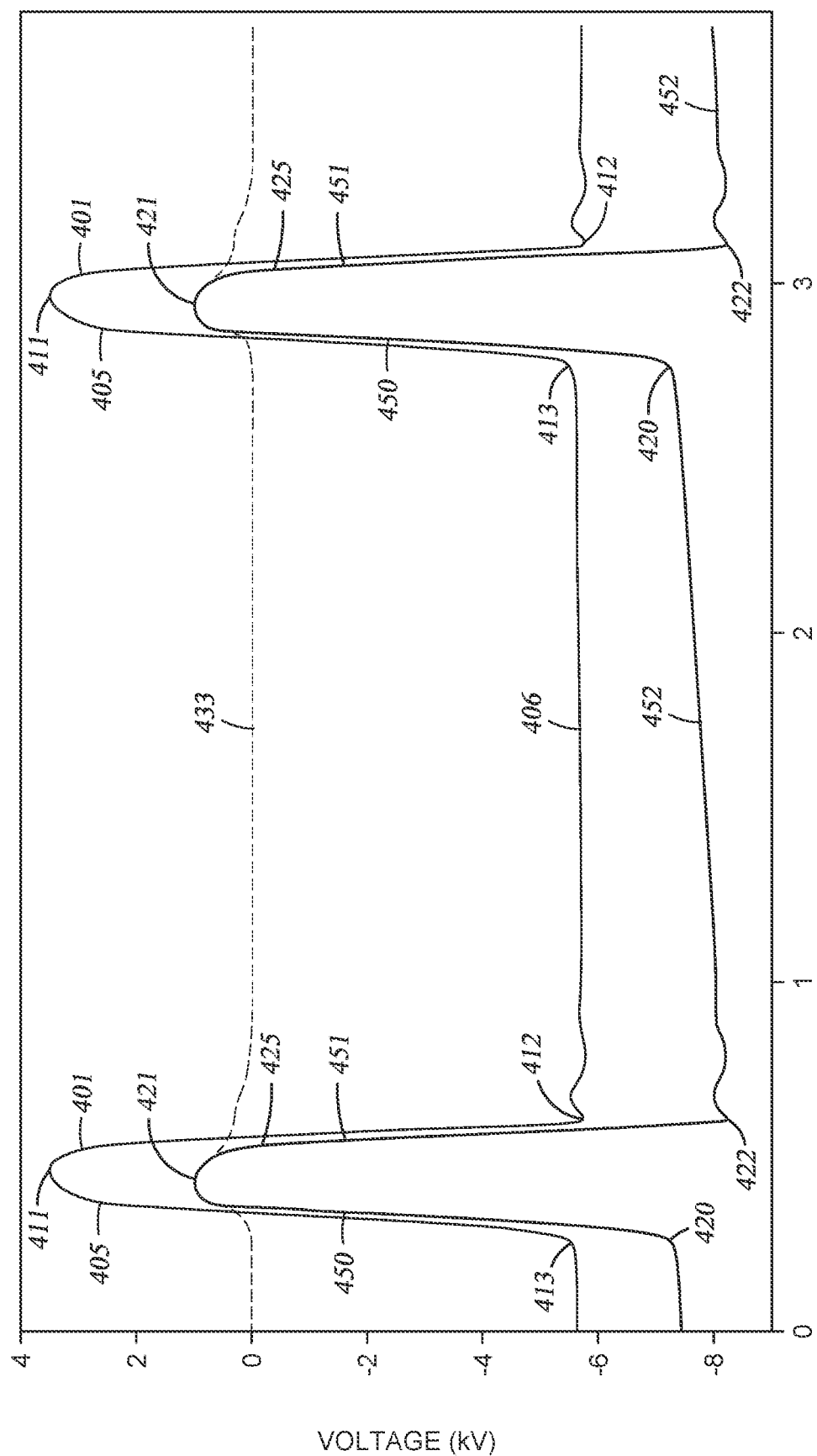
FIG. 4A illustrates an example of negative pulsed voltage (PV) waveforms established at the biasing electrode and substrate, according to one embodiment.
Figure 5A:
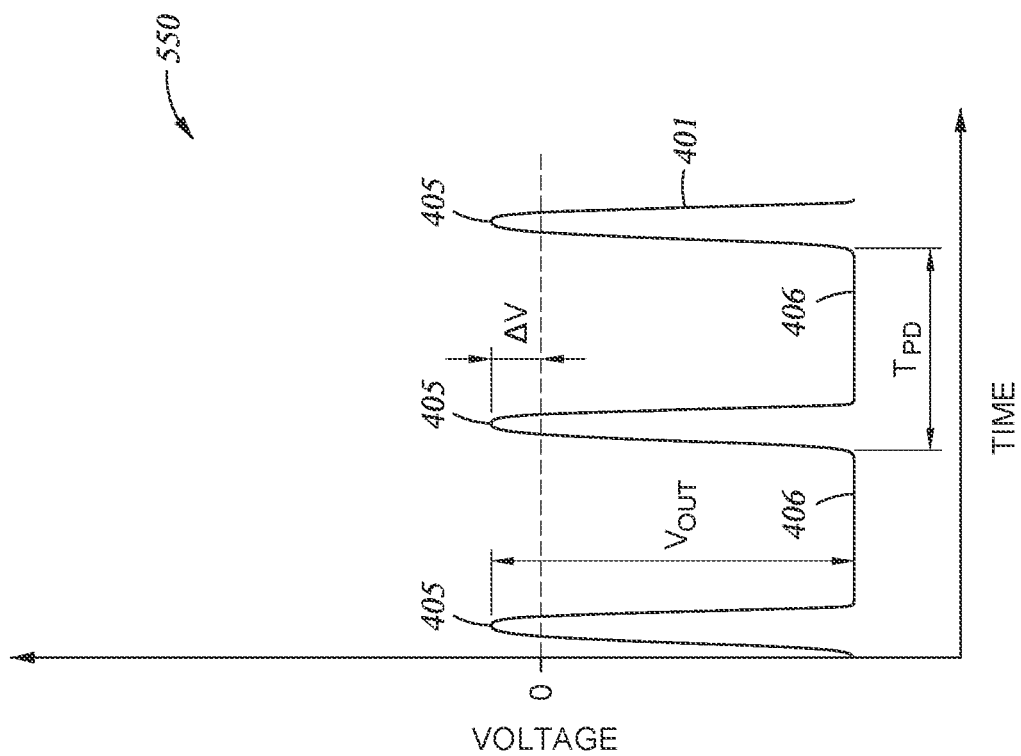
FIG. 5A illustrates an example of a negative pulsed voltage (PV) waveform established at the biasing electrode, according to one embodiment.
Figure 5C:
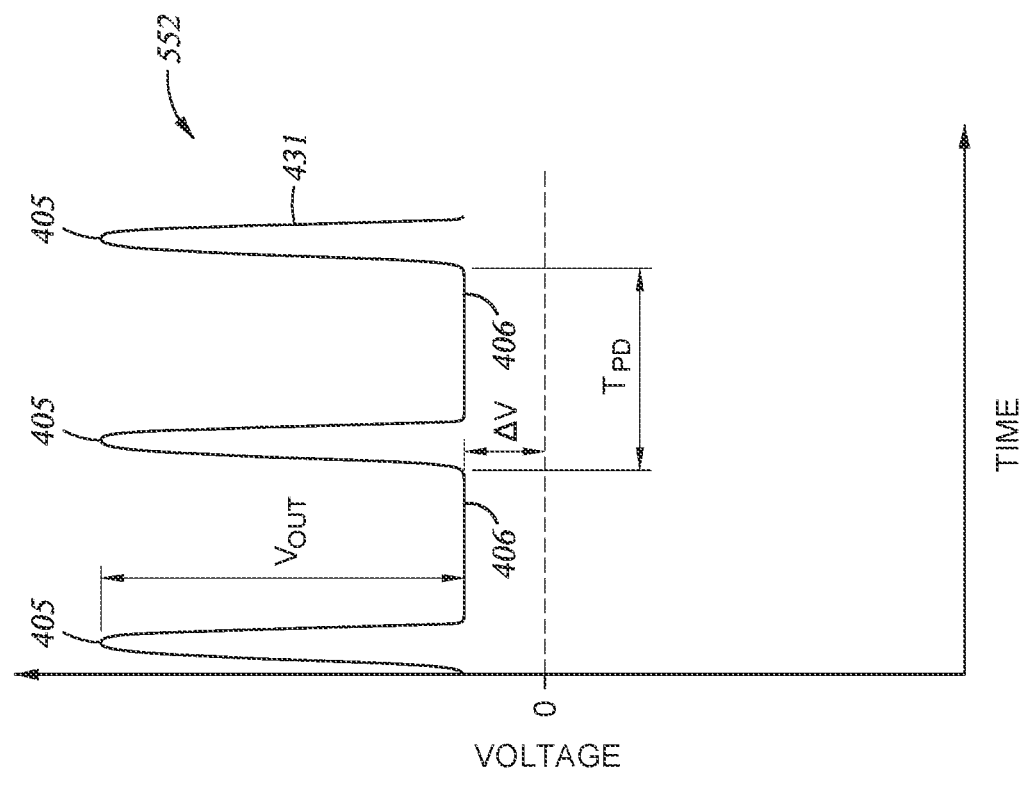
FIG. 5C illustrates an example of a positive pulsed voltage (PV) waveform established at the biasing electrode, according to one embodiment.

As briefly discussed above, FIGS. 3A-3B are each examples of a functionally equivalent, simplified electrical circuit 140 of the pulsed voltage and RF biasing scheme proposed herein, which also includes a representation of the plasma in the process volume. FIG. 3A depicts a simplified electrical circuit 140 of a pulsed voltage and RF biasing scheme that utilizes a PV waveform generator 150, within the first PV source assembly 196, that is configured to provide a positive voltage during a portion of the process of establishing the PV waveform at the biasing electrode 104, such as PV waveform 431 (FIG. 5C). FIG. 3B depicts a simplified electrical circuit 140 of a pulsed voltage and RF biasing scheme that utilizes a PV waveform generator 150, within the first PV source assembly 196, that is configured to provide a negative voltage during a portion of the process of establishing the PV waveform at the biasing electrode 104, such as PV waveform 401 (FIGS. 4A and 5A). These circuits illustrate a simplified model of the interaction of a pulsed-voltage waveform generator 150 of the first PV source assembly 196 and RF generator 118 within the processing chamber 100, and generally illustrate the basic elements used during operation of the process chamber 100. For clarity purposes, the following definitions are used throughout this disclosure: (1) unless a reference is specified, all potentials are referenced to ground; (2) the voltage at any physical point (like a substrate or a biasing electrode) is likewise defined as the potential of this point with respect to ground (zero potential point); (3) the cathode sheath is implied to be an electron-repelling, ion-accelerating sheath that corresponds to a negative substrate potential with respect to plasma; (4) the sheath voltage (also referred to sometimes as "sheath voltage drop"), $V_{sh}$, is defined as the absolute value of the potential difference between the plasma and the adjacent surface (e.g. of the substrate or the chamber wall); and (5) the substrate potential is the potential at the substrate surface facing the plasma.

The complex load 130 illustrated in FIGS. 3A-3B is shown as a standard electrical plasma model that represents the processing plasma 101 as three series elements. The first element being an electron-repelling cathode sheath (which we sometimes also refer to as the "plasma sheath" or just the "sheath") adjacent to the substrate 103. The cathode sheath is represented in FIGS. 3A-3B by a conventional three-part circuit element comprising: (a) the diode $D_{SH}$, which when open represents the sheath collapse, (b) the current source $I_i$, representing the ion current flowing to the substrate in the presence of the sheath, and (c) the capacitor $C_{SH}$ (e.g., ~100-300 pF), which represents the sheath for the main portion of the biasing cycle (i.e., ion current phase of the PV waveform), during which the ion acceleration and the etching occur. The second element being a bulk plasma, which is represented by a single resistor $R_{plasma}$ (e.g., resistor 146=~5-10 Ohms). The third element being an electron-repelling wall sheath forming at the chamber walls. The wall sheath is likewise represented in FIG. 3 by a three-part circuit element comprising: (a) the diode $D_{wall}$, (b) the current source $I_{iwall}$ representing the ion current to the wall, and (c) the capacitor $C_{wall}$ (e.g., ~5-10 nF), which represents the wall sheath primarily during the ESC recharging phase of the PV waveform (described later in the text). The interior surface of the grounded metal walls can also be considered be coated with a thin layer of a dielectric material, which is represented in FIG. 3 by a large capacitor $C_{coat}$ (e.g., ~300-1000 nF).

As illustrated in FIG. 3A-3B, the RF generator 118 is configured to provide an RF signal to the support base 107, and eventually the complex load 130, by delivering the generated RF power through the first filter assembly 162, the RF matching circuit 161, line inductance Lune, support base capacitance $C_{CL}$, and effective capacitance $C_E$. In one embodiment, the RF matching circuit 161 includes a series inductance element $L_{SER}$, and an adjustable series capacitance element CSER and an adjustable shunt capacitance element $C_{Shunt}$ that can be controlled by input from the controller 126. In some embodiments, the RF matching circuit 161 may alternately be formed by use of other circuit element configurations, such as L network, pi network, or transmatch circuits, for example. As noted above, the RF matching circuit 161 is generally configured to tune the apparent load to 50Ω to minimize the reflected power generated by the delivery of the RF signal from the RF generator 118 and maximize its power delivery efficiency. In some embodiments, the RF matching circuit 161 is optional, and in these cases other RF signal matching techniques may be used (e.g., variable frequency tuning) during a plasma processing of a substrate to avoid the inefficient delivering RF power to the complex load 130.

The first filter assembly 162, also referred to herein as the pulsed voltage filter assembly, includes one or more electrical elements that are configured to substantially prevent a current generated by the output of the PV waveform generator 150 from flowing through the RF transmission line 167 and damaging the RF generator 118. The first filter assembly 162 acts as a high impedance (e.g., high Z) to the PV signal generated from the PV pulse generator 314 within the PV waveform generator 150, and thus inhibits the flow of current to the RF generator 118. In one embodiment, the first filter assembly 162 includes a blocking capacitor $C_{BC}$, which is disposed between the RF matching circuit 161 and the RF generator 118. In this configuration, the RF matching element 161 is configured to compensate for the capacitance of the blocking capacitor $C_{BC}$ as it tunes the load apparent to the RF generator 118. In one example, to prevent a nanosecond PV waveform (e.g., pulse period 10-100 ns) provided from the PV waveform generator 150 from damaging the RF generator 118 the first filter assembly 162 includes a 35-100 pF capacitor. In another example, the first filter assembly 162 includes a blocking capacitor $C_{BC}$ that has a capacitance that is less than 50 pF.

In some embodiments, it may be desirable to utilize two or more sets of RF generators 118 and RF plasma generator assemblies 160 that are each configured to separately provide RF power at different RF frequencies to the support base 107, or other electrodes within the substrate support assembly 136. In one example, a first RF generator 118A (not shown) and first RF plasma generator assembly 160A (not shown) are configured to provide an RF signal at an RF frequency between about 300 kHz and 13.56 MHz to the support base 107 and a second RF generator 118B (not shown) and second RF plasma generator assembly 160B (not shown) are configured to provide an RF signal at an RF frequency of about 40 MHz or greater to the support base 107. In this example, each of the RF generator assemblies 160A, 160B will include a similarly configured first filter assembly 162 (e.g., includes a blocking capacitor having a capacitance $C_{BC}$) that is adapted to prevent a current generated by the output of the PV waveform generator 150 from flowing through the respective transmission lines and damaging each of the respective RF generators. In addition, each of the RF generator assemblies 160A, 160B may also include a separate RF filter assembly, such as the second filter assembly 151 that is connected in series with their respective RF generator assembly and is configured to block the other RF frequencies delivered from the other RF generator assemblies to additionally prevent an RF currents generated by the output of the other RF generators from flowing through the transmission line and damaging their respective RF generator. In this configuration, the separate RF filter assembly can include a low-pass filter, a notch filter or a high-pass filter that is able to allow the generated RF waveform to pass and block the RF waveform(s) generated by the other RF generator(s).

In some embodiments, it may also be desirable to utilize two or more sets of PV generators that are each configured to separately provide a PV waveform to the biasing electrode 104 and/or edge control electrode 115. In this example, each of the PV waveform generators 150 (only one is shown in FIG. 3A or 3B) will include a PV filter assembly (e.g., includes a blocking capacitor having a capacitance $C_{BC}$), which is adapted to prevent a current generated by the output of the other PV generator(s) from flowing through the respective PV transmission lines 157 and damaging each of the respective PV generators. In addition, each of the PV waveform generators 150 will also include an RF filter assembly, such as the second filter assembly 151 that is connected in series with each respective PV waveform generators and is configured to block the RF frequencies delivered from the other PV waveform generators.

In some embodiments, as shown in FIGS. 1A-3B, each of the PV waveform generators 150 are configured to provide a pulsed voltage waveform signal to the biasing electrode 104, and eventually the complex load 130, by delivering the generated pulsed voltage waveforms through the blocking capacitor 153 of the chucking module 116 and second filter assembly 151, high-voltage line inductance $L_{HV}$, and effective capacitance $C_E$. In this case, the system optionally includes a chucking module 116 used for chucking, such as "electrically clamping", the substrate to the substrate receiving surface of the ESC substrate support. Chucking the substrate allows filling a gap between the substrate receiving surface and the non-device side surface of the substrate with helium gas (He), which is done in order to provide good thermal contact between the two and allow substrate temperature control by regulating the temperature of the ESC substrate support. Combining a DC chucking voltage produced by the chucking module 116 with the pulsed voltage produced by the PV waveform generator 150 at a biasing electrode 104 will result in an additional voltage offset of the pulsed voltage waveform equal to the DC chucking voltage produced by the chucking module 116. The additional voltage offset can be added or subtracted from the offset ΔV illustrated in FIGS. 4A and 5A-5B. The effect of the chucking module 116 on the operation of the PV pulse generator 314 of the PV waveform generator 150 can be made negligible by selecting appropriately large blocking capacitor 153 and blocking resistor 154. The blocking resistor 154 schematically illustrates a resistor positioned within the components connecting the chucking module 116 to a point within the transmission line 131. The main function of the blocking capacitor 153 of in the simplified electrical circuit is to protect the PV pulse generator 314 from the DC voltage produced by the DC power supply 155, which thus drops across blocking capacitor 153 and does not perturb the PV waveform generator's output. The value of blocking capacitor 153 is selected such that while blocking only the DC voltage, it does not present any load to the pulsed bias generator's pulsed voltage output. By selecting a sufficiently large blocking capacitor 153 capacitance (e.g., 10-80 nF) the blocking capacitor 153 is nearly transparent for a 400 kHz PV waveform signal, which is generated by the PV waveform generator 150 for example, in that it is much bigger than any other relevant capacitance in the system and the voltage drop across this element is very small compared to that across other relevant capacitors, such as chuck capacitance $C_E$, and sheath capacitance $C_{SH}$. Additionally, in some embodiments, the blocking capacitor 153 has a capacitance that is significantly greater than a capacitance of the blocking capacitor $C_{BC}$ found in the first filter assembly 162. In some embodiments, the blocking capacitor 153 has a capacitance that is at least one order of magnitude, or at least two orders of magnitude, or about three orders of magnitude greater than a blocking capacitor $C_{BC}$ found in the first filter assembly 162. In one example, the capacitance of blocking capacitor $C_{BC}$ is about 38 pF and the capacitance of the blocking capacitor 153 is about nF.

Referring to FIGS. 3A-3B, the purpose of the blocking resistor 154 in the chucking module 116 is to block the high-frequency pulsed bias generator's voltage and minimize the current it induces in the DC voltage supply 155. This blocking resistor 154 is sized to be large enough to efficiently minimize the current through it. For example, a resistance of ≥1 MOhm is used to make a 400 kHz current from the PV waveform generator 150 into the chucking module 116 negligible. In one example, the blocking resistor has a resistance of more than about 500 kOhm. The resultant average induced current of the order of 0.5-1 mA is indeed much smaller than a typical limitation for chucking module power supplies, which is about 5 mA DC current. The components of the bias compensation circuit elements 116A, which include a capacitance 155B, a diode 155C, a resistor 155A, and the blocking resistor 154, together form a current suppressing/filtering circuit for the pulsed voltage, so that pulsed voltage does not induce current through the chucking module 116. The blocking resistor 154 is disposed between the DC power supply 155 and the output 350 and/or the generator output coupling assembly 181 (FIG. 1C). In some embodiments, the diode 155C is connected in parallel with the blocking resistor 154, wherein the diode 155C is oriented such that the anode side of the diode 155C is connected to the PV transmission line 157.

The second filter assembly 151 includes one or more electrical elements that are configured to prevent a current generated by the output of the RF generator 118 from flowing through PV transmission line 157 and damaging the PV pulse generator 314 of the PV waveform generator 150. As discussed above, the PV transmission line 157 is an assembly that includes the coaxial transmission line 106 and transmission line 131. In one embodiment, the second filter assembly 151 includes a filter capacitor 151A, which has a capacitance $C_{FC}$, and a filter inductor 151B, which has an inductance $L_{FL}$, that are connected in parallel, and are disposed in the transmission line 157 between the PV pulse generator 314 and the biasing electrode 104. In some configurations, the second filter assembly 151 is disposed between the blocking capacitor 153 of the chucking module 116 and the biasing electrode 104. The second filter assembly 151 acts as a high impedance (e.g., high Z) to the RF signal generated from the RF generator 118, and thus inhibits the flow of current to the PV pulse generator 314. In some embodiments, the capacitance $C_{FC}$ of the filter capacitor 151A is significantly less than the capacitance of the blocking capacitor 153, such as at least one order of magnitude, or at least two orders of magnitude, or three orders of magnitude less than the capacitance of the blocking capacitor 153. In one example, the capacitance $C_{FC}$ of the filter capacitor 151A is about 51 pF and the capacitance of the blocking capacitor 153 is about 40 nF.

As discussed above, the second filter assembly 151 is configured to block the RF signal, and any associated harmonics from making their way to the PV pulse generator 314. In some embodiments, the RF signal generated by the RF generator is configured to deliver an RF frequency greater than 400 kHz, such an RF frequency MHz, or MHz, or 3.56 MHz, or ≥40 MHz. In some embodiments, to prevent RF power provided from the RF generator 118 from damaging the PV pulse generator 314 the second filter assembly 151 includes a filter capacitor 151A that has a capacitance in a range between about 25 pF and 100 pF and a filter inductor 151B that has an inductance in a range between about 0.1 and 1 µH. In one example, to prevent RF power provided from the RF generator 118 at a frequency of 40 MHz from damaging the PV pulse generator 314 the second filter assembly 151 includes a filter capacitor 151A that has a capacitance of about 51 pF and a filter inductor 151B that has an inductance of about 311 nH. In some embodiments, the blocking capacitor $C_{BC}$ of the first filter assembly 162 has a capacitance value that is within one order of magnitude of the capacitance value of the filter capacitor 151A of the second filter assembly 151.

In some embodiments, as shown in FIGS. 3A-3B, the second filter assembly 151 further includes a second filter inductor 151C, which has an inductance $L_2$, and a second filter capacitor 151E, which has a capacitance $C_2$, that are coupled between the transmission line 157 and ground, and also a third filter inductor 151D, which has an inductance $L_3$, and a third filter capacitor 151F, which has a capacitance $C_3$, that are also coupled between the transmission line 157 and ground. In some configurations, the second filter inductor 151C and third filter inductor 151D may have an inductance between about 0.1 and 1 µH, and the second filter capacitor 151E and third filter capacitor 151F have a capacitance between about 25 pF and 100 pF.

Pulse Waveform Examples

Figure 4B:
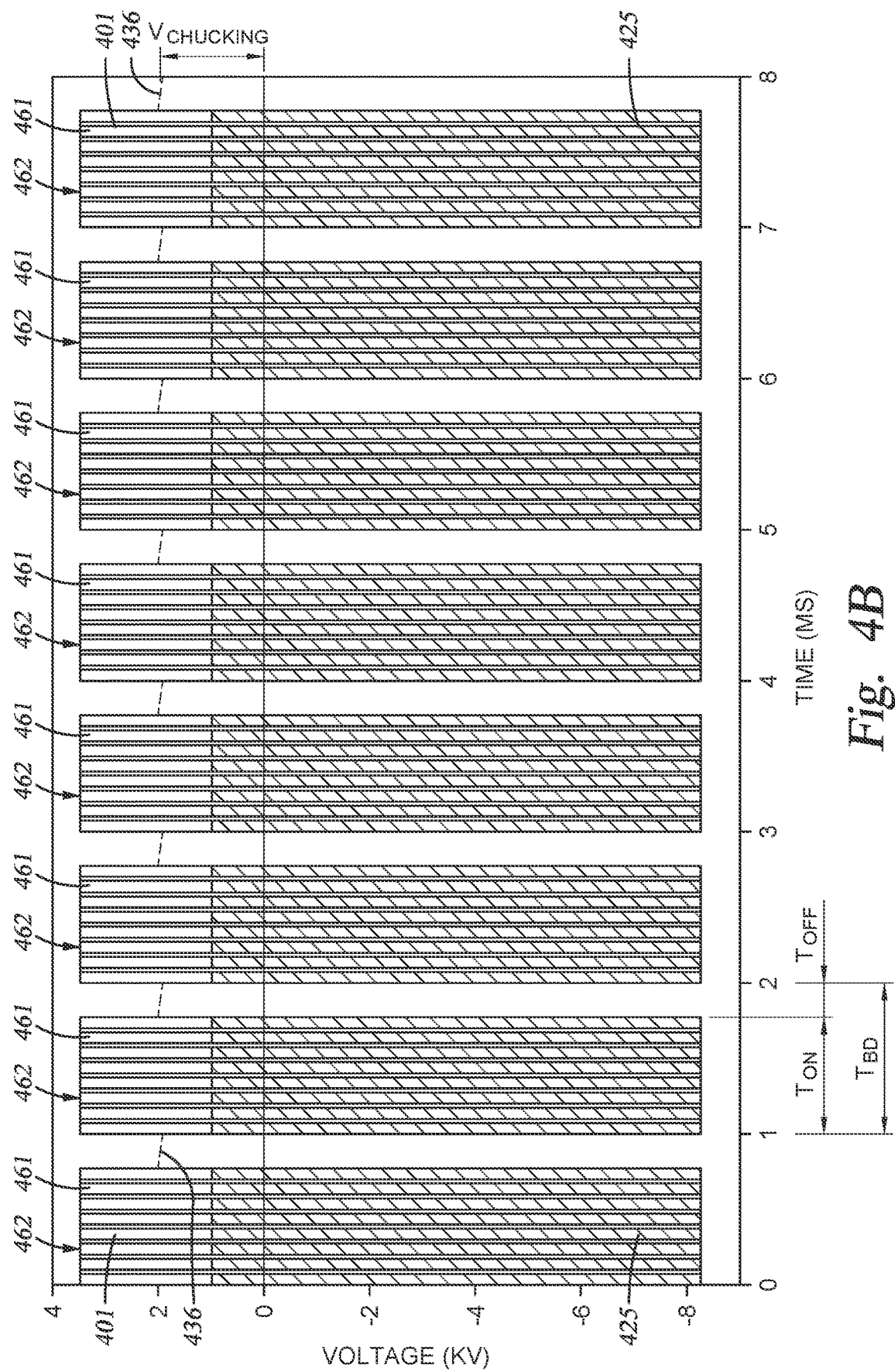
FIG. 4B illustrates an example of a series of pulse voltage (PV) waveform bursts, according to one or more embodiments.
Figure 4C:
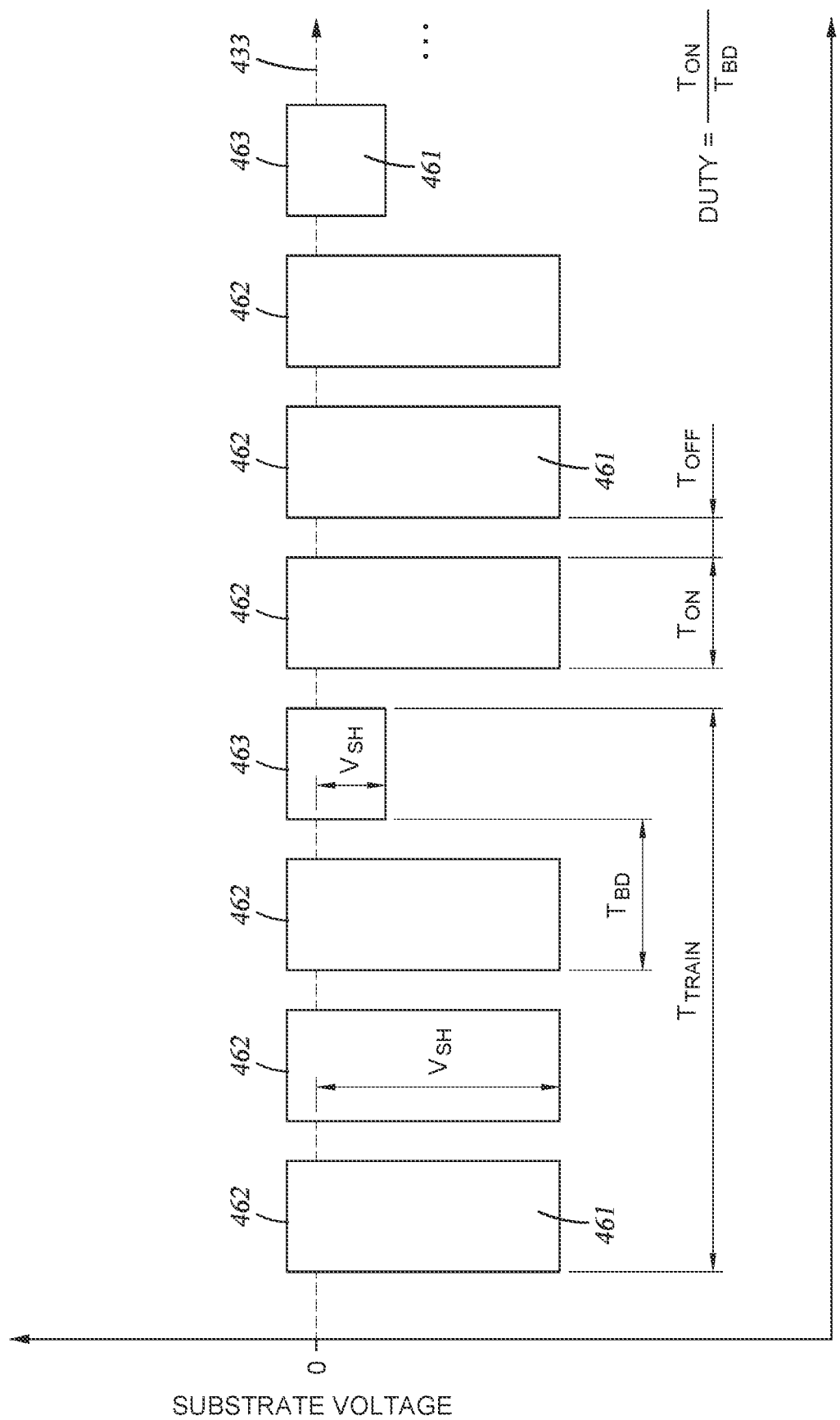
FIG. 4C illustrates an example of a series of pulse voltage (PV) waveform bursts, according to one or more embodiments.
Figure 4D:
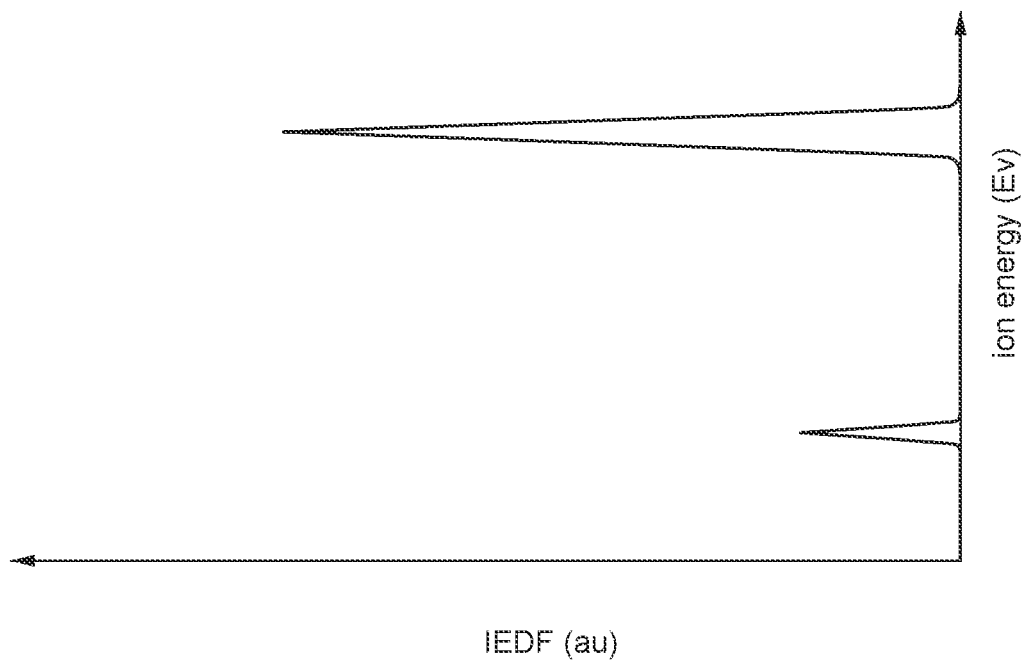
FIG. 4D illustrates an example of an ion energy distribution function (IEDF) formed by a series of pulse voltage (PV) waveform bursts, according to one or more embodiments.

As noted above, embodiments of the disclosure provide novel substrate biasing methods that enable the maintaining of a nearly constant sheath voltage during processing, and thus creating a desired IEDF at the surface of the substrate, while also providing the ability to separately control aspects of the plasma formed in the processing volume of the plasma processing chamber by use of one or more RF source assemblies. In some embodiments, by use of the novel substrate biasing apparatus and methods disclosed herein, a single-peak (mono-energetic) IEDF can be formed at the surface of the substrate during processing. In other embodiments, as illustrated in FIG. 4D, a two-peak (bi-energetic) IEDF is formed at the surface of the substrate during processing by use of one or more of the novel substrate biasing apparatus and methods disclosed herein. In some apparatus configuration(s) disclosed herein, such as illustrated in FIG. 1A, also allow for the area of the grounded surface within the plasma processing chamber to be maximized and thus minimize the power losses to chamber walls and improve the plasma processing efficiency.

Figure 5B:
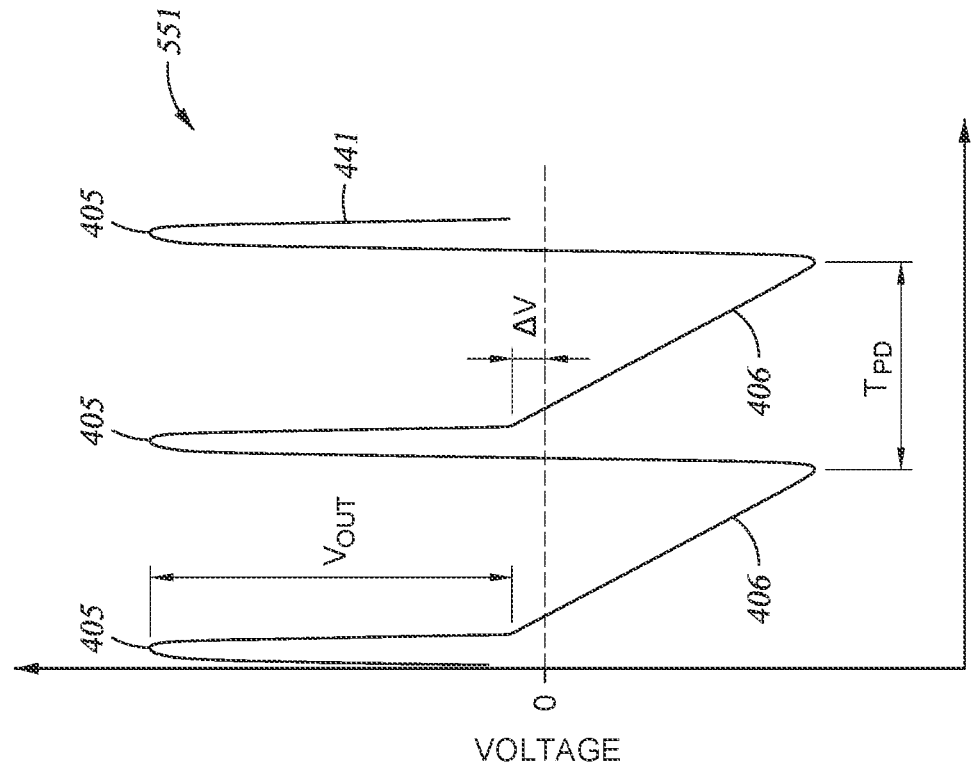
FIG. 5B illustrates an example of a shaped pulsed voltage (PV) waveform established at the biasing electrode, according to one embodiment.

As is discussed further below in relation to FIGS. 4A-4C and 5A-5C, the novel substrate biasing methods, which enable the maintaining of a nearly constant sheath voltage during plasma processing, include the delivery of a series of pulses and/or bursts of pulses during a plasma processing sequence performed on a substrate during a plasma process performed in the plasma processing chamber. Embodiments of the disclosure provided herein include the delivery of pulses that have a desired pulsed-voltage waveform (PVWF), which each include multiple different phases. As is discussed further below, each PV waveform includes at least one phase of the multiple phases that are controlled by the delivery of a voltage signal, or in some cases a constant current signal, provided from the PV waveform generator 150. Generally, for discussion purposes, each pulse of a PV waveform can be segmented into two main regions, which include a first region 405 and a second region 406, as illustrated in FIGS. 5A-5C. In general, each PV waveform will include an amplitude ($V_{out}$), offset (e.g., ΔV), a pulse period ($T_P$), and a pulse repetition frequency ($f_P=1/T_P$).

FIG. 4A illustrates a negative-pulse biasing scheme type of PV waveform that can be established at the biasing electrode 104 and/or edge control electrode 115 by use of a PV waveform generator 150 within a PV source assembly. In some embodiments, the PV waveform illustrated in FIG. 4A is separately established at the biasing electrode 104 and edge control electrode 115 by use of the PV waveform generator 150 of a first PV source assembly 196 and the PV waveform generator 150 of a second PV source assembly 197, respectively. FIG. 5A illustrates a negative-pulse biasing scheme type of pulsed voltage waveform in which the PV waveform generators 150 is configured to control the generation of a series 550 of multiphase negative pulse waveforms 401 to establish the PV waveform at the biasing electrode 104 or edge control electrode 115. In some embodiments, the multiphase negative pulse waveforms 401 includes a series of repeating cycles, such that a waveform within each cycle has a first portion that occurs during a first time interval and a second portion that occurs during a second time interval. The multiphase negative pulse waveforms 401 will also include a positive voltage-pulse that is only present during at least a portion of the first time interval, and the pulsed voltage waveform is substantially constant during at least a portion of the second time interval. An output of the PV waveform generator 150 is connected to a negative voltage supply for at least a portion of the second time interval.

The substrate PV waveform 425, as shown in FIG. 4A, is a series of PV waveforms established at the substrate due to the established PV waveform formed at the biasing electrode 104 or edge control electrode 115 by a PV waveform generator 150. The substrate PV waveform 425 is established at the surface of a substrate during processing, and includes a sheath collapse and ESC recharging phase 450 (or for simplicity of discussion the sheath collapse phase 450) that extends between point 420 and point 421 of the illustrative substrate PV waveform 425, a sheath formation phase 451 that extends between point 421 and point 422, and an ion current phase 452 that extends between point 422 and back to the start at point 420 of the next sequentially established pulse voltage waveform. The plasma potential curve 433, as shown in FIGS. 4A-4C, illustrates the local plasma potential during the delivery of the negative pulse waveforms 401 that are established at the biasing electrode 104 and/or edge control electrode 115 by use of one or more PV waveform generators 150.

In some embodiments, during processing in the processing chamber 100, a multiphase negative pulse waveform 401 is formed when a PV waveform generator 150 supplies and controls the delivery of a negative voltage during two of the phases of the established multiphase negative pulse waveform 401, such as the portions of the PV waveform that trend in a negative direction and/or are maintained at a negative voltage level (e.g., ion current phase). For example, these negative voltage-containing portions of the negative pulse waveform 401 would, by analogy, relate to the sheath formation phase 451 and the ion current phase 452 illustrated in FIG. 4A for the substrate PV waveform 425. In this case, for a multiphase negative pulse waveform 401, the delivery of a negative voltage from a PV waveform generator 150 occurs during the second phase 406, which extends from or between the point 411 (i.e., peak of multiphase negative pulse waveform 401) and the start of the sheath collapse phase 450 of the substrate PV waveform that coincides with point 413, as shown in FIG. 4A. In some embodiments, during the ion current phase 452, which coincides with the portion of the established multiphase negative pulse waveform 401 that is between points 412 and 413, the PV waveform generator 150 is configured to provide a constant negative voltage (e.g., $V_{OUT}$). Due to, for example, the ion current ($I_i$) depositing positive charge on the substrate surface during the ion current phase 452, the voltage at the substrate surface will increase over time, as seen by the positive slope of the line between points 422 and 420 (FIG. 4A). The voltage increase over time at the substrate surface will reduce the sheath voltage and result in a spread of the ion energy. Therefore, it is desirable to control and set at least the PV waveform frequency ($1/T_{PD}$, where $T_{PD}$ is PV waveform period (FIG. 5A)) to minimize the effects of the reduction in the sheath voltage and spread of the ion energy.

FIG. 5B illustrates a shaped-pulse biasing scheme type of PV waveform in which the PV waveform generator 150 is configured to control the generation of a series 551 of multiphase shaped pulse waveforms 441 that are established at the biasing electrode 104 and/or edge control electrode 115. In some embodiments, the multiphase shaped pulse waveform 441 is formed by a PV waveform generator 150 that is configured to supply a positive voltage during one or more phases of a voltage pulse (e.g., first region 405) and a negative voltage during one or more phases of the voltage pulse (e.g., second region 406) by use of one or more internal switches and DC power supplies.

In some embodiments, as illustrated in FIG. 5C, the PV waveform generator 150 is configured to provide a series 552 of multiphase positive pulse waveforms 431 to the biasing electrode 104 and edge control electrode 115. Each positive pulse in the positive pulse waveform 431 can include multiple phases, such as a sheath collapse phase, ESC recharging phase, a sheath formation phase and an ion current phase. In this example, the first region 405 generally includes the sheath collapse phase and ESC recharging phase. The second region 406 generally includes the sheath formation phase and the ion current phase. In some embodiments, the multiphase positive pulse waveforms 431 includes a series of repeating cycles, such that a waveform within each cycle has a first portion that occurs during a first time interval and a second portion that occurs during a second time interval. The multiphase positive pulse waveforms 431 will also include a positive voltage-pulse that is only present during at least a portion of the first time interval, and the multiphase positive pulse waveforms 431 is substantially constant during at least a portion of the second time interval. An output of the PV waveform generator 150 is connected to a positive voltage supply for at least a portion of a first time interval.

The various pulse voltage waveforms 401, 441 and 431 illustrated in FIGS. 5A, 5B and 5C, respectively, are representative of pulse voltage waveforms that are provided to the input of the chucking module 116, and thus may differ from the pulse voltage waveforms that is established at the biasing electrode 104 and edge control electrode 115 as illustrated in FIG. 4A. The DC offset $\Delta V$ found in each PV waveform is dependent on various properties of the PV waveform generator 150 configuration used to establish the PV waveform.

FIG. 4B illustrates a processing method in which a series of bursts 462 of pulsed voltage waveforms are established at the biasing electrode 104 and/or edge control electrode 115 and established at the substrate surface. In the example illustrated in FIG. 4B, a plurality of pulses 461 within each burst 462 include a series of negative pulse waveforms 401 that are established at the biasing electrode 104 and/or edge control electrode 115. In this example, each of the bursts 462 include pulses 461 that have a PV waveform that has a consistent pulsed voltage shape (e.g., constant voltage magnitude is provided during a portion of each PV waveform 401), a burst delivery length $T_{ON}$ that does not vary from one burst 462 to another over time and a burst rest length $T_{OFF}$ that does not have a varying length over time. The burst rest length $T_{OFF}$ is formed by halting the delivery of the PV waveforms provided during the burst delivery length $T_{ON}$ time for a period of time. The duty cycle of the bursts 462, which is the ratio of the length of time the plurality of pulses are delivered during the burst (i.e., burst delivery length $T_{ON}$) divided by the duration of a burst period (i.e., $T_{BD}=T_{ON}+T_{OFF}$), is also constant in this example. One will appreciate that in other processing methods, the plurality of pulses 461 could include negative pulse waveforms 401, shaped pulse waveforms 441 or positive pulse waveforms 431, or combinations thereof. As illustrated in FIG. 4B, during the burst rest length $T_{OFF}$ the biasing electrode potential curve 436 is primarily controlled by the chucking voltage that is applied and controlled by the chucking module 116, and thus may be at a different voltage level than the plasma potential.

FIG. 4C illustrates a processing method in which a plurality of differently configured bursts of pulses, such as bursts 462 and bursts 463, are established at the biasing electrode 104 and/or edge control electrode 115 and established at the substrate surface. FIG. 4D illustrates an effect created by the performance of the processing method illustrated in FIG. 4C on a plot of the IEDF during plasma processing. It is believed that by controlling the delivery of a plurality of differently configured bursts within a repeating cycle it is possible to control the distribution of ion energies such that the IEDF will include two or more discrete IEDF peaks, such as the two discrete IEDF peaks illustrated in FIG. 4D are formed by the performance of the processing method illustrated in FIG. 4C. By way of contrast, in conventional plasma processes that utilize an RF biasing scheme, the IEDF typically has two peaks, which are formed at a low and a high energy and some ion population that has energies that are in between the two peaks, and thus will not desirably form discrete IEDF peaks. An example of a conventionally formed IEDF curve is illustrated in FIG. 1B of U.S. Pat. No. 10,555,412, which is herein incorporated by reference in its entirety. In these conventional biasing schemes, an applied RF voltage (having a waveform such as the one shown in FIG. 6A) modulates the cathode sheath throughout the entire RF period, thus unduly varying the sheath voltage drop all of the time and resulting in a dual-peak IEDF. As discussed above, the range of ion energies extending between the two IEDF peaks (i.e., formation non-discrete IEDF peaks) formed during a conventional process will affect the profile of the etched feature walls formed within the surface of the substrate during plasma processing.

In some embodiments of the method illustrated in FIG. 4C, the plurality of differently configured bursts include a repeating cycle of the differently configured bursts that have a repeating cycle length (Main). Each of the bursts 462 and bursts 463 include a plurality of pulses 461 that can include negative pulse waveforms 401, shaped pulse waveforms 441 or positive pulse waveforms 431, or combinations thereof. In some embodiments, the plurality of differently configured bursts includes at least two differently configured bursts, such that at least the characteristics of the plurality pulses 461 formed during at least two of the bursts within the plurality of differently configured bursts have different characteristics. In one example, as illustrated in FIG. 4C, the characteristics of the plurality pulses 461 with the bursts 462 have a different pulse voltage magnitude (e.g., different $V_{OUT}$) than the plurality pulses 461 with the bursts 463, and thus are able to form the two IEDF peaks (FIG. 4D) that have different peak heights. In some embodiments, the pulses 461 have a pulse voltage magnitude ($V_{OUT}$) of between about 1 kilovolt (kV) and about 10 kV. In some embodiments, the characteristics of the plurality pulses 461 that are different between at least two of the bursts within the repeating cycle include differing individual PV waveform periods, different pulse voltage magnitudes, different shapes of at least a portion of the PV waveform within the first region 405 and a second region 406 (e.g., voltage magnitude, slope (dV/dt)), or other PV waveform characteristics. Each of the bursts 462 and 463 have a burst period that includes the burst delivery length $T_{ON}$ and burst rest length $T_{OFF}$. Further, the burst period $T_{BD}$ and the burst duty cycle (e.g., $T_{ON}/T_{BD}$) are based on the burst delivery length $T_{ON}$ and the burst period $T_{BD}$. In some embodiments, the burst delivery length $T_{ON}$ is between about 50 µs and about 50 milliseconds (ms), such as between about 200 µs and about 5 ms, and the burst duty cycle is between about 5%-100%, such as between about 50% and about 95%. In one example, the burst delivery length $T_{ON}$ is about 800 µs, and the burst duty cycle is about 80% for both of the bursts 462 and bursts 463. More specifically, FIG. 4C includes an example of multiple bursts (each containing a plurality of waveform cycles) of an input pulsed voltage waveform originating from the generator end of a generator output coupling assembly 181 positioned at the output of the PV waveform generator 150 that is provided to the biasing electrode 104 of the substrate support assembly 136. The plurality of differently configured bursts can be characterized as having differently configured offsets ($\Delta V$), burst periods ($T_{BD}$), burst frequencies ($f_B=1/T_{BD}$), and/or burst duty cycles (Duty=$T_{on}/T_{BD}$). Therefore, by altering the characteristics of the plurality of pulses 461 between two or more of the differently configured bursts, two or more discrete IEDF peaks can be formed to adjust or alter the plasma processing results achieved on a substrate during processing.

Figure 5D:
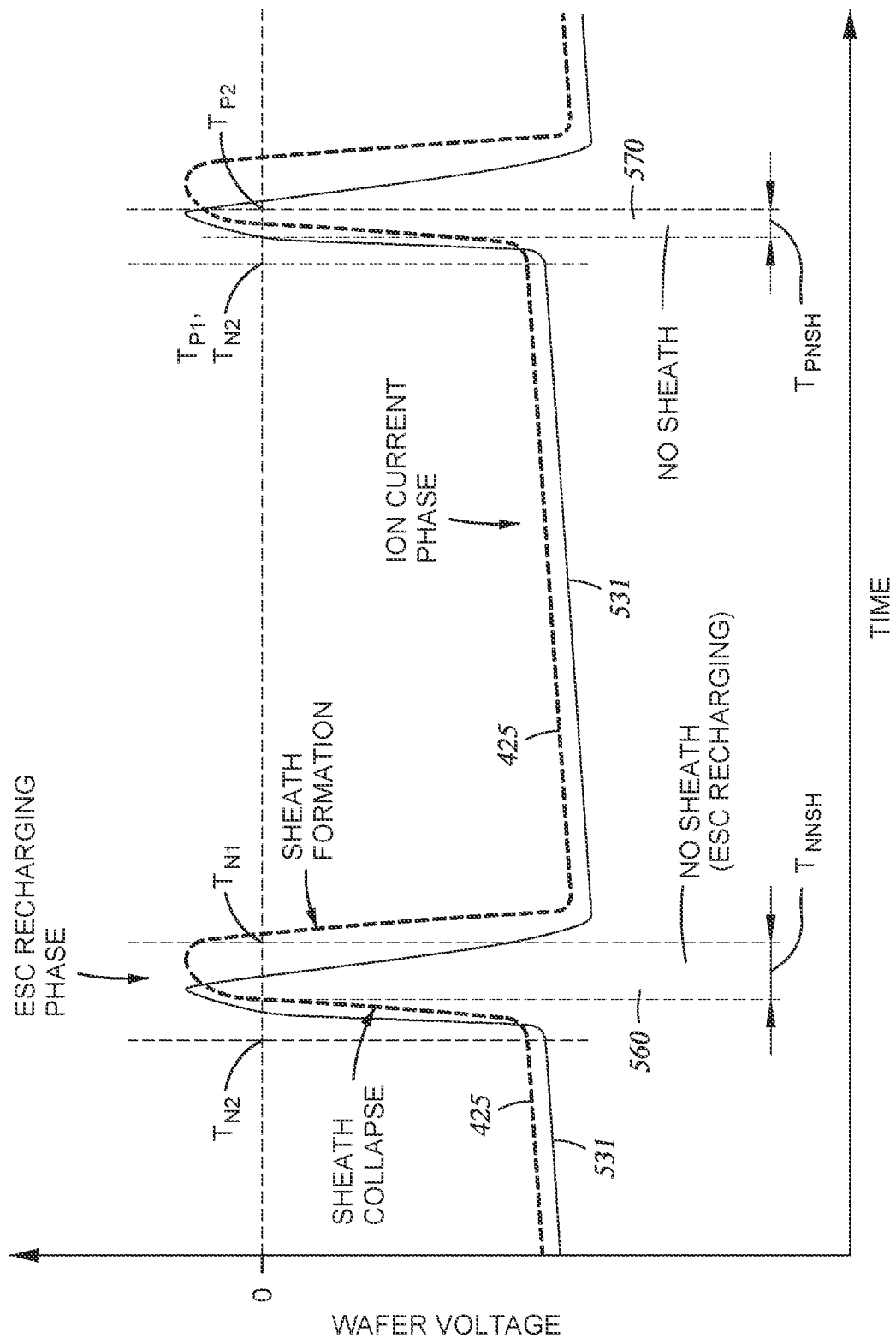
FIG. 5D illustrates a comparison of a negative pulsed voltage (PV) waveform and a positive pulsed voltage (PV) waveform established at a substrate during processing, according to one embodiment.

FIG. 5D illustrates a series of PV waveforms formed at a substrate during processing by establishing a positive pulse waveforms 431 (not shown) or a negative pulse waveforms 401 (not shown) at a biasing electrode 104 and/or edge control electrode 115 by use of one or more PV waveform generators 150. The PV waveforms formed at the substrate include the substrate PV waveforms 425 formed by the establishment of the negative pulse waveforms 401, or substrate PV waveforms 531 formed by the establishment of the positive pulse waveforms 431. In some embodiments, the negative pulse waveforms 401 is formed by establishing a negative voltage at the biasing electrode 104 and/or edge control electrode 115 between time $T_{N1}$ and time $T_{N2}$. In some embodiments, the negative voltage provided at the output 350 of the PV waveform generator(s) 150, which is provided to the biasing electrode 104 and/or edge control electrode 115, is substantially constant during at least a portion of the second region 406 of the negative pulse waveforms 401. In one example, the negative voltage provided at the output 350 of the PV waveform generator(s) 150 is substantially constant for the entire second region 406 except for any switching related voltage oscillations or transitions found at the start and/or end of second region 406. Referring to FIG. 3B, the negative voltage is provided by causing switch $S_1$ to close and remain closed during the time period between time $T_{N1}$ and time $T_{N2}$, and cause switch $S_2$ open and remain open during this same time period. During the other time period that starts at time $T_{N2}$ and ends at time $T_{N1}$, switch $S_1$ will open and remain open and switch $S_2$ will close and remain closed.

In some embodiments, the positive pulse waveforms 431 is formed by establishing a positive voltage at the biasing electrode 104 and/or edge control electrode 115 between time $T_{P1}$ and time $T_{P2}$. Referring to FIG. 3A, the positive voltage is provided by causing switch $S_1$ to close and remain closed during the time period between time $T_{P1}$ and time $T_{P2}$, and cause switch $S_2$ open and remain open during this same time period. During the other time period that starts at time $T_{P2}$ and ends at time $T_{P1}$, switch $S_1$ will open and remain open and switch $S_2$ will close and remain closed. In some embodiments, the positive voltage provided at the output 350 of the PV waveform generator(s) 150, which is provided to the biasing electrode 104 and/or edge control electrode 115, is substantially constant during at least a portion of the first region 405 of the positive pulse waveforms 431.

As shown in FIG. 5D, the process of establishing the negative pulse waveforms 401 or positive pulse waveforms 431 at the biasing electrode 104 and/edge control electrode 115 will form substrate PV waveforms 425 or substrate PV waveforms 531, respectively, that can have differing waveform characteristics. In one example, it is desirable to form substrate PV waveforms 425 that include a longer time period ($T_{NNSH}$) of the waveform cycle where no sheath exists (i.e., formed during ESC recharging phase 560) when using a negative pulsing process, versus forming substrate PV waveforms 531 that include a shorter time period ($T_{PNSH}$) of the waveform cycle where no sheath exists (i.e., formed during ESC recharging phase 570) during a positive pulsing process. In this example, the time period $T_{NNSH}$ where no sheath exists during a negative PV waveform can be about 175 nanoseconds (ns) versus the time period $T_{PNSH}$ where no sheath exists during a positive PV waveform can be about 80 ns.

In either of the processes of establishing pulsed voltage waveforms, such as establishing negative pulse waveforms 401, shaped pulse waveforms 441 or positive pulse waveforms 431, at the biasing electrode 104 and/edge control electrode 115, can enable keeping the sheath voltage nearly constant for a large percentage (e.g., 85%-90%) of the substrate processing time during a plasma process. The waveforms illustrated in FIGS. 4A-5D are only intended to show a simplified schematic representations of a pulsed voltage waveform that can be used with one of the methods described herein, which can be used during plasma processing of a substrate. The actual waveforms generated by the PV waveform generators 150 can be significantly more complex and contain a number of fine-scale features (e.g., high-frequency oscillations caused by the presence of inductive elements) that are not shown in FIGS. 3A-3B. However, these fine-scale features are not essential for understanding of the underlying physical phenomena determining the general shape of the actual pulsed voltage waveform produced by the pulsed voltage biasing scheme and control methods proposed herein.

Pulsed Voltage Waveform Phases

In general, the pulsed voltage waveforms such as establishing negative pulse waveforms 401, shaped pulse waveforms 441 or positive pulse waveforms 431, comprises a periodic series of short pulses repeating with a period $T_{PD}$, on top of a voltage offset (ΔV). In one example, the period $T_{PD}$ can be between about 1 µs and about 5 µs, such as about 2.5 µs. A waveform within each period (repetition cycle) includes the following:

(1) A sheath collapse phase, during which the sheath capacitor $C_{sh}$ (FIGS. 3A-3B) is discharged and the substrate potential is brought to the level of the local plasma potential (e.g., plasma potential curve 433 in FIG. 4A). The sheath collapse phase enables rapid recharging of the chuck capacitor $C_E$ by electrons provided from the plasma during the ESC recharging phase (2).

(2) Recharging of the chuck capacitor $C_E$, during the ESC recharging phase, by rapidly injecting or accumulating an amount of charge of opposite polarity to the total charge accumulated on the substrate surface during the latter performed ion current phase. The plasma current during this phase is also carried by electrons, namely, in the absence of the cathode sheath, the electrons reach the substrate and build up the surface charge, thus charging the capacitor $C_E$.

(3) A negative voltage jump to discharge the processing chamber's stray capacitor, re-form the sheath and set the value of the sheath voltage ($V_{SH}$) during the sheath formation phase. The beginning of sheath formation (charging of $C_{sh}$) can be clearly identified as the point, at which the substrate potential starts decreasing below the local plasma potential.

(4) A generally long (e.g., >50%, such as about 80-90% of the PV waveform cycle duration T) ion current phase, during which the ion current causes accumulation of positive charge on the substrate surface and gradually discharges the sheath and chuck capacitors, slowly decreasing the sheath voltage drop and bringing the substrate potential closer to zero. This results in the voltage droop in the substrate voltage waveforms 425 (FIG. 4A) and 531 (FIG. 5D). The generated sheath voltage droop is a reason why the pulse waveform(s) needs to move to the next cycle described in (1)-(3) above.

As discussed above, in some embodiments, the processing chamber 100 will at least include one or more RF generators 118, and their associated first filter assembly 162, and one or more PV generators 314, and their associated second filter assembly 151, that are together configured deliver desired waveforms to one or more electrodes disposed within the substrate support assembly 136. The software instruction stored in memory of the controller 126 are configured to cause the generation of an RF waveform that is configured to establish, maintain and control one or more aspects of a plasma formed within the processing chamber. The one or more aspects of the plasma that are controlled can include, but are not limited to, plasma density, plasma chemistry, and ion energy in the plasma formed in the processing volume 129.

Figures 6A, 6B:
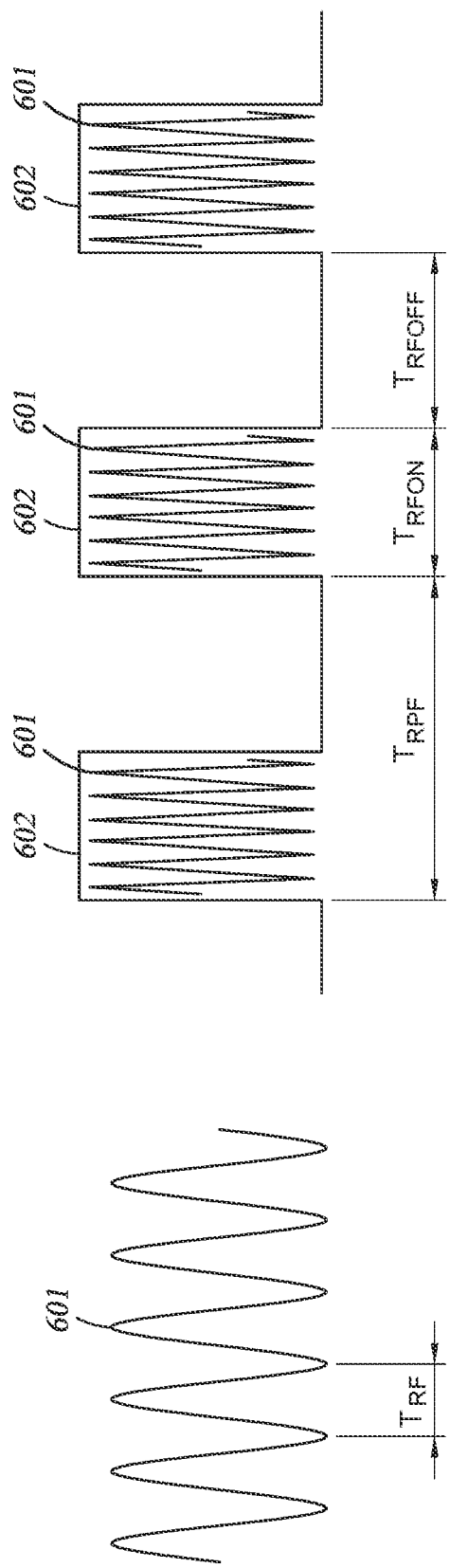
FIG. 6A illustrates an example of a radio frequency (RF) waveform, according to one embodiment.
FIG. 6B illustrates an example of a pulsed radio frequency (RF) waveform, according to one embodiment.

FIG. 6A illustrates a typical sinusoidal RF waveform 601 that has frequency (i.e., $1/T_{RF}$) that is provided from the RF generator 118. Typically, the one or more aspects of the plasma can be controlled by selecting a desired RF frequency and amount of RF power, and, in some cases, the duty cycle of a pulsed RF signal (i.e., the percentage of time that the sinusoidal RF signal is "on" ($T_{RFON}$) versus the percentage of time the sinusoidal RF signal is "off" ($T_{RFOFF}$)). The selection of a desired RF frequency is generally performed by selecting an RF generator (e.g., 2 MHz, 13.56 MHz, or 40 MHz RF generator) that is configured to provide a varying amount of RF power at one or more frequencies within a selected narrow RF frequency range.

FIG. 6B illustrates a pulsed RF waveform 602 that can provided from the RF generator 118 during a plasma process. The formed the pulsed RF waveform 602 can have a RF pulse period $T_{RFP}$ within the RF pulsed RF sequence, and "on" and "off" times (i.e., $T_{RFON}$ and $T_{RFOFF}$ respectively) within which the sinusoidal RF waveform 601 is provided or not provided by the RF generator 118.

Figure 6C:
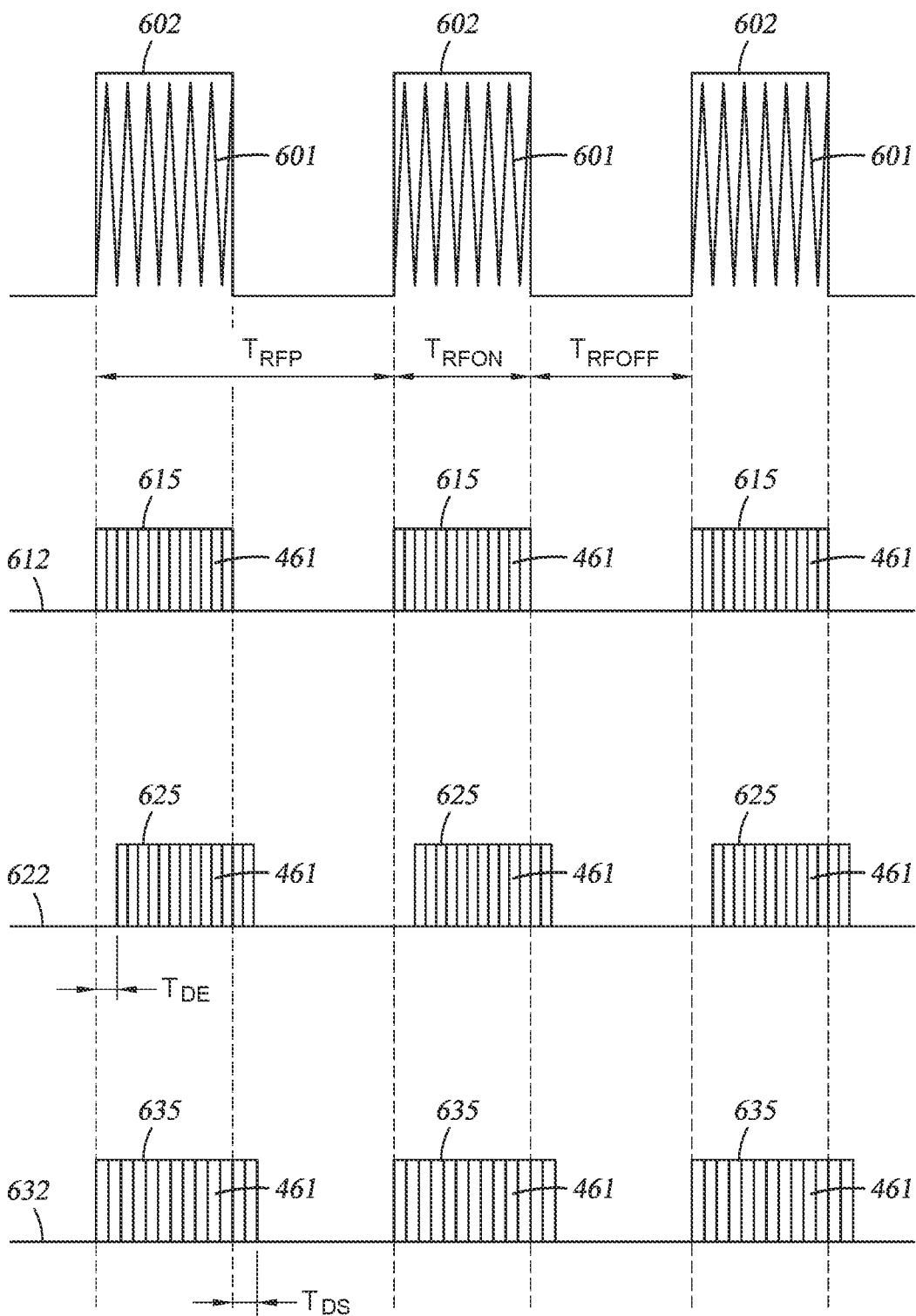
FIG. 6C illustrates an example of a radio frequency (RF) waveform and pulsed voltage (PV) waveforms that can provided to one or more electrodes, according to one or more embodiments.

FIG. 6C illustrates a method in which a pulsed RF waveform 602 provided from the RF generator 118 is synchronized with a series of bursts 612, 622 or 632 provided to the biasing electrode 104 and/or edge control electrode 115 by use of one or more PV waveform generators 150 and the controller 126. While the bursts 615, 625, 635 within each series of bursts 612, 622, 632, as shown in FIG. 6C, includes a single consistent type of burst (i.e., pulses 461 have the same pulse characteristics), it is contemplated that the bursts within each series of bursts generated by the one or more PV waveform generators 150 could include differently configured bursts, such as bursts 462, 463 of FIG. 4C. Similarly, in some embodiments, the RF pulses within the RF waveform 602 may include a series of differently configured RF pulses. The bursts 615, 625 or 635 each include a plurality of pulses 461 that can include negative pulse waveforms 401, shaped pulse waveforms 441 or positive pulse waveforms 431, or combinations thereof that can be established at either or both the biasing electrode 104 and edge control electrode 115.

In one example, during processing a series of bursts 612 that include a plurality of bursts 615 are provided to the biasing electrode 104 and/or edge control electrode 115 and are synchronized with delivery of the pulsed RF waveform 602. In this example, each of the plurality of bursts 615 have the same burst delivery length, burst rest length, and burst period as the RF pulse delivery length $T_{RFON}$, RF pulse rest length $T_{RFOFF}$ and RF pulse period $T_{RFP}$ of the RF pulses within the pulsed RF waveform 602.

In another example, during processing a series of bursts 622, which include a plurality of bursts 625 are provided to the biasing electrode 104 and/or edge control electrode 115 and are synchronized with the delivery of pulsed RF waveform 602. In this example, each of the plurality of bursts 625 have the same burst delivery length, burst rest length, and burst period as the RF pulse delivery length $T_{RFON}$, RF pulse rest length $T_{RFOFF}$ and RF pulse period $T_{RFP}$ of the RF pulses within the pulsed RF waveform 602. However, in this example, a delay period $T_{DE}$ is provided such that the start of each burst 625 occurs at a time after at least a portion of each of the RF pulse within the pulsed RF waveform 602 are delivered, which is also referred to herein as a positive delay period. It may also or alternately be desirable to delay the delivery of the RF pulse relative to the delivery of the bursts 625 such that the delivery of the RF pulses occurs after at least a portion of the bursts 625 are delivered (i.e., negative delay period).

In another example, during processing a series of bursts 632, which include a plurality of bursts 635 are provided to the biasing electrode 104 and/or edge control electrode 115 and synchronized with delivery of pulsed RF waveform 602. In this example, each of the plurality of bursts 635 have the same burst period as the RF pulses within the pulsed RF waveform 602. However, in this example the burst delivery length and burst rest length are different from the RF pulses within the pulsed RF waveform 602. As illustrated in FIG. 6C, the burst delivery length of each burst 635 is longer than the RF pulse delivery length $T_{RFON}$ by period of time TDS. In this case, the duty cycles between the delivery of the bursts 635 and pulsed RF waveform 602 are different.

While the series of bursts 612, 622, 632 illustrated in FIG. 6C each include constant burst delivery length and duty cycle it is contemplated that the burst delivery length and/or duty cycle in a series of bursts could vary over time. Also, while the series of bursts 622 illustrated in FIG. 6C each include constant a delay period $T_{DE}$ it is contemplated that the delay period in a series of bursts could vary over time. Also, while the series of bursts 632 illustrated in FIG. 6C each include constant a burst delivery length and constant delay period it is contemplated that the burst delivery length in a series of bursts could vary over time and/or it may be desirable to delay the delivery of the RF pulses relative to the delivery of the bursts 625.

Figure 6D:
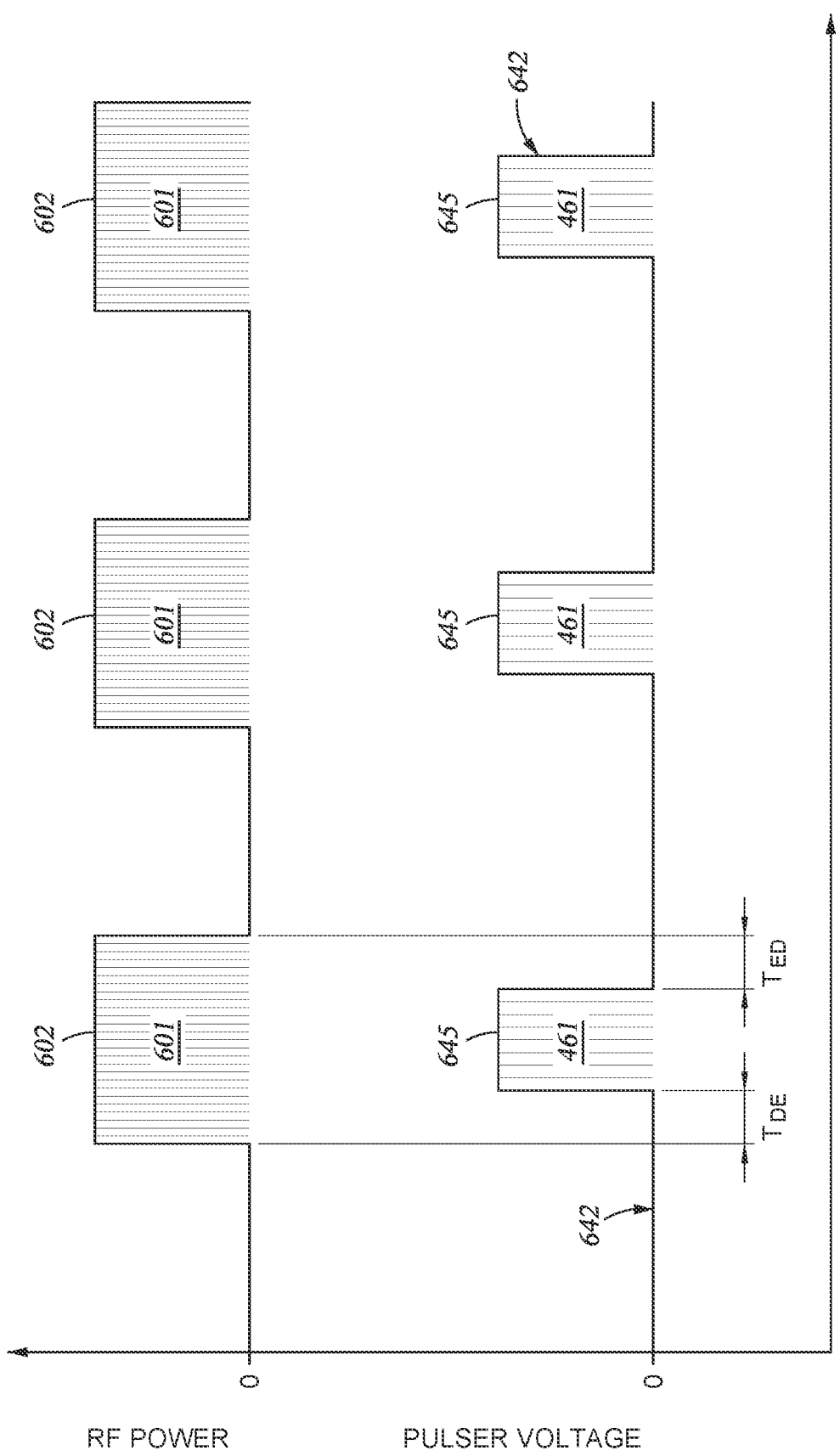

In another example, as illustrated in FIG. 6D, during processing a series of bursts 642, which include a plurality of bursts 645 are provided to the biasing electrode 104 and/or edge control electrode 115 and are synchronized with the delivery of pulsed RF waveform 602. In this example, each of the plurality of bursts 645 have a different burst delivery length, burst rest length, and burst period from the RF pulse delivery length $T_{RFON}$, and RF pulse rest length $T_{RFOFF}$ of the RF pulses within the pulsed RF waveform 602. In this example, a start delay period $T_{DE}$ is provided such that the start of each burst 645 occurs at a time after at least a portion of each of the RF pulse within the pulsed RF waveform 602 are delivered, and also an end delay period TED is provided such that the end of each burst 645 occurs before the RF pulse period $T_{RFP}$ ends. In this example, the duty cycle of each burst 645 is less than the RF pulse.

Figure 6E:
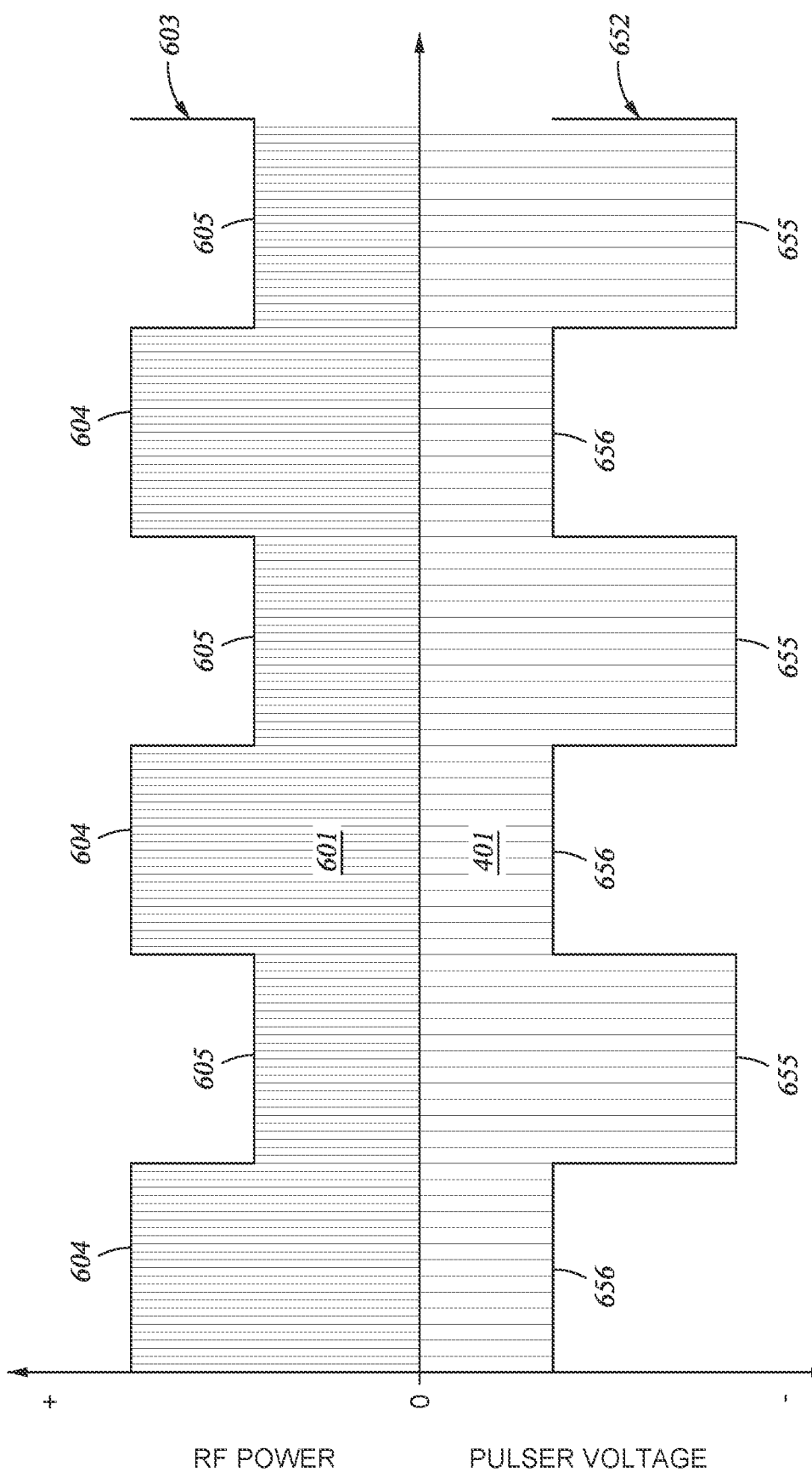

In another example, as illustrated in FIG. 6E, during processing a series of bursts 652, which include a plurality of bursts 655 and 656 are provided to the biasing electrode 104 and/or edge control electrode 115 and are synchronized with the delivery of a multi-level pulsed RF waveform 603. The multi-level pulsed RF waveform 603 includes a plurality of RF pulse power levels 604 and 605 that are formed by the delivery of sinusoidal RF waveform 601 at different power levels by use of an RF generator. In this example, each of the plurality of bursts 655 and 656 are synchronized with the changes in the RF pulse power levels 604 and 605. Each of the plurality of bursts 655 and 656 include a plurality of negative pulse waveforms 401 that are supplied at different voltage levels as illustrated by the difference in the negative levels of each of the applied voltage level peaks for the each of the bursts 655 and 656. In some embodiments, as illustrated in FIG. 6E, the transitions between the bursts 655 and 656 and/or RF pulse power levels 604 and 605 are not separated by a burst rest length $T_{OFF}$ time or a RF pulse rest length $T_{RFOFF}$ time, respectively.

Figure 6F:
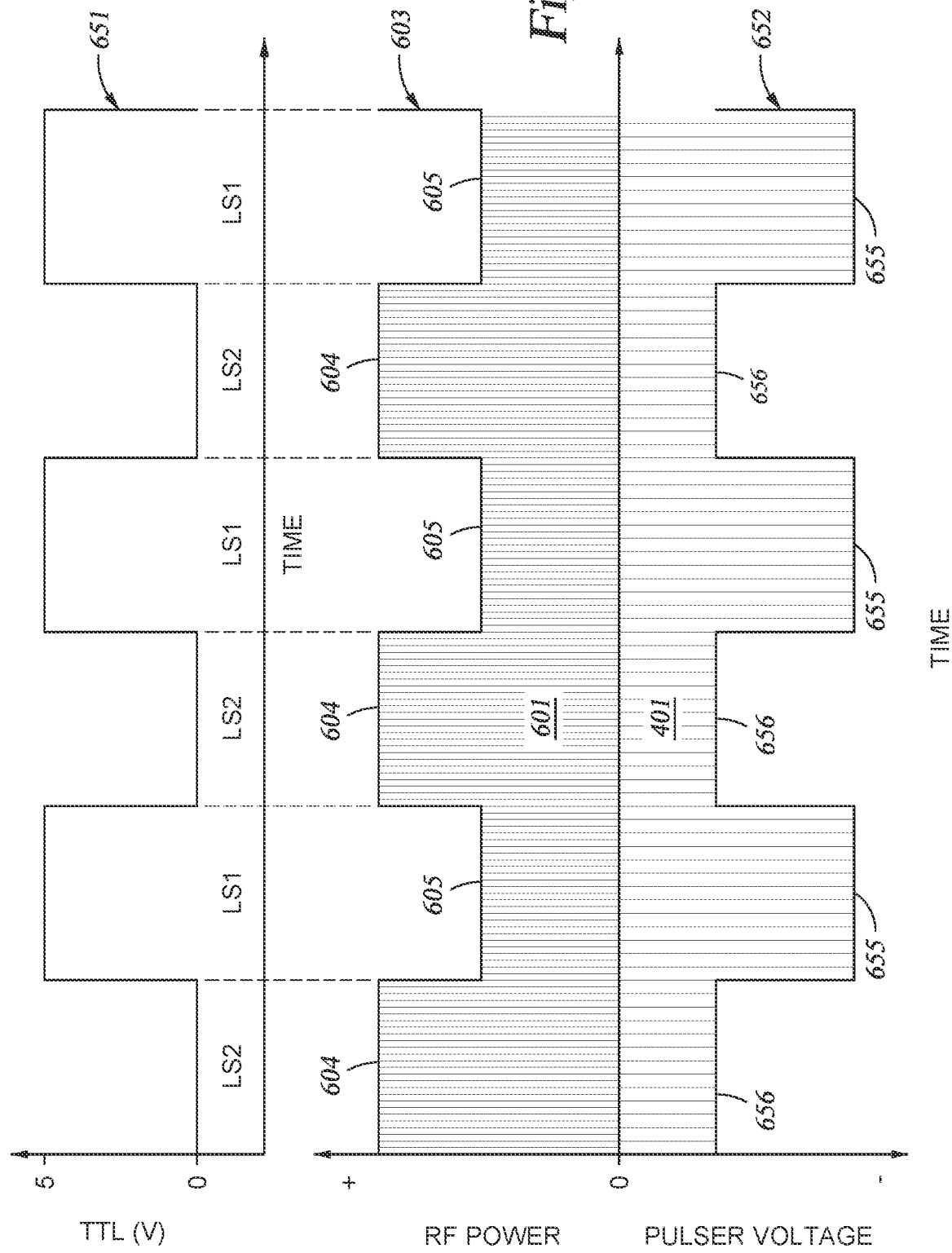

FIG. 6F, which includes the series of bursts 652 and multi-level pulsed RF waveform 603 illustrated in FIG. 6E, schematically illustrates a TTL signal waveform that is used synchronize the delivery of the series of bursts 652 and multi-level pulsed RF waveform 603. In some embodiments, the TTL signal waveform is provided to each PV waveform generator 150 and RF generator 118 by the controller 126 so that the delivery of the series of bursts 652 and multi-level pulsed RF waveform 603 can be synchronized. In other embodiments, the TTL signal waveform is provided to each PV waveform generator 150 from a master RF generator 118 so that the delivery of the series of bursts 652 and multi-level pulsed RF waveform 603 provided from the master RF generator 118 can be synchronized. The TTL signal waveform can include multi-level pulses that include one or more signal characteristics that are used by the each PV waveform generator 150 and/or RF generator 118 to determine a desired PV waveform characteristic or RF signal waveform characteristic that is to be provided from the PV waveform generator 150 and/or RF generator 118. In one example, the magnitude of the signal waveform (e.g., voltage level(s)) at various different times during a processing sequence is used by the each PV waveform generator 150 to determine the desired PV waveform output voltage level and is used by the RF generator 118 to determine a desired RF power level to be provided.

Figure 6G:
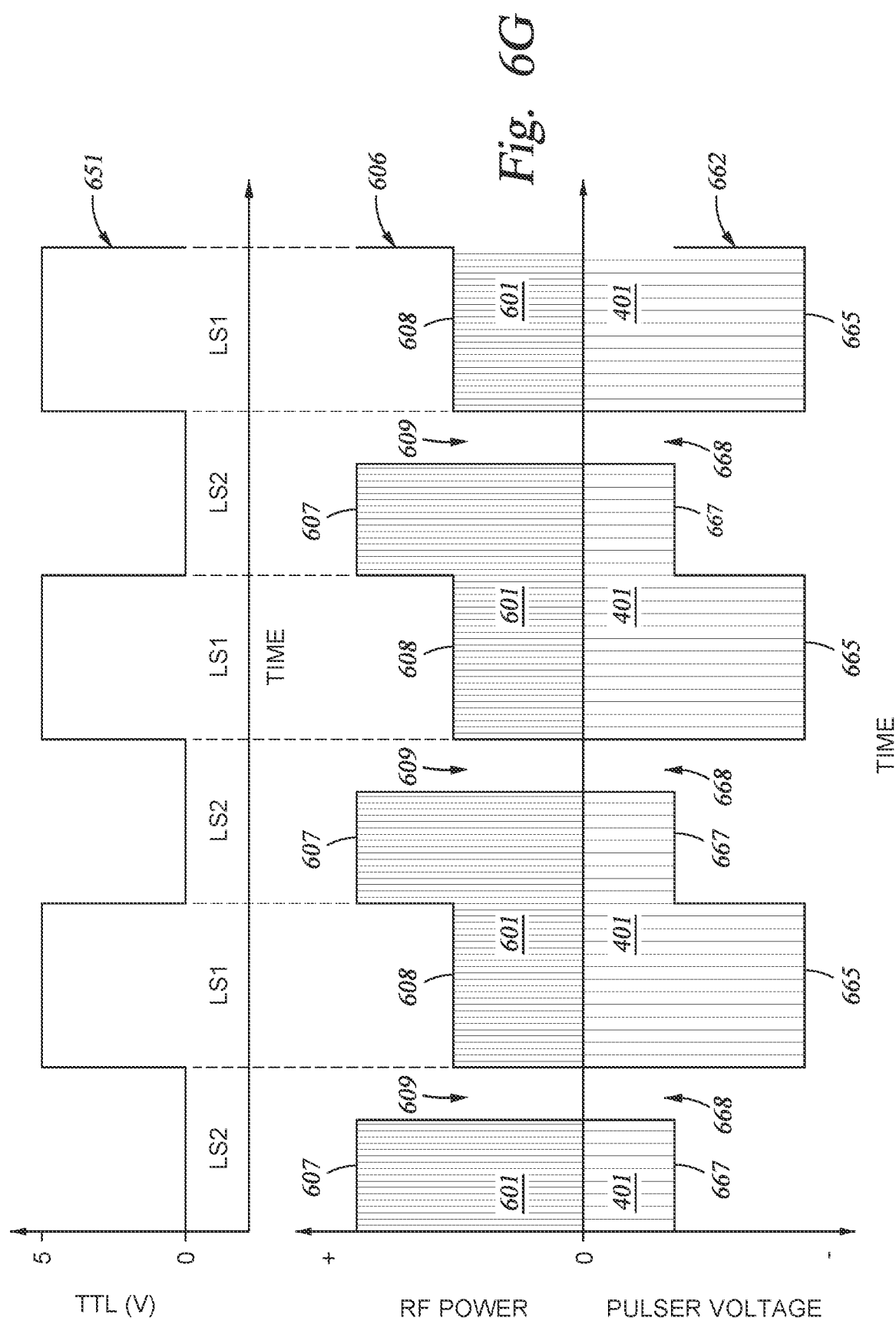

In another example, as illustrated in FIG. 6G, during processing a series of bursts 662, which include a plurality of bursts 665 and 667, are provided to the biasing electrode 104 and/or edge control electrode 115 and are synchronized with the delivery of a multi-level pulsed RF waveform 606. The multi-level pulsed RF waveform 606 includes a plurality of RF pulse power levels 607 and 608 that are formed by the delivery of the sinusoidal RF waveform 601 at different power levels by use of an RF generator. The multi-level pulsed RF waveform 606 may include RF pulse rest length $T_{RFOFF}$ times, which is illustrated by the RF rest time 609, that is disposed between the transition from the first power level 607 to the second power level 608. In some embodiments, an RF pulse rest length $T_{RFOFF}$ time is disposed at each transition between RF pulse power levels 607 and 608. The transitions between in each of the plurality of bursts 665 and 667 are synchronized with the changes in the RF pulse power levels 607 and 608. Each of the plurality of bursts 665 and 667 include a plurality of negative pulse waveforms 401 that are supplied at different voltage levels as illustrated by the difference in the negative levels of each of the peaks of the each of the bursts 665 and 667. In some embodiments, the transition from burst 667 to burst 665 is separated by a burst rest length $T_{OFF}$ time, while the transition from burst 665 to burst 667 is not separated by a burst rest length $T_{OFF}$ time. However, in some embodiments, the transition from burst 665 to burst 667 is separated by a burst rest length $T_{OFF}$ time, while the transition from burst 667 to burst 665 is not separated by a burst rest length $T_{OFF}$ time. The transitions from burst 665 to burst 667 and from burst 667 to burst 665 may each be separated by a burst rest length $T_{OFF}$ time.

FIG. 6G, also illustrates a TTL signal waveform that can be used to help synchronize the delivery of the series of bursts 662 and multi-level pulsed RF waveform 606. As similarly discussed above, the TTL signal waveform is provided to the each PV waveform generator 150 and RF generator 118 by the controller 126, or the TTL signal waveform is provided to the each PV waveform generator 150 from a master RF generator 118 so that the delivery of the series of bursts 662 and multi-level pulsed RF waveform 606 can be synchronized. As shown in FIG. 6G, the magnitude of the signal waveform at various different times during a processing sequence is used by the each PV waveform generator 150 to determine the desired PV waveform output voltage level and is used by the RF generator 118 to determine a desired RF power level. In some configurations, information provided in one or more of the levels of the TTL signal waveform, such as level LS2 in FIG. 6G, is used to determine a desired duty cycle, number of pulse in a burst and/or pulse magnitude for one or more of the bursts 665 and 667, such as burst 667, and/or duty cycle and/or RF pulse magnitude for the RF waveform 606 is determined from characteristics of the TTL signal waveform.

FIG. 6H illustrates an alternate version of the pulse sequence illustrated FIG. 6G. The pulse configuration shown in FIG. 6H is referred to herein as a Low-High (LH) PV pulse sequence as compared to the High-Low (HL) PV pulse sequence shown in FIG. 6G. As illustrated in FIG. 6H, the bursts 665 and 667 of the series of bursts 662 and the RF pulse power levels 607 and 608 of the multi-level pulsed RF waveform 606 are sequentially positioned differently in time. In this configuration, the bursts 665 and 667 and RF pulse power levels 607 and 608 have been reordered in time such that burst 667 precedes the delivery of burst 665, and RF pulse power level 607 precedes the delivery of RF pulse power level 608.

In some embodiment, a series of bursts, such as the series of bursts 612, 622 or 632, are synchronized and separately provided to the biasing electrode 104 and the edge control electrode 115 by use of one or more PV waveform generators 150 and the controller 126. In addition, as discussed above, a pulsed RF waveform 602 can be synchronized with a series of bursts 612, 622 or 632 that can be provided to the biasing electrode 104 and the edge control electrode 115 by use of one or more PV waveform generators 150 and the controller 126. In one example, a series of bursts 612 are provided to the biasing electrode 104 from the PV waveform generator 150 of the first PV source assembly 196 and a series of bursts 612 are provided to the edge control electrode 115 from the PV waveform generator 150 of the second PV source assembly 197, which are synchronized with the delivery of the pulsed RF waveform 602.

In some embodiments, the bursts and/or series of bursts provided to the biasing electrode 104 and the bursts and/or series of bursts provided to the edge control electrode have one or more different characteristics. In one example, the pulsed voltage waveforms provided in a burst provided to the biasing electrode 104 is different from the pulsed voltage waveforms provided in a burst that is simultaneously provided to the edge control electrode 115. In another example, the bursts provided in a series of burst provided to the biasing electrode 104 (e.g., burst 615) have a different burst delivery length from the bursts (e.g., burst 635) provided in a series of burst that are provided to the edge control electrode 115. In another example, the bursts provided in a series of burst provided to the biasing electrode 104 are staggered in time from the bursts provided in a series of burst that are provided to the edge control electrode 115. In this example, the bursts 615 of the series of bursts 612 are provided to the biasing electrode 104 and the bursts 625 of the series of bursts 622 are provided to the edge control electrode 115, and thus the timing of the delivery of bursts provided to the biasing electrode 104, edge control electrode and pulsed RF waveform 602 can be separately adjusted relative to one another.

In some embodiments, the PV waveforms provided to the biasing electrode 104 and the edge control electrode 115 are synchronized and identical in shape except for the amplitudes of the individual pulses provided to each electrode may be different. The differing PV waveform amplitude applied to the biasing electrode 104 and the edge control electrode 115 can be used control the "edge tilt" of the etched features formed on a substrate. In one example, the PV waveforms within a first burst that is provided to the biasing electrode 104 and the edge control electrode 115 are synchronized and identical in shape, and the peak-to-peak voltage of the PV waveform applied to the edge control electrode 115 is greater than the peak-to-peak voltage of the PV waveform applied to the biasing electrode 104. In another example, the PV waveforms within a second burst that is provided to the biasing electrode 104 and the edge control electrode 115 are synchronized and identical in shape, and the peak-to-peak voltage of the PV waveform applied to the edge control electrode 115 is less than the peak-to-peak voltage of the PV waveform applied to the biasing electrode 104.

In some embodiments, the software instructions stored in memory of the controller 126 are configured to cause the generation of a pulsed-voltage (PV) waveform and/or bursts of pulsed-voltage (PV) waveforms that are used to establish a nearly constant sheath voltage and thus create a desired IEDF at the surface of the substrate during plasma processing in the processing chamber. The control of pulsed-voltage (PV) waveform and/or bursts of pulsed-voltage (PV) waveforms enables the precise control over the shape of IEDF and number of peaks with IEDF, and thus better control the profile of the features formed in the surface of the substrate. The control of the pulsed-voltage (PV) waveform and/or bursts of pulsed-voltage (PV) waveforms will typically include the delivery of a desired voltage signal during one or more of the phases of the pulsed-voltage (PV) waveforms, and then allow the shape of the remaining phases of the pulsed-voltage (PV) waveform to evolve naturally during the rest of the waveform period $T_{PD}$. The software stored in memory of the controller 126 will also include instructions that are used to control the various hardware and electrical components within the processing chamber 100, and processing system in which the processing chamber is disposed, to perform the various process tasks and various process sequences needed to synchronized the delivery of RF waveform(s), pulsed-voltage (PV) waveforms and/or bursts of pulsed-voltage (PV) waveforms to one or more electrodes within a processing chamber 100.

While the foregoing is directed to embodiments of the present disclosure, other and further embodiments of the disclosure may be devised without departing from the basic scope thereof, and the scope thereof is determined by the claims that follow.

What is claimed is:

1. A plasma processing chamber, comprising:
a substrate support assembly comprising a first electrode that is disposed a first distance from a substrate supporting surface of the substrate support assembly;
a first pulsed-voltage (PV) waveform generator electrically coupled to the first electrode;
a second pulsed-voltage waveform generator electrically coupled to a second electrode disposed in the substrate support assembly radially outward of the first electrode; and
a controller comprising a memory that includes computer program instructions stored therein, and the computer program instructions when executed by a processor of the controller cause:
a delivery, by use of the second pulsed-voltage waveform generator, of a series of voltage waveform pulses to the second electrode, wherein
the series of voltage waveform pulses comprise a first series of voltage waveform pulses and a second series of voltage waveform pulses,
the first series of voltage waveform pulses comprise a first burst duration and the second series of voltage waveform pulses comprise a second burst duration,
the first series of voltage waveform pulses comprises a first direct current power level and a first voltage waveform pulses duration, and
the second series of voltage waveform pulses comprises a second direct current power level and a second voltage waveform pulses duration, and a delivery, by use of the first pulsed-voltage waveform generator, of a series of voltage waveform pulses to the first electrode, wherein
the series of pulsed voltage waveform pulses comprise a third series of voltage waveform pulses fourth series of voltage waveform pulses,
the third series of voltage waveform pulses comprise a third burst duration and the fourth series of voltage waveform pulses comprise a fourth burst duration,
the third series of voltage waveform pulses comprises a third direct current power level and a third voltage waveform pulses duration, and
the fourth series of voltage waveform pulses comprises a fourth direct current power level and a fourth voltage waveform pulses duration, and
wherein
the first and the second series of voltage waveform pulses each comprise a plurality of voltage pulses that comprise a first voltage pulse phase and a second voltage pulse phase, and during the second voltage pulse phase the first pulsed-voltage waveform generator establishes a negative voltage at the first electrode,
the third and the fourth series of voltage waveform pulses each comprise a plurality of voltage pulses that comprise the first voltage pulse phase and the second voltage pulse phase, and during the second voltage pulse phase the second pulsed-voltage waveform generator establishes a negative voltage at the second electrode.

2. The plasma processing chamber of claim 1, wherein the computer program instructions when executed by the processor of the controller further causes:
each of the pulsed voltage waveform bursts within the series of pulsed voltage waveform bursts have a same burst period.

3. The plasma processing chamber of claim 1, wherein pulsed voltage waveform bursts include a plurality of pulses that can include negative pulse waveforms, shaped pulse waveforms or positive pulse waveforms, or combinations thereof.

4. The plasma processing chamber of claim 1, wherein the first pulsed-voltage waveform generator is a sourcing and not a sinking supply.

5. The plasma processing chamber of claim 4, wherein the first pulsed-voltage waveform generator only passes a current in one direction and an output can charge but not discharge a capacitor.

6. The plasma processing chamber of claim 4, wherein when a switch remains in an open position, a voltage across an output of the first pulsed-voltage waveform generator is not controlled by the first pulsed-voltage waveform generator and is instead determined by an interaction of its internal components with other circuit elements.

7. The plasma processing chamber of claim 1, further comprising:
a current-return output stage coupled to a ground, wherein the current-return output stage has circuit elements, and wherein the circuit elements include the following elements:
a resistor and an inductor connected in series; and
a switch which permits a positive current flow towards the ground.

8. The plasma processing chamber of claim 1, wherein the controller is further configured to provide a plurality of differently configured bursts including a repeating cycle of the differently configured bursts that have a repeating cycle length.

9. The plasma processing chamber of claim 1, further comprising:
a generator output coupling assembly that is configured to form an electrical connection between the first pulsed-voltage waveform generator and the first electrode; and
a chucking assembly comprising:
a chucking power supply that is electrically coupled to the generator output coupling assembly; and
a blocking resistor that has a resistance of more than about 500 kOhm that is disposed between the chucking power supply and the generator output coupling assembly.

10. A method of processing a substrate in a plasma processing chamber, comprising:
delivering, by use of a first pulsed-voltage (PV) waveform generator, a series of pulsed voltage waveform bursts that comprise a first voltage waveform that is established at a first electrode, wherein
the series of pulsed voltage waveform bursts comprise a first pulsed voltage waveform burst and a second pulsed voltage waveform burst that comprise a first burst duration and a second burst duration, respectively,
the first pulsed voltage waveform burst comprises a first portion of the first voltage waveform that comprises a series of voltage pulses that comprise a first voltage pulse phase and a second voltage pulse phase, and
the second pulsed voltage waveform burst comprises a second portion of the first voltage waveform that comprises a series of voltage pulses that comprise a first voltage pulse phase and a second voltage pulse phase, and
during the second voltage pulse phase of the series of voltage pulses of the first and the second portion of the first voltage waveform the first pulsed-voltage waveform generator establishes a negative voltage at the first electrode; and delivering, a series of second pulsed voltage waveform bursts that comprise a second voltage waveform that is established at a second electrode, wherein the second electrode circumscribes the first electrode.

11. The method of claim 10, wherein
each of the pulsed voltage waveform bursts include negative pulse waveforms, shaped pulse waveforms or positive pulse waveforms, or combinations thereof.

12. The method of claim 10, wherein a characteristics of the first pulsed voltage waveform burst and the second pulsed voltage waveform burst have a different pulse voltage magnitude and are able to form two different Ion Energy Distribution Function peaks that have different peak heights.

13. The method of claim 12, wherein the characteristics of the voltage pulses are different between of the first pulsed voltage waveform burst and the second pulsed voltage waveform burst within a repeating cycle include differing individual PV waveform periods, different pulse voltage magnitudes, different shapes of at least a portion of a waveform within a first region and a second region.

14. The method of claim 12, wherein the first pulsed voltage waveform burst and the second pulsed voltage waveform burst have a burst period that includes a burst delivery length TON and burst rest length TOFF, and the burst period and a burst duty cycle are based on the burst delivery length TON and the burst period.

15. The method of claim 14, wherein the burst delivery length TON is between about 50 μs and about 50 milliseconds (ms), and the burst duty cycle is between about 50% and about 95%.

16. The method of claim 15, wherein the first pulsed voltage waveform burst and the second pulsed voltage waveform burst can be characterized as having differently configured offsets, burst periods, burst frequencies and burst duty cycles.

17. The method of claim 10, the voltage pulses have a pulse voltage magnitude (VOUT) of between about 1 kilovolt (kV) and about 10 kV.

18. The method of claim 17, wherein synchronizing the delivery of the first voltage waveform to the first electrode with the delivery of the second voltage waveform to the second electrode comprises providing a signal waveform to the first pulsed-voltage waveform generator.

19. The method of claim 10, further comprising:
providing to the first electrode a series of first DC pulse bursts, and
synchronizing the first pulsed voltage waveform bursts at the first electrode with the second pulsed voltage waveform bursts at the second electrode.

20. The method of claim 19, wherein the series of first DC pulse bursts and the plurality of second DC pulse bursts include a plurality of negative pulse waveforms that are supplied at different voltage levels, wherein the series of first DC pulse bursts and the plurality of second DC pulse bursts each have a difference in a negative levels of an applied voltage level peaks.

21. A plasma processing chamber, comprising:
a substrate support assembly comprising a first electrode that is disposed a first distance from a substrate supporting surface of the substrate support assembly; and
a controller comprising a memory that includes computer program instructions stored therein, and the computer program instructions when executed by a processor of the controller cause:
a delivery of a first voltage waveform burst to a first electrode, wherein
the first voltage waveform burst comprises a series of voltage waveform pulses that comprise a first direct current power level and a first voltage waveform pulse duration, and
the first voltage waveform burst comprises a first burst duration; and
a delivery of a second voltage waveform burst to a second electrode, wherein
the second voltage waveform burst comprises a series of voltage waveform pulses that comprise a second direct current power level and a second voltage waveform pulse duration, and
the second voltage waveform burst comprises a second burst duration, and
wherein
the first and the second voltage waveform bursts each comprise a plurality of voltage pulses that comprise a first voltage pulse phase and a second voltage pulse phase, and during the second voltage pulse phase a negative voltage is provided to the respective first electrode and second electrode.

\* \* \* \* \*